(12) United States Patent
Kitamura et al.

(10) Patent No.: US 8,174,001 B2
(45) Date of Patent: May 8, 2012

(54) ORGANIC ELECTROLUMINESCENCE ELEMENT

(75) Inventors: Yoshitaka Kitamura, Kanagawa (JP);
Manabu Tobise, Kanagawa (JP);
Masaru Kinoshita, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 490 days.

(21) Appl. No.: 12/379,329

(22) Filed: Feb. 19, 2009

(65) Prior Publication Data

US 2009/0218561 A1 Sep. 3, 2009

(30) Foreign Application Priority Data

Mar. 3, 2008 (JP) ................................. 2008-052504

(51) Int. Cl.
*H01L 35/24* (2006.01)
(52) U.S. Cl. ........ 257/40; 257/13; 257/79; 257/E51.001
(58) Field of Classification Search .................... 257/13, 257/40, 79, E51.001
See application file for complete search history.

(56) References Cited

U.S. PATENT DOCUMENTS

| | | | |
|---|---|---|---|
| 2002/0121860 A1* | 9/2002 | Seo et al. ..................... | 313/506 |
| 2005/0260440 A1* | 11/2005 | Seo et al. ..................... | 428/690 |
| 2006/0073359 A1* | 4/2006 | Ise et al. ..................... | 428/690 |
| 2006/0141285 A1* | 6/2006 | Ogasawara ................... | 428/690 |
| 2006/0214568 A1* | 9/2006 | Yamazaki et al. ............ | 313/504 |
| 2006/0222887 A1* | 10/2006 | Okada .......................... | 428/690 |
| 2008/0079358 A1* | 4/2008 | Satou ........................... | 313/504 |

FOREIGN PATENT DOCUMENTS

| | | |
|---|---|---|
| JP | A 2002-313583 | 10/2002 |
| JP | A 2002-324680 | 11/2002 |

\* cited by examiner

*Primary Examiner* — Anthony Ho
(74) *Attorney, Agent, or Firm* — SOLARIS Intellectual Property Group, PLLC

(57) ABSTRACT

An organic electroluminescence element including at least two light-emitting layers disposed between an anode and a cathode, wherein the at least two light-emitting layers include a light-emitting layer A that contains an electron transporting light-emitting material and a hole transporting host material, wherein a concentration of the electron transporting light-emitting material gradually increases from an anode side toward a cathode side of the light-emitting layer A, and a light-emitting layer B that contains a hole transporting light-emitting material and an electron transporting host material, wherein a concentration of the hole transporting light-emitting material gradually decreases from an anode side toward a cathode side of the light-emitting layer B. An organic EL element with high light-emission efficiency and excellent durability is provided.

10 Claims, 1 Drawing Sheet

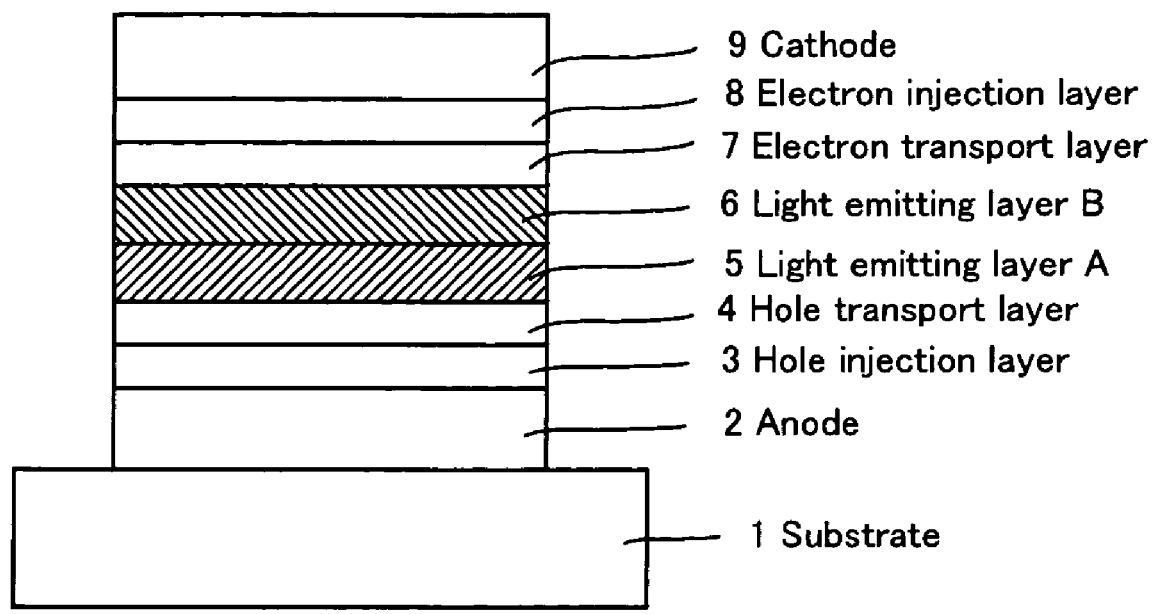

ORGANIC ELECTROLUMINESCENCE ELEMENT

CROSS-REFERENCE TO RELATED APPLICATION

This application claims priority under 35 USC 119 from Japanese Patent Application No. 2008-052504, the disclosure of which is incorporated by reference herein.

BACKGROUND OF THE INVENTION

1. Field of the Invention

The present invention relates to an organic electroluminescence element. In particular, the invention relates to an organic electroluminescence element with high light-emission efficiency and excellent durability.

2. Description of the Related Art

An organic electroluminescence element (hereinafter, referred to as an "organic EL element" in some cases) is composed of a light-emitting layer or a plurality of organic functional layers containing a light-emitting layer, and a pair of electrodes sandwiching these layers. The organic EL element is a device for obtaining luminescence by utilizing luminescence from excitons each of which is obtained by recombining an electron injected from a cathode with a hole injected from an anode to produce the exciton in the light-emitting layer, or luminescence from excitons of other molecules produced by energy transmission from the above-described excitons.

Heretofore, an organic EL element has been developed by using a laminate structure from integrated layers in which each layer is functionally differentiated, whereby brightness and element efficiency are remarkably improved. For example, a two-layer laminated type element obtained by laminating a hole transport layer and a light-emitting layer which also functions as an electron transport layer; a three-layer laminated type element obtained by laminating a hole transport layer, a light-emitting layer, and an electron transport layer; and a four-layer laminated type element obtained by laminating a hole transport layer, a light-emitting layer, a hole blocking layer, and an electron transport layer have been frequently used (see, for example, "Science", vol. 267, No. 3, page 1332, (1995)).

However, many problems still remain for putting organic EL elements to practical use. First, there is a need to attain high light-emission efficiency, and second, there is a need to attain high drive durability. In particular, deterioration in quality during continuous driving is a most significant problem.

For instance, Japanese Patent Application Laid-Open (JP-A) No. 2002-324680 proposes an attempt to dispose a region containing a compound that constitutes a light-emitting layer and a compound that constitutes an electron transport layer between the light-emitting layer and the electron transport layer, so as to lower a barrier when electrons flow from the electron transport layer to the light-emitting layer. It is disclosed in the disclosure to be preferable that, in this region, a concentration of the compound that constitutes the light-emitting layer increases toward the light-emitting layer so as to lower the barrier. However, although such means may lower the carrier transfer resistance of an adjacent layer, these are not sufficient means for attaining high light-emission efficiency and high drive durability.

Also, in the case where an organic EL element has a laminate structure, carrier injectability is reduced due to a barrier between the respective layers, and there are problems of an increase in driving voltage and a reduction in durability. As a means for reducing such a barrier between the respective layers, for example, JP-A No. 2002-313583 proposes to provide a gradation in the concentration, in the respective layers, of a hole injection material, an electron injection material, a hole transport material or an electron transport material contained in the respective layers. In such a configuration, a light-emitting material in a light-emitting layer is arranged at a definite concentration in a restricted region in the light-emitting layer which is formed of a bipolar mixed layer. Even in this configuration, as the light emission may take place only in the restricted region within a region where the light-emitting material is arranged, this is not sufficient as a means to achieve high light-emission efficiency.

In designing a practically useful organic EL element, it is an extremely important problem to make high external quantum efficiency and high drive durability compatible with each other. This problem is a problem which is always required to be improved.

SUMMARY OF THE INVENTION

The present invention has been made in view of the above circumstances and provides an organic electroluminescence element with the following aspect.

An aspect of the invention provides an organic electroluminescence element comprising at least two light-emitting layers disposed between an anode and a cathode, wherein the at least two light-emitting layers include:

(1) a light-emitting layer A that contains an electron transporting light-emitting material and a hole transporting host material, wherein a concentration of the electron transporting light-emitting material gradually increases from an anode side toward a cathode side of the light-emitting layer A; and (2) a light-emitting layer B that contains a hole transporting light-emitting material and an electron transporting host material, wherein a concentration of the hole transporting light-emitting material gradually decreases from an anode side toward a cathode side of the light-emitting layer B.

BRIEF DESCRIPTION OF THE DRAWINGS

FIG. 1 is a schematic diagram showing the structure of an organic electroluminescence element according to the invention.

DETAILED DESCRIPTION OF THE INVENTION

An object of the present invention is to provide an organic EL element with high light-emission efficiency and excellent durability.

The problem of the present invention described above has been solved by the following means.

An organic electroluminescence element of the present invention comprises at least two light-emitting layers disposed between an anode and a cathode, wherein the at least two light-emitting layers include:

(1) a light-emitting layer A that contains an electron transporting light-emitting material and a hole transporting host material, wherein a concentration of the electron transporting light-emitting material gradually increases from an anode side toward a cathode side of the light-emitting layer A; and (2) a light-emitting layer B that contains a hole transporting light-emitting material and an electron transporting host material, wherein a concentration of the hole transporting light-emitting material gradually decreases from an anode side toward a cathode side of the light-emitting layer B.

Preferably, the light-emitting layer A and the light-emitting layer B are disposed adjacent to each other.

Preferably, the light-emitting layer A is disposed closer to the anode than the light-emitting layer B, and the light-emitting layer B is disposed closer to the cathode than the light-emitting layer A.

Preferably, in the light-emitting layer A, a concentration of the electron transporting light-emitting material which gradually increases from the anode side toward the cathode side is from 0% to 50% in an interface region of the light-emitting layer A on the anode side, with respect to a concentration thereof in an interface region of the light-emitting layer A on the cathode side; and in the light-emitting layer B, a concentration of the hole transporting light-emitting material which gradually decreases from the anode side toward the cathode side is from 0% to 50% in an interface region of the light-emitting layer B on the cathode side, with respect to a concentration thereof in an interface region of the light-emitting layer B on the anode side.

Preferably, the electron transporting light-emitting material is a metal complex having a tri- or higher-dentate ligand.

Preferably, the metal complex having a tri- or higher-dentate ligand is a compound represented by the following formula (I).

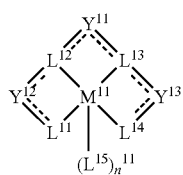

Formula (I)

In formula (I), $M^{11}$ represents a metal ion, and $L^{11}$ to $L^{15}$ each independently represent a ligand which coordinates to $M^{11}$. An atomic group may further exist between $L^{11}$ and $L^{14}$ to form a cyclic ligand. $L^{15}$ may bond to both of $L^{11}$ and $L^{14}$ to form a cyclic ligand. $Y^{11}$, $Y^{12}$ and $Y^{13}$ each independently represent a linking group, a single bond or a double bond. Furthermore, when $Y^{11}$, $Y^{12}$ or $Y^{13}$ is a linking group, bonds between $L^{11}$ and $Y^{12}$, $Y^{12}$ and $L^{12}$, $L^{12}$ and $Y^{11}$, $Y^{11}$ and $L^{13}$, $L^{13}$ and $Y^{13}$, and $Y^{13}$ and $L^{14}$ each independently represent a single bond or a double bond. $n^{11}$ is from 0 to 4. Bonds between $M^{11}$ and $L^{11}$ to $L^{15}$ are each independently a coordination bond, an ionic bond or a covalent bond.

Preferably, in formula (I), $M^{11}$ is a platinum ion.

Preferably, the hole transporting light-emitting material is an iridium complex.

According to the present invention, there is provided an organic EL element with high light-emission efficiency and excellent durability. In particular, there is provided an organic EL element which uses a phosphorescent light-emitting material, is high in light-emission efficiency, is free from a reduction in light-emission efficiency even in a high current region, and has high light-emission efficiency over a wide region from a low current region to a high current region, and excellent drive durability.

An embodiment of the present invention is an organic electroluminescence element comprising at least two light-emitting layers disposed between an anode and a cathode, wherein the at least two light-emitting layers include a light-emitting layer A that contains an electron transporting light-emitting material and a hole transporting host material, wherein a concentration of the electron transporting light-emitting material gradually increases from an anode side toward a cathode side of the light-emitting layer A, and a light-emitting layer B that contains a hole transporting light-emitting material and an electron transporting host material, wherein a concentration of the hole transporting light-emitting material gradually decreases from an anode side toward a cathode side of the light-emitting layer B.

In the invention, the term "gradually decrease" or "gradually increase" means that the concentration decreases or increases on the whole from a cathode side toward an anode side or vice versa. The concentration may change continuously, or may change stepwise. Alternatively, for example, even when a region where the concentration locally increases or decreases exists, the case where the concentration decreases or increases on the whole should be construed to fall within the intended scope of this application.

In the invention, the light-emitting layer A and the light-emitting layer B are preferably disposed adjacent to each other.

Furthermore, the light-emitting layer B is preferably disposed closer to the cathode than the light-emitting layer A.

The light-emitting layer B may be disposed closer to the anode side than the light-emitting layer A. However, as a configuration in which a concentration of a light-emitting material is set lower than a concentration of a host material is generally adopted, in this configuration, both of a hole transporting material in a region of the light-emitting layer in close proximity to an anode, and an electron transporting material in a region of the light-emitting layer in close proximity to a cathode become scarce, and accordingly, an effective concentration of charge transporting materials is disadvantageously lowered. In the case where such a configuration is adopted, a concentration of a light-emitting material is preferably set higher.

Preferably, in the light-emitting layer A, the concentration of the electron transporting light-emitting material is from 0% to 50% in an interface region of the light-emitting layer A on the anode side, with respect to the concentration thereof in an interface region of the light-emitting layer A on the cathode side. More preferably, the concentration of the electron transporting light-emitting material is from 0% to 30% in an interface region of the light-emitting layer A on the anode side, with respect to the concentration thereof in an interface region of the light-emitting layer A on the cathode side, and even more preferably, the concentration of the electron transporting light-emitting material is from 0% to 20% in an interface region of the light-emitting layer A on the anode side, with respect to the concentration thereof in an interface region of the light-emitting layer A on the cathode side.

Preferably, in the light-emitting layer B, the concentration of the hole transporting light-emitting material is from 0% to 50% in an interface region of the light-emitting layer B on the cathode side, with respect to a concentration thereof in an interface region of the light-emitting layer B on the anode side. More preferably, the concentration of the hole transporting light-emitting material is from 0% to 30% in an interface region of the light-emitting layer B on the cathode side, with respect to a concentration thereof in an interface region of the light-emitting layer B on the anode side, and even more preferably, the concentration of the hole transporting light-emitting material is from 0% to 20% in an interface region of the light-emitting layer B on the cathode side, with respect to a concentration thereof in an interface region of the light-emitting layer B on the anode side.

In the specification of this application, the term "interface region of the light-emitting layer on the cathode side" is defined to refer to a region extending to a thickness of 10% of the thickness of the whole of the light-emitting layer from the interface of the light-emitting layer on the cathode side; and the term "interface region of the light-emitting layer on the anode side" is defined to refer to a region extending to a thickness of 10% of the thickness of the whole of the light-emitting layer from the interface of the light-emitting layer on the anode side. Also, the concentration in that region is defined to refer to an average concentration in that region. Furthermore, the concentration of each of the materials in the "interface region of the light-emitting layer on the cathode side (or anode side)" can be measured by a method such as time-of-flight secondary ion mass spectrometry (TOF-SIMS) or etching X-ray photoelectron spectroscopic analysis (XPS/ESCA).

As a result of an analysis of a light emission distribution in a light-emitting layer in an organic EL element having a conventional configuration, it is found that the light-emitting layer does not emit light uniformly through the light-emitting layer, but emits light concentrated at an interface between the light-emitting layer and a layer adjacent thereto. Accordingly, the present inventors considered that since an entirety of the light-emitting layer does not contribute to light emission, the light-emission efficiency is deteriorated, and since a load of the light emission is concentrated locally, the durability is deteriorated. In this connection, after earnest research concerning a configuration where an entire light-emitting layer emits light uniformly, a configuration of the invention was achieved.

Firstly, when a concentration of a light-emitting material in a light-emitting layer was set to have a concentration gradation, improvements in the light-emission efficiency and durability were observed. It is presumed that a carrier transfer in the light-emitting layer is optimized, whereby recombination is caused throughout the entire light-emitting layer.

However, even in the above-mentioned configuration, leakage of electrons or holes from the light-emitting layer to the adjacent layer is caused in some cases. That is, in some cases, holes intrude to the electron transport layer, or electrons intrude to the hole transport layer, to cause deterioration of the element. The inventors, after earnestly researching further means for improvement thereof, found that when, in an adjacent layer, in addition to an electron transporting material, a hole transporting material is contained with a concentration gradation in an electron transport layer, and/or in addition to a hole transporting material, an electron transporting material is contained with a concentration gradation in a hole transport layer, the deterioration due to the above reasons is inhibited, whereby the durability is improved.

The electron transporting light-emitting material is preferably a phosphorescent light-emitting material. Also, the hole transporting light-emitting material is preferably a phosphorescent material. Since a concentration of the electron transporting material or hole transporting material can be set to have a concentration gradation from a region low in the concentration to a region high in the concentration without setting the light-emitting material at a high concentration, the advantage is particularly large for the phosphorescent material.

1. Structure of Organic EL Element

As an integration pattern of the organic compound layer according to the present invention, it is preferred that the organic compound layer includes a hole transport layer, a light-emitting layer, and an electron transport layer in this order from the anode side. Moreover, a hole injection layer is preferably provided between the hole transport layer and the anode, or an electron injection layer is preferably provided between the cathode and the electron transport layer. In addition, an electron transporting intermediate layer may be provided between the light-emitting layer and the electron transport layer, and similarly, a hole transporting intermediate layer may be provided between the light-emitting layer and the hole transport layer.

The above-described hole transporting intermediate layer preferably has at least one of a function for accelerating the injection of holes into the light-emitting layer, or a function for blocking electrons.

Furthermore, the above-described electron transporting intermediate layer preferably has at least one of a function for accelerating the injection of electrons into the light-emitting layer, or a function for blocking holes.

Moreover, at least one of the above-described hole transporting intermediate layer or the electron transporting intermediate layer preferably has a function for blocking excitons produced in the light-emitting layer.

In order to effectively realize the functions for accelerating the injection of holes or the injection of electrons, and the functions for blocking holes, electrons, or excitons, it is preferred that the hole transporting intermediate layer and the electron transporting intermediate layer are adjacent to the light-emitting layer.

Each of the layers mentioned above may be composed of a plurality of secondary layers.

FIG. 1 shows one embodiment of the structure of an organic electroluminescence element according to the present invention. On a substrate 1, an anode 2, a hole injection layer 3, a hole transport layer 4, a light-emitting layer A 5, a light-emitting layer B 6, an electron transport layer 7, an electron injection layer 8 and a cathode 9 are laminated in this order.

The organic EL element in the invention may have a resonator structure. For example, on a transparent substrate, a multi-layered film mirror comprising a plurality of stacked films of different reflective indexes, a transparent or semi-transparent electrode, a light-emitting layer, and a metal electrode stacked to each other are provided. The light generated in the light-emitting layer repeats reflection and conducts oscillation between the multi-layered film mirror and the metal electrode as reflection plates.

In another preferred embodiment of the resonator structure, a transparent or semi-transparent electrode and a metal electrode function respectively as reflection plates on a transparent substrate in which light generated in the light-emitting layer repeats reflection and conducts oscillation therebetween.

For forming the resonance structure, an optical channel length determined based on the effective refractive index of two reflection plates, and the refractive index and the thickness of each of the layers between the reflection plates are controlled to optimal values for obtaining a desired resonance wavelength. A calculation formula in the case of having a resonance structure is described in the specification of JP-A No. 9-180883 and the calculation formula in the case of the another preferred embodiment is described in the specification of JP-A No. 2004-127795.

Each of the layers constituting the organic compound layer can be suitably formed in accordance with any of a dry film-forming method such as a vapor deposition method, or a sputtering method; a transfer method; a printing method; a coating method; an ink-jet method; or a spray method.

Hereinafter, the constituent components of the organic EL element of the invention are described in detail.

2. Light-Emitting Layer

The light-emitting layer is a layer having a function for receiving holes from the anode, the hole injection layer, the hole transport layer or the hole transporting intermediate layer, and receiving electrons from the cathode, the electron injection layer, the electron transport layer, or the electron transporting intermediate layer, and for providing a field for recombination of the holes with the electrons to emit light, when an electric field is applied thereto.

A light emitting layer of the present invention comprises a light-emitting layer A that contains an electron transporting light-emitting material and a hole transporting host material, wherein a concentration of the electron transporting light-emitting material gradually increases from an anode side toward a cathode side of the light-emitting layer A, and a light-emitting layer B that contains a hole transporting light-emitting material and an electron transporting host material, wherein a concentration of the hole transporting light-emitting material gradually decreases from an anode side toward a cathode side of the light-emitting layer B.

The electron transporting light-emitting material in the invention is defined as those larger in a value of the electron mobility when the electron mobility and hole mobility of the material are measured, and the hole transporting light-emitting material is defined as those larger in a value of the hole mobility when the electron mobility and hole mobility of the material are measured similarly.

The electron mobility and hole mobility are measured by use of an optical pulse method of a time of flight (TOF) method. In detail, a method described in "Hikari Denshi Kinou Yukizairyo Handbook (Photo/Electronic Functional Organic Material Handbook)" (Asakura Shoten) is used.

(Electron Transporting Light-Emitting Material)

Preferably, the electron transporting light-emitting material used in the present invention is a metal complex to be described in detail below.

The metal ion in the metal complex is not particularly limited, but a transition metal ion or a rare earth metal ion is preferable from the viewpoints of improving light-emission efficiency, improving durability and lowering driving voltage. More preferred is an iridium ion, a platinum ion, a gold ion, a rhenium ion, a tungsten ion, a rhodium ion, a ruthenium ion, an osmium ion, a palladium ion, a silver ion, a copper ion, a cobalt ion, a zinc ion, a nickel ion, a lead ion, an aluminum ion, a gallium ion or a rare earth metal ion (for example, a europium ion, a gadolinium ion, a terbium ion or the like), and even more preferred is an iridium ion, a platinum ion, a gold ion, a rhenium ion, a tungsten ion, a palladium ion, a zinc ion, an aluminum ion, a gallium ion, a europium ion, a gadolinium ion or a terbium ion. In the case where the metal complex is used for a light-emitting material, an iridium ion, a platinum ion, a rhenium ion, a tungsten ion, a europium ion, a gadolinium ion or a terbium ion is particularly preferred. In the case where the metal complex is used for a charge transporting material or a host material in a light-emitting layer, an iridium ion, a platinum ion, a palladium ion, a zinc ion, an aluminum ion or a gallium ion is particularly preferred.

An atom which coordinates to a metal ion in the metal complex is not particularly limited, but examples thereof preferably include an oxygen atom, a nitrogen atom, a carbon atom, a sulfur atom and a phosphorus atom, more preferably an oxygen atom, a nitrogen atom and a carbon atom, and even more preferably a nitrogen atom and a carbon atom.

The ligand of the metal complex in the present invention is preferably a chain ligand or cyclic ligand from the viewpoints of improving light-emission efficiency and improving durability. More preferred is a ligand having at least one nitrogen-containing heterocycle which coordinates to a central metal (for example, $M^{11}$ in the compound represented by formula (I) described below) through a nitrogen atom. Examples of the nitrogen-containing heterocycle include a pyridine ring, a quinoline ring, a pyrimidine ring, a pyrazine ring, a pyrrole ring, an imidazole ring, a pyrazole ring, an oxazole ring, a thiazole ring, an oxadiazole ring, a thiadiazole ring, a triazole ring and the like. Among them, a 6-membered or 5-membered nitrogen-containing heterocycle is more preferred. The heterocycle may form a condensed ring with another ring.

The metal complex in the present invention is preferably a metal complex having a tridentate or higher-dentate ligand. A metal complex having a tridentate to hexadentate ligand is more preferable from the viewpoints of improving light-emission efficiency and improving durability. In the case where a metal ion is easy to form a hexacoordinate complex exemplified by an iridium ion, a metal complex having a tridentate ligand, a tetradentate ligand or a hexadentate ligand is preferable. In the case where a metal ion is easy to form a tetracoordinate complex exemplified by a platinum ion, a metal complex having a tridentate ligand or a tetradentate ligand is preferable, and a metal complex having a tetradentate ligand is more preferable.

The metal complex in the present invention is preferably a compound represented by formula (I), (II) or (III), which are described below in detail.

In the first place, the compound represented by formula (I) is to be described.

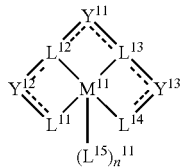

Formula (I)

In formula (I), $M^{11}$ represents a metal ion. $L^{11}$ to $L^{15}$ each represent a ligand which coordinates to $M^{11}$. An atomic group may further exist between $L^{11}$ to $L^{14}$ to form a cyclic ligand. $L^{15}$ may bond to both $L^{11}$ and $L^{14}$ to form a cyclic ligand. $Y^{11}$, $Y^{12}$ and $Y^{13}$ each represent a linking group, a single bond or a double bond. In the case where $Y^{11}$, $Y^{12}$ or $Y^{13}$ is a linking group, bonds between $L^{11}$ and $Y^{12}$, $Y^{12}$ and $L^{12}$, $L^{12}$ and $Y^{11}$, $Y^{11}$ and $L^{13}$, $L^{13}$ and $Y^{13}$, and $Y^{13}$ and $L^{14}$ each independently represent a single bond or a double bond. $n^{11}$ is from 0 to 4. Bonds between $M^{11}$ and $L^{11}$ to $L^{15}$ each are each independently a coordination bond, an ionic bond or a covalent bond.

The compound represented by formula (I) is to be described in detail.

In formula (I), $M^{11}$ represents a metal ion. The metal ion is not particularly limited, but a divalent or trivalent metal ion is preferred. Examples of the divalent or trivalent metal ion preferably include a platinum ion, an iridium ion, a rhenium ion, a palladium ion, a rhodium ion, a ruthenium ion, a copper ion, a europium ion, a gadolinium ion and a terbium ion, more preferably a platinum ion, an iridium ion and a europium ion, and even more preferably a platinum ion and an iridium ion. Among them, a platinum ion is particularly preferred.

In formula (I), $L^{11}$, $L^{12}$, $L^{13}$ and $L^{14}$ each independently represent a ligand which coordinates to $M^{11}$. Examples of the atom which is contained in $L^{11}$, $L^{12}$, $L^{13}$ and $L^{14}$ and coordinates to $M^{11}$ preferably include a nitrogen atom, an oxygen atom, a sulfur atom, a carbon atom and a phosphorus atom, more preferably a nitrogen atom, an oxygen atom, a sulfur atom and a carbon atom, and even more preferably a nitrogen atom, an oxygen atom and a carbon atom.

Bonds formed by $M^{11}$ and $L^{11}$, $L^{12}$, $L^{13}$ or $L^{14}$ are each independently a covalent bond, an ionic bond or a coordination bond. The term "ligand" in the present invention may include, for the sake of explanation, those formed by an ionic bond or a covalent bond besides a coordination bond.

The ligand formed by $L^{11}$, $Y^{12}$, $L^{12}$, $Y^{11}$, $L^{13}$, $Y^{13}$ and $L^{14}$ is preferably an anionic ligand, wherein at least one anion bonds to the metal. A number of the anion in the anionic ligand is preferably 1 to 3, more preferably 1 or 2, and even more preferably 2.

$L^{11}$, $L^{12}$, $L^{13}$ or $L^{14}$ which coordinates to $M^{11}$ through a carbon atom is not particularly limited, but examples thereof include independently an imino ligand, an aromatic carbon ring ligand (for example, a benzene ligand, a naphthalene ligand, an anthracene ligand, a phenanthrene ligand or the like), and a heterocyclic ligand (for example, a furan ligand, a thiophene ligand, a pyridine ligand, a pyrazine ligand, a pyrimidine ligand, a thiazole ligand, an oxazole ligand, a pyrrole ligand, an imidazole ligand, a pyrazole ligand, a condensed ring body thereof (for example, a quinoline ligand, a benzothiazole ligand or the like) or a tautomer thereof).

$L^{11}$, $L^{12}$, $L^{13}$ or $L^{14}$ which coordinates to $M^{11}$ through a nitrogen atom is not particularly limited, but examples thereof include independently a nitrogen-containing heterocyclic ligand (for example, a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, a thiadiazole ligand, a condensed ring body thereof (for example, a quinoline ligand, a benzoxazole ligand, a benzimidazole ligand or the like) or a tautomer thereof (the tautomer in the present invention is defined that the following examples are also regarded as the tautomer. For example, a 5-membered heterocyclic ligand of Compound (24) exemplified in Compound number [KA 24], a terminal 5-membered heterocyclic ligand of Compound (64) exemplified in Compound number [KA 28] and a 5-membered heterocyclic ligand of Compound (145) exemplified in Compound number [KA 37] in JP-A No. 2007-103493 are defined to be included in a pyrrole tautomer)), an amino ligand (an alkylamino ligand (having preferably 2 to 30 carbon atoms, more preferably 2 to 20 carbon atoms, and even more preferably 2 to 10 carbon atoms; for example, methylamino or the like), an arylamino ligand (for example, phenylamino or the like), an acylamino ligand (having preferably 2 to 30 carbon atoms, more preferably 2 to 20 carbon atoms, and even more preferably from 2 to 10 carbon atoms; for example, acetylamino, benzoylamino or the like), an alkoxycarbonylamino ligand (having preferably 2 to 30 carbon atoms, more preferably 2 to 20 carbon atoms, and even more preferably 2 to 12 carbon atoms; for example, methoxycarbonylamino or the like), an aryloxycarbonylamino ligand (having preferably 7 to 30 carbon atoms, more preferably 7 to 20 carbon atoms, and even more preferably 7 to 12 carbon atoms; for example, phenyloxycarbonylamino or the like), a sulfonylamino ligand (having preferably 1 to 30 carbon atoms, more preferably 1 to 20 carbon atoms, and even more preferably 1 to 12 carbon atoms; for example, methanesulfonylamino, benzenesulfonylamino or the like), an imino ligand and the like. These ligands may be further substituted.

$L^{11}$, $L^{12}$, $L^{13}$ or $L^{14}$ which coordinates to $M^{11}$ through an oxygen atom is not particularly limited, but examples thereof include independently an alkoxy ligand (having preferably 1 to 30 carbon atoms, more preferably 1 to 20 carbon atoms, and even more preferably 1 to 10 carbon atoms; for example, methoxy, ethoxy, butoxy, 2-ethylhexyloxy or the like), an aryloxy ligand (having preferably 6 to 30 carbon atoms, more preferably 6 to 20 carbon atoms, and even more preferably 6 to 12 carbon atoms; for example, phenyloxy, 1-naphthyloxy, 2-naphthyloxy or the like), a heterocyclic oxy ligand (having preferably 1 to 30 carbon atoms, more preferably 1 to 20 carbon atoms, and even more preferably 1 to 12 carbon atoms; for example, pyridyloxy, pyrazinyloxy, pyrimidyloxy, quinolyloxy or the like), an acyloxy ligand (having preferably 2 to 30 carbon atoms, more preferably 2 to 20 carbon atoms, and even more preferably 2 to 10 carbon atoms; for example, acetoxy, benzoyloxy or the like), a silyloxy ligand (having preferably 3 to 40 carbon atoms, more preferably 3 to 30 carbon atoms, and even more preferably 3 to 24 carbon atoms; for example, trimethylsilyloxy, triphenylsilyloxy or the like), a carbonyl ligand (for example, a ketone ligand, an ester ligand, an amido ligand or the like), and an ether ligand (for example, a dialkyl ether ligand, a diaryl ether ligand, a furyl ligand or the like). These ligands may be further substituted.

$L^{11}$, $L^{12}$, $L^{13}$ or $L^{14}$ which coordinates to $M^{11}$ through a sulfur atom is not particularly limited, but examples thereof include independently an alkylthio ligand (having preferably 1 to 30 carbon atoms, more preferably 1 to 20 carbon atoms, and even more preferably 1 to 12 carbon atoms; for example, methylthio, ethylthio or the like), an arylthio ligand (having preferably 6 to 30 carbon atoms, more preferably 6 to 20 carbon atoms, and even more preferably 6 to 12 carbon atoms; for example, phenylthio or the like), a heterocyclic thio ligand (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio or the like), a thiocarbonyl ligand (for example, a thioketone ligand, a thioester ligand or the like) and a thioether ligand (for example, a dialkylthioether ligand, a diarylthioether ligand, a thiofuryl ligand or the like). These ligands may be further substituted.

$L^{11}$, $L^{12}$, $L^{13}$ or $L^{14}$ which coordinates to $M^{11}$ through a phosphorus atom is not particularly limited, but examples thereof include independently a dialkylphosphino ligand, a diarylphosphino ligand, a trialkylphosphino ligand, a triarylphosphino ligand, a phosphinino ligand and the like. The ligands may be further substituted.

$L^{11}$ and $L^{14}$ each independently represent preferably an aromatic carbon ring ligand, an alkyloxy ligand, an aryloxy ligand, an ether ligand, an alkylthio ligand, an arylthio ligand, an alkylamino ligand, an arylamino ligand, an acylamino ligand, or a nitrogen-containing heterocyclic ligand (for example, a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, a thiadiazole ligand, or a condensed ring body thereof (for example, a quinoline ligand, a quinoxaline ligand, a phthalazine ligand, a benzoxazole ligand, a benzimidazole ligand or the like) or a tautomer thereof), more preferably an aromatic carbon ring ligand, an aryloxy ligand, an arylthio ligand, an arylamino ligand, a pyridine ligand, a pyrazine ligand, a pyrazole ligand, an imidazole ligand, a condensed ring body thereof (for example, a quinoline ligand, a quinoxaline ligand, a phthalazine ligand, a benzimidazole ligand or the like) or a tautomer thereof, and even more preferably an aromatic carbon ring ligand, an aryloxy ligand, an arylthio ligand, an arylamino ligand, a pyridine ligand, a pyrazine ligand, a pyrazole ligand, an imidazole ligand or a condensed ring body thereof. Among them, an aromatic carbon ring ligand, an aryloxy ligand, a pyridine ligand, a pyrazine ligand, a pyrazole ligand, an imidazole ligand or a condensed ring body thereof is particularly preferable.

$L^{12}$ and $L^{13}$ each independently preferably represent a ligand forming a coordination bond with $M^{11}$. Examples of the ligand forming a coordination bond with $M^{11}$ preferably include a pyridine ring, a pyrazine ring, a pyrimidine ring, a triazine ring, a thiazole ring, an oxazole ring, a pyrrole ring, a triazole ring, a condensed ring body thereof (for example, a quinoline ring, a quinoxaline ligand, a phthalazine ligand, a benzoxazole ring, a benzimidazole ring, an indolenine ring or the like) and a tautomer thereof, more preferably a pyridine ring, a pyrazine ring, a pyrimidine ring, a pyrrole ring, a condensed ring body thereof (for example, a quinoline ring, a quinoxaline ring, a phthalazine ring, an indolenine ring or the like) and a tautomer thereof, and even more preferably a pyridine ring, a pyrazine ring, a pyrimidine ring and a condensed ring body thereof (for example, a quinoline ring or the like). Among them, a pyridine ring or a condensed ring body including a pyridine ring (for example, a quinoline ring or the like) is particularly preferable.

In formula (I), $L^{15}$ represents a ligand which coordinates to $M^{11}$. $L^{15}$ represents preferably a monodentate to tetradentate ligand, and more preferably an anionic monodentate to tetradentate ligand. The anionic monodentate to tetradentate ligand is not particularly limited, but preferred examples thereof include a halogen ligand, a 1,3-diketone ligand (for example, an acetylacetone ligand or the like), a monoanionic bidentate ligand including a pyridine ligand (for example, a picolinic acid ligand, a 2-(2-hydroxyphenyl)-pyridine ligand, or the like) and a tetradentate ligand formed by $L^{11}$, $Y^{12}$, $L^{12}$, $Y^{11}$, $L^{13}$, $Y^{13}$ and $L^{14}$, more preferably a 1,3-diketone ligand (for example, an acetylacetone ligand or the like), a monoanionic bidentate ligand including a pyridine ligand (for example, a picolinic acid ligand, a 2-(2-hydroxyphenyl)-pyridine ligand or the like), and a tetradentate ligand formed by $L^{11}$, $Y^{12}$, $L^{12}$, $Y^{11}$, $L^{13}$, $Y^{13}$ and $L^{14}$, and even more preferably a 1,3-diketone ligand (for example, an acetylacetone ligand or the like) and a monoanionic bidentate ligand including a pyridine ligand (for example, a picolinic acid ligand, a 2-(2-hydroxyphenyl)-pyridine ligand, or the like). Among them, a 1,3-diketone ligand (for example, acetylacetone ligand or the like) is particularly preferable. The coordination numbers and ligand numbers do not exceed the coordination number of the metal. $L^{15}$ may bond to both $L^{11}$ and $L^{14}$ to form a cyclic ligand with them.

In formula (I), $Y^{11}$, $Y^{12}$ and $Y^{13}$ each independently represent a linking group, a single bond or a double bond. The linking group is not particularly limited, but a linking group comprising an atom selected from carbon atom, nitrogen atom, oxygen atom, sulfur atom, silicon atom and phosphorus atom is preferable. Specific examples of the linking group are described below.

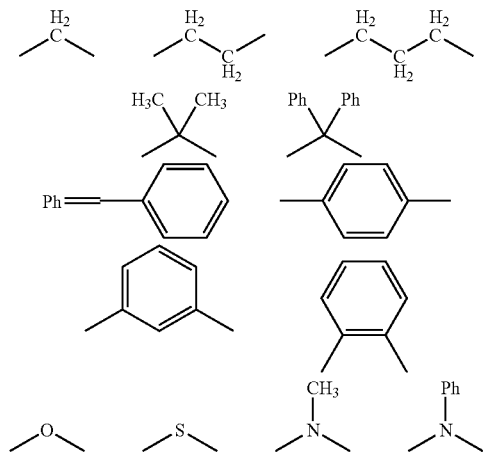

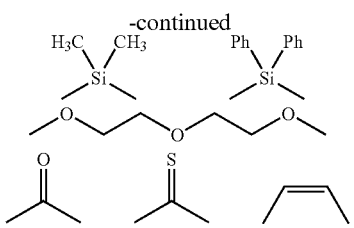
-continued

In the case where $Y^{11}$, $Y^{12}$ or $Y^{13}$ is a linking group, the bonds between $L^{11}$ and $Y^{12}$, $Y^{12}$ and $L^{12}$, $L^{12}$ and $Y^{11}$, $Y^{11}$ and $L^{13}$, $L^{13}$ and $Y^{13}$, and $Y^{13}$ and $L^{14}$ each independently represent a single bond or a double bond.

Preferably, $Y^{11}$, $Y^{12}$ and $Y^{13}$ each independently represent a single bond, a double bond, a carbonyl linking group, an alkylene linking group, an alkenylene group or an amino linking group. $Y^{11}$ is more preferably a single bond, an alkylene group or an amino linking group, and even more preferably an alkylene group. $Y^{12}$ and $Y^{13}$ each independently represent more preferably a single bond or an alkenylene group, and even more preferably a single bond.

The ring formed by $Y^{12}$, $L^{11}$, $L^{12}$ and $M^{11}$, the ring formed by $Y^{11}$, $L^{12}$, $L^{13}$ and $M^{11}$, and the ring formed by $Y^{13}$, $L^{13}$, $L^{14}$ and $M^{11}$ each preferably represent a 4- to 10-membered ring, more preferably a 5- to 7-membered ring, and even more preferably a 5- or 6-membered ring.

In formula (I), $n^{11}$ represents an integer of from 0 to 4. When $M^{11}$ is a metal having a coordination number of 4, $n^{11}$ represents 0. In the case where $M^{11}$ is a metal having a coordination number of 6, $n^{11}$ preferably represents 1 or 2, and more preferably 1. When $M^{11}$ is a metal having a coordination number of 6 and $n^{11}$ represents 1, $L^{15}$ represents a bidentate ligand. When $M^{11}$ is a metal having a coordination number of 6 and $n^{11}$ represents 2, $L^{15}$ represents a monodentate ligand. In the case where $M^{11}$ is a metal having a coordination number of 8, $n^{11}$ preferably represents 1 to 4, more preferably 1 or 2, and even more preferably 1. When $M^{11}$ is a metal having a coordination number of 8 and $n^{11}$ represents 1, $L^{15}$ represents a tetradentate ligand. When $M^{11}$ is a metal having a coordination number of 8 and $n^{11}$ represents 2, $L^{15}$ represents a bidentate ligand. When $n^{11}$ is 2 or more, plural $L^{15}$s may be the same or different from each other.

Preferable embodiment of the compound represented by formula (I) includes a compound represented by formulae (1), (2), (3), (4) or (5) described below.

The compound represented by the following formula (1) is to be described.

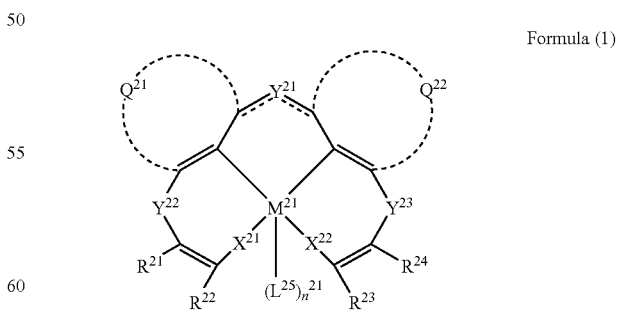

Formula (1)

In formula (1), $M^{21}$ represents a metal ion. $Y^{21}$ represents a linking group, a single bond or a double bond. $Y^{22}$ and $Y^{23}$ each represent a single bond or a linking group. $Q^{21}$ and $Q^{22}$ each represent an atomic group forming a nitrogen-containing heterocycle. The bond between a ring formed by $Q^{21}$ and $Y^{21}$, and the bond between a ring formed by $Q^{22}$ and $Y^{21}$ each represent a single bond or a double bond. $X^{21}$ and $X^{22}$ each independently represent an oxygen atom, a sulfur atom, or a substituted or unsubstituted nitrogen atom. $R^{21}$, $R^{22}$, $R^{23}$ and $R^{24}$ each independently represent a hydrogen atom or a substituent. $R^{21}$ and $R^{22}$, and $R^{23}$ and $R^{24}$ may combine together to form a ring. $L^{25}$ represents a ligand which coordinates to $M^{21}$. $n^{21}$ represents an integer of from 0 to 4.

Formula (1) is to be described in detail.

In formula (1), $M^{21}$ has the same meaning as $M^{11}$ in the above formula (I), and a similar preferable range.

$Q^{21}$ and $Q^{22}$ each independently represent an atomic group forming a nitrogen-containing heterocycle (comprising a nitrogen atom which coordinates to $M^{21}$). The nitrogen-containing heterocycle formed by $Q^{21}$ or $Q^{22}$ is not particularly limited, but examples thereof include a pyridine ring, a pyrazine ring, a pyrimidine ring, a pyridazine ring, a triazine ring, a pyrazole ring, an imidazole ring, a thiazole ring, an oxazole ring, a pyrrole ring, a triazole ring, a condensed ring body thereof (for example, a quinoline ring, a quinoxaline ring, a phthalazine ring, an indole ring, a benzoxazole ring, a benzimidazole ring, an indolenine ring or the like) and a tautomer thereof.

Examples of the nitrogen-containing heterocycle formed by $Q^{21}$ or $Q^{22}$ preferably include a pyridine ring, a pyrazine ring, a pyrimidine ring, a pyridazine, a triazine ring, a pyrazole ring, an imidazole ring, an oxazole ring, a pyrrole ring, a condensed ring body thereof (for example, a quinoline ring, a quinoxaline ring, a phthalazine ring, an indole ring, a benzoxazole ring, a benzimidazole ring or the like) and a tautomer thereof, more preferably a pyridine ring, a pyrazine ring, a pyrimidine ring, an imidazole ring, a pyrrole ring, a condensed ring body thereof (for example, a quinoline ring or the like) and a tautomer thereof, and even more preferably a pyridine ring and a condensed ring body thereof (for example, a quinoline ring or the like). Among them, a pyridine ring is particularly preferable.

$X^{21}$ and $X^{22}$ each independently represent an oxygen atom, a sulfur atom, or a substituted or unsubstituted nitrogen atom, preferably an oxygen atom, a sulfur atom or a substituted nitrogen atom, and more preferably an oxygen atom or a sulfur atom. Among them, an oxygen atom is particularly preferable.

$Y^{21}$ has the same meaning as $Y^{11}$ in the above formula (I), and a similar preferable range.

$Y^{22}$ and $Y^{23}$ each independently represent a single bond or a linking group, and preferably a single bond. The linking group is not particularly limited, but examples thereof include a carbonyl linking group, a thiocarbonyl linking group, an alkylene group, an alkenylene group, an arylene group, a heteroarylene group, an oxygen atom linking group, a nitrogen atom linking group, a sulfur atom linking group and a linking group formed by a combination thereof.

Examples of the linking group represented by $Y^{22}$ or $Y^{23}$ preferably include a carbonyl linking group, an alkylene linking group and an alkenylene linking group, more preferably a carbonyl linking group and an alkenylene linking group, and even more preferably a carbonyl linking group.

$R^{21}$, $R^{22}$, $R^{23}$ and $R^{24}$ each independently represent a hydrogen atom or a substituent. The substituent is not particularly limited, but specific examples thereof include an alkyl group (having preferably 1 to 30 carbon atoms, more preferably 1 to 20 carbon atoms, and even more preferably 1 to 10 carbon atoms; for example, methyl, ethyl, iso-propyl, tert-butyl, n-octyl, n-decyl, n-hexadecyl, cyclopropyl, cyclopentyl, cyclohexyl or the like), an alkenyl group (having preferably 2 to 30 carbon atoms, more preferably 2 to 20 carbon atoms, and even more preferably 2 to 10 carbon atoms; for example, vinyl, allyl, 2-butenyl, 3-pentenyl or the like), an alkynyl group (having preferably 2 to 30 carbon atoms, more preferably 2 to 20 carbon atoms, and even more preferably 2 to 10 carbon atoms; for example, propargyl, 3-pentynyl or the like), an aryl group (having preferably 6 to 30 carbon atoms, more preferably 6 to 20 carbon atoms, and even more preferably 6 to 12 carbon atoms; for example, phenyl, p-methylphenyl, naphthyl, anthranyl or the like), an amino group (having preferably 0 to 30 carbon atoms, more preferably 0 to 20 carbon atoms, and even more preferably 0 to 10 carbon atoms; for example, amino, methylamino, dimethylamino, diethylamino, dibenzylamino, diphenylamino, ditolylamino or the like), an alkoxy group (having preferably 1 to 30 carbon atoms, more preferably 1 to 20 carbon atoms, and even more preferably 1 to 10 carbon atoms; for example, methoxy, ethoxy, butoxy, 2-ethylhexyloxy or the like), an aryloxy group (having preferably 6 to 30 carbon atoms, more preferably 6 to 20 carbon atoms, and even more preferably 6 to 12 carbon atoms; for example, phenyloxy, 1-naphthyloxy, 2-naphthyloxy or the like), a heterocyclic oxy group (having preferably 1 to 30 carbon atoms, more preferably 1 to 20 carbon atoms, and even more preferably 1 to 12 carbon atoms; for example, pyridyloxy, pyrazinyloxy, primidyloxy, quinolyloxy or the like), an acyl group (having preferably 1 to 30 carbon atoms, more preferably 1 to 20 carbon atoms, and even more preferably 1 to 12 carbon atoms; for example, acetyl, benzoyl, formyl, pivaloyl or the like), an alkoxycarbonyl group (having preferably 2 to 30 carbon atoms, more preferably 2 to 20 carbon atoms, and even more preferably 2 to 12 carbon atoms; for example, methoxycarbonyl, ethoxycarbonyl or the like), an aryloxycarbonyl group (having preferably 7 to 30 carbon atoms, more preferably 7 to 20 carbon atoms, and even more preferably 7 to 12 carbon atoms; for example, phenyloxycarbonyl or the like), an acyloxy group (having preferably 2 to 30 carbon atoms, more preferably 2 to 20 carbon atoms, and even more preferably 2 to 10 carbon atoms; for example, acetoxy, benzoyloxy or the like), an acylamino group (having preferably 2 to 30 carbon atoms, more preferably 2 to 20 carbon atoms, and even more preferably 2 to 10 carbon atoms; for example, acetylamino, benzoylamino or the like), an alkoxylcarbonylamino group (having preferably 2 to 30 carbon atoms, more preferably 2 to 20 carbon atoms, and even more preferably 2 to 12 carbon atoms; for example, methoxycarbonylamino or the like), an aryloxycarbonylamino group (having preferably 7 to 30 carbon atoms, more preferably 7 to 20 carbon atoms, and even more preferably 7 to 12 carbon atoms; for example, phenyloxycarbonylamino or the like), a sulfonylamino group (having preferably 1 to 30 carbon atoms, more preferably 1 to 20 carbon atoms, and even more preferably 1 to 12 carbon atoms; for example, methanesulfonylamino, benzenesulfonylamino or the like), a sulfamoyl group (having preferably 0 to 30 carbon atoms, more preferably 0 to 20 carbon atoms, and even more preferably 0 to 12 carbon atoms; for example, sulfamoyl, methylsulfamoyl, dimethylsulfamoyl, phenylsulfamoyl or the like), a carbamoyl group (having preferably 1 to 30 carbon atoms, more preferably 1 to 20 carbon atoms, and even more preferably 1 to 12 carbon atoms; for example, carbamoyl, methylcarbamoyl, diethylcarbamoyl, phenylcarbamoyl or the like), an alkylthio group (having preferably 1 to 30 carbon atoms, more preferably 1 to 20 carbon atoms, and even more preferably 1 to 12 carbon atoms; for example, methylthio, ethylthio or the like), an arylthio group (having preferably 6 to 30 carbon atoms, more preferably 6 to 20 carbon atoms, and even more preferably 6 to 12 carbon atoms; for example, phenylthio or the like), a heterocyclic thio group (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio or the like), a sulfonyl group (having preferably 1 to 30 carbon atoms, more preferably 1 to 20 carbon atoms, and even more preferably 1 to 12 carbon atoms; for example, mesyl, tosyl or the like), a sulfinyl group (having preferably 1 to 30 carbon atoms, more preferably 1 to 20 carbon atoms, and even more preferably 1 to 12 carbon atoms; for example, methanesulfinyl, benzenesulfinyl or the like), a ureido group (having preferably 1 to 30 carbon atoms, more preferably 1 to 20 carbon atoms, and even more preferably 1 to 12 carbon atoms; for example, ureido, methylureido, phenylureido or the like), a phosphoric amido group (having preferably 1 to 30 carbon atoms, more preferably 1 to 20 carbon atoms, and even more preferably 1 to 12 carbon atoms; for example, diethylphosphoric amido, phenylphosphoric amido or the like), a hydroxy group, a mercapto group, a halogen atom (for example, a fluorine atom, a chlorine atom, a bromine atom, or an iodine atom), a cyano group, a sulfo group, a carboxy group, a nitro group, a hydroxamic acid group, a sulfino group, a hydrazino group, an imino group, a heterocyclic group (having preferably 1 to 30 carbon atoms, and more preferably 1 to 12 carbon atoms; examples of the heteroatom including a nitrogen atom, an oxygen atom and a sulfur atom; specific examples of the heterocyclic group including an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, an azepinyl group or the like), a silyl group (having preferably 3 to 40 carbon atoms, more preferably 3 to 30 carbon atoms, and even more preferably 3 to 24 carbon atoms; for example, trimethylsilyl, triphenylsilyl or the like), and a silyloxy group (having preferably 3 to 40 carbon atoms, more preferably 3 to 30 carbon atoms, and even more preferably 3 to 24 carbon atoms; for example, trimethylsilyloxy, triphenylsilyloxy or the like). These substituents may be further substituted.

Preferably, $R^{21}$, $R^{22}$, $R^{23}$ and $R^{24}$ each independently represent an alkyl group, an aryl group or a group forming a ring structure by combining $R^{21}$ and $R^{22}$ or $R^{23}$ and $R^{24}$ (for example, a benzo condensed ring, a pyridine condensed ring or the like), more preferably a group forming a ring structure by combining $R^{21}$ and $R^{22}$ or $R^{23}$ and $R^{24}$ (for example, a benzo condensed ring, a pyridine condensed ring or the like).

$L^{25}$ has the same meaning as $L^{15}$ in the above formula (I) and a similar preferable range.

$n^{21}$ has the same meaning as $n^{11}$ in the above formula (I), and a similar preferable range.

In formula (1), a metal complex in which the rings formed by $Q^{21}$ or $Q^{22}$ are each a pyridine ring, and $Y^{21}$ represents a linking group; a metal complex in which the rings formed by $Q^{21}$ or $Q^{22}$ are each a pyridine ring, $Y^{21}$ represents a single bond or a double bond, and $X^{21}$ and $X^{22}$ each represent a sulfur atom, or a substituted or unsubstituted nitrogen atom; or a metal complex in which the rings formed by $Q^{21}$ or $Q^{22}$ are each a nitrogen-containing 5-membered heterocycle or a nitrogen-containing 6-membered ring including two or more nitrogen atoms is preferred.

Preferred embodiment of the compound represented by the above formula (1) is a compound represented by the following formula (1-A).

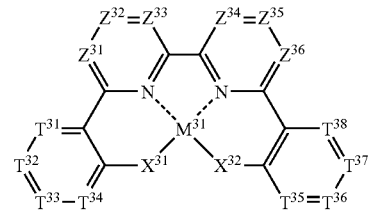

Formula (1-A)

Formula (1-A) is to be described.

In formula (1-A), $M^{31}$ has the same meaning as $M^{11}$ in the above formula (I) and a similar preferable range.

$Z^{31}$, $Z^{32}$, $Z^{33}$, $Z^{34}$, $Z^{35}$ and $Z^{36}$ each independently represent preferably a substituted or unsubstituted carbon atom or a nitrogen atom, and more preferably a substituted or unsubstituted carbon atom. Examples of the substituent on the carbon atom include the groups explained for $R^{21}$ in the above formula (1). $Z^{31}$ and $Z^{32}$, $Z^{32}$ and $Z^{33}$, $Z^{33}$ and $Z^{34}$, $Z^{34}$ and $Z^{31}$ or $Z^{35}$ and $Z^{36}$ may combine together through a linking group to form a condensed ring (for example, a benzo condensed ring, a pyridine condensed ring or the like). Furthermore, $Z^{31}$ and $T^{31}$ or $Z^{36}$ and $T^{38}$ may combine together through a linking group to form a condensed ring (for example, a benzo condensed ring, a pyridine condensed ring or the like).

Examples of the substituents on the carbon atom preferably include an alkyl group, an alkoxy group, an alkylamino group, an aryl group, a group forming a condensed ring (for example, a benzo condensed ring, a pyridine condensed ring or the like), and a halogen atom, more preferably an alkylamino group, an aryl group, and a group forming a condensed ring (for example, a benzo condensed ring, a pyridine condensed ring or the like), and even more preferably an aryl group and a group forming a condensed ring (for example, a benzo condensed ring, a pyridine condensed ring or the like). Among them, a group forming a condensed ring (for example, a benzo condensed ring, a pyridine condensed ring or the like) is particularly preferable.

$T^{31}$, $T^{32}$, $T^{33}$, $T^{34}$, $T^{35}$, $T^{36}$, $T^{37}$ and $T^{38}$ each independently represent a substituted or unsubstituted carbon atom or a nitrogen atom, and more preferably a substituted or unsubstituted carbon atom. Examples of the substituent on the carbon atom include the groups explained for $R^{21}$ in the above formula (1). $T^{31}$ and $T^{32}$, $T^{32}$ and $T^{33}$, $T^{33}$ and $T^{34}$, $T^{35}$ and $T^{36}$, $T^{36}$ and $T^{37}$, or $T^{37}$ and $T^{38}$ may combine together through a linking group to form a condensed ring (for example, a benzo condensed ring, a pyridine condensed ring or the like).

Examples of the substituent on the carbon atom preferably include an alkyl group, an alkoxy group, an alkylamino group, an aryl group, a group forming a condensed ring (for example, a benzo condensed ring, a pyridine condensed ring or the like) and a halogen atom, more preferably an aryl group, a group forming a condensed ring (for example, a benzo condensed ring, a pyridine condensed ring or the like) and a halogen atom, and even more preferably an aryl group and a halogen atom. Among them, an aryl group is particularly preferable.

$X^{31}$ and $X^{32}$ each have the same meaning as $X^{21}$ and $X^{22}$ in the above formula (1) and a similar preferable range.

The compound represented by the following formula (2) is to be described.

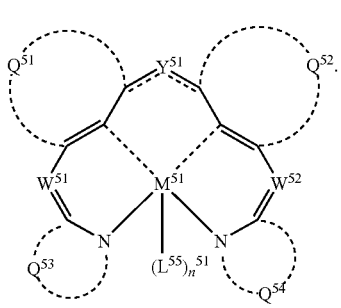

Formula (2)

In formula (2), $M^{51}$ has the same meaning as $M^{11}$ in the above formula (I) and a similar preferable range.

$Q^{51}$ and $Q^{52}$ each have the same meaning as $Q^{21}$ and $Q^{22}$ in the above formula (1) and a similar preferable range.

$Q^{53}$ and $Q^{54}$ each independently represent a group forming a nitrogen-containing heterocycle (including a nitrogen atom which coordinates to $M^{51}$). The nitrogen-containing heterocycle formed by $Q^{53}$ or $Q^{54}$ is not particularly limited, but examples thereof include tautomers of pyrrole derivatives (for example, a 5-membered heterocyclic ligand: Compound (24) exemplified in Compound number [KA 24], a terminal 5-membered heterocyclic ligand: Compound (64) exemplified in Compound number [KA 28], and a 5-membered heterocyclic ligand: Compound (145) exemplified in Compound number [KA 37], all of which are described in JP-A No. 2007-103493), tautomers of imidazole derivatives (for example, a 5-membered heterocyclic ligand: Compound (29) exemplified in Compound number [KA 24] described in JP-A No. 2007-103493), tautomers of thiazole derivatives (for example, a 5-membered heterocyclic ligand: Compound (30) exemplified in Compound number [KA 24] described in JP-A No. 2007-103493) and tautomers of oxazole derivatives (for example, a 5-membered heterocyclic ligand: Compound (31) exemplified in Compound number [KA 24] described in JP-A No. 2007-103493), more preferably tautomers of pyrrole derivatives, tautomers of imidazole derivatives and tautomers of thiazole derivatives, and even more preferably tautomers of pyrrole derivatives and tautomers of imidazole derivatives. Among them, tautomers of pyrrole derivatives are particularly preferable.

$Y^{51}$ has the same meaning as $Y^{11}$ in the above formula (I) and a similar preferable range.

$L^{55}$ has the same meaning as $L^{15}$ in the above formula (I) and a similar preferable range.

$n^{51}$ has the same meaning as $n^{11}$ in the above formula (I) and a similar preferable range.

$W^{51}$ and $W^{52}$ each independently represent a substituted or unsubstituted carbon atom or a nitrogen atom, more preferably an unsubstituted carbon atom or a nitrogen atom, and even more preferably an unsubstituted carbon atom.

The compound represented by the following formula (3) is to be described.

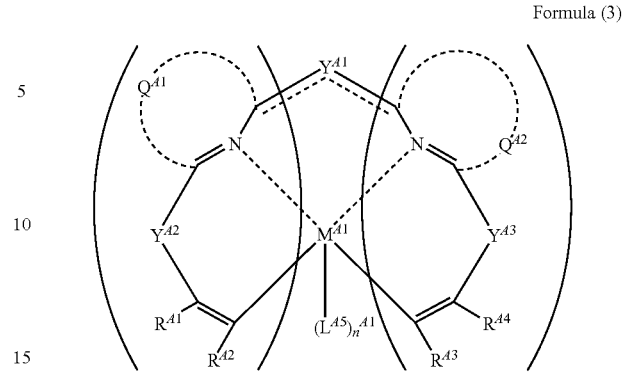

Formula (3)

In formula (3), $M^{41}$, $Q^{41}$, $Q^{42}$, $Y^{41}$, $Y^{42}$, $Y^{43}$, $R^{41}$, $R^{42}$, $R^{43}$, $R^{44}$, $L^{45}$ and $n^{41}$ each have the same meaning as $M^{21}$, $Q^{21}$, $Q^{22}$, $Y^{21}$, $Y^{22}$, $Y^{23}$, $R^{21}$, $R^{22}$, $R^{23}$, $R^{24}$, $L^{25}$ and $n^{21}$ in the above formula (1) respectively and a similar preferable range.

Preferred embodiment of the compound represented by the above formula (3) is a compound represented by the following formula (3-B).

The compound represented by formula (3-B) is to be described.

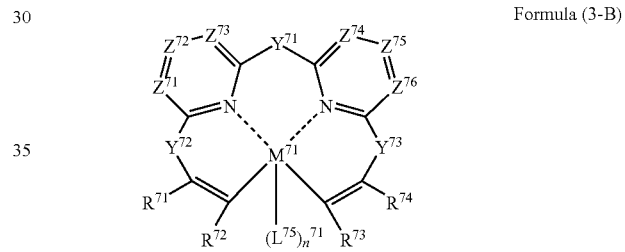

Formula (3-B)

In formula (3-B), $M^{71}$ has the same meaning as $M^{11}$ in the above formula (I) and a similar preferable range.

$Y^{71}$, $Y^{72}$ and $Y^{73}$ each have the same meaning as $Y^{21}$, $Y^{22}$ and $Y^{23}$ in formula (1) respectively and a similar preferable range.

$L^{75}$ has the same meaning as $L^{15}$ in the above formula (I) and a similar preferable range.

$n^{71}$ has the same meaning as $n^{11}$ in the above formula (I) and a similar preferable range.

$Z^{71}$, $Z^{72}$, $Z^{73}$, $Z^{74}$, $Z^{75}$ and $Z^{76}$ each independently represent a substituted or unsubstituted carbon atom or a nitrogen atom, and more preferably a substituted or unsubstituted carbon atom. Examples of the substituent on the carbon atom include the groups explained for $R^{21}$ in the above formula (1). $R^{71}$ and $R^{72}$, or $R^{73}$ and $R^{74}$ may combine together through a linking group to form a ring (for example, a benzene ring or a pyridine ring). $R^{71}$ to $R^{74}$ each have the same meaning as $R^{21}$ to $R^{24}$ in the above formula (1) and a similar preferable range.

Preferred embodiment of the compound represented by the above formula (3-B) is a compound represented by the following formula (3-C).

The compound represented by formula (3-C) is to be described.

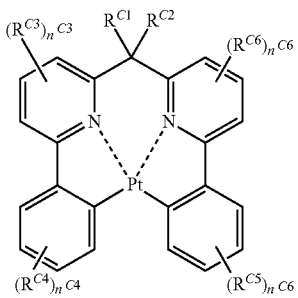

Formula (3-C)

In formula (3-C), $R^{C1}$ and $R^{C2}$ each independently represent a hydrogen atom or a substituent. Examples of the substituent include an alkyl group, an aryl group, a heterocyclic group (these groups may be further substituted. In this case, for the substituent thereof, the groups described as examples of the substituent represented by $R^{21}$ in the above formula (1) can be applied), and a halogen atom, which are explained as the substituent represented by $R^{21}$ to $R^{24}$ in the above formula (1). The substituent represented by $R^{C3}$, $R^{C4}$, $R^{C5}$ or $R^{C6}$ has the same meaning as the substituent represented by $R^{21}$ to $R^{24}$ in the above formula (1). $n^{C3}$ and $n^{C6}$ each represent an integer of from 0 to 3, and $n^{C4}$ and $n^{C5}$ each represent an integer of from 0 to 4. In the case where there are plural $R^{C3}$s, $R^{C4}$s, $R^{C5}$s or $R^{C6}$s, the plural $R^{C3}$s, $R^{C4}$s, $R^{C5}$s or $R^{C6}$s may be the same or different, and may form a ring by linking each other. $R^{C3}$, $R^{C4}$, $R^{C5}$ and $R^{C6}$ each preferably represent an alkyl group, an aryl group, a heteroaryl group, a cyano group or a halogen atom.

The compound represented by formula (4) is to be described.

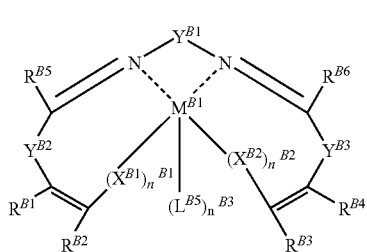

Formula (4)

In formula (4), $M^{B1}$, $Y^{B2}$, $Y^{B3}$, $R^{B1}$, $R^{B2}$, $R^{B3}$, $R^{B4}$, $L^{B5}$, $n^{B3}$, $X^{B1}$ and $X^{B2}$ each have the same meaning as $M^{21}$, $Y^{22}$, $Y^{23}$, $R^{21}$, $R^{22}$, $R^{23}$, $R^{24}$, $L^{25}$, $n^{21}$, $X^{21}$ and $X^{22}$ in the above formula (1) respectively and a similar preferable range.

$Y^{B1}$ represents a linking group and has the same meaning as $Y^{21}$ in the above formula (1). Preferably, $Y^{B1}$ represents a vinylene group substituted at 1- and 2-position thereof, a phenylene ring, a pyridine ring, a pyrazine ring, a pyrimidine ring or an alkylene group having 2 to 8 carbon atoms.

$R^{B5}$ and $R^{B6}$ each independently represent a hydrogen atom or a substituent. Examples of the substituent include an alkyl group, an aryl group, and a heterocyclic group, which are explained as the substituent represented by $R^{21}$ to $R^{24}$ in the above formula (1). With proviso, however, $Y^{B1}$ does not bond to $R^{B5}$ or $R^{B6}$. $n^{B1}$ and $n^{B2}$ each independently represent 0 or 1.

Preferred embodiment of the compound represented by the above formula (4) is a compound represented by the following formula (4-A).

The compound represented by formula (4-A) is be described.

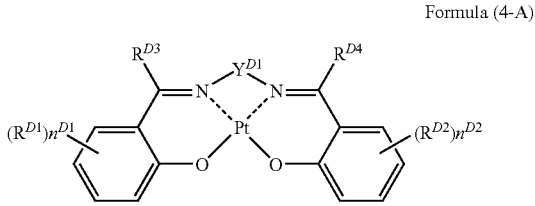

Formula (4-A)

In formula (4-A), $R^{D3}$ and $R^{D4}$ each independently represent a hydrogen atom or a substituent. $R^{D1}$ and $R^{D2}$ each represent a substituent. The substituent represented by $R^{D1}$, $R^{D2}$, $R^{D3}$ or $R^{D4}$ has the same meaning as the substituent represented by $R^{B5}$ or $R^{B6}$ in the above formula (4) and a similar preferable range. $n^{D1}$ and $n^{D2}$ each represent an integer of from 0 to 4. In the case where there are plural $R^{D1}$s and $R^{D2}$s, the plural $R^{D1}$s and $R^{D2}$s may be the same or different, and may combine together to form a ring. $Y^{D1}$ represents a vinylene group substituted at 1- and 2-position thereof, a phenylene ring, a pyridine ring, a pyrazine ring, a pyrimidine ring or an alkylene group having 1 to 8 carbon atoms.

The compound represented by formula (5) is to be described.

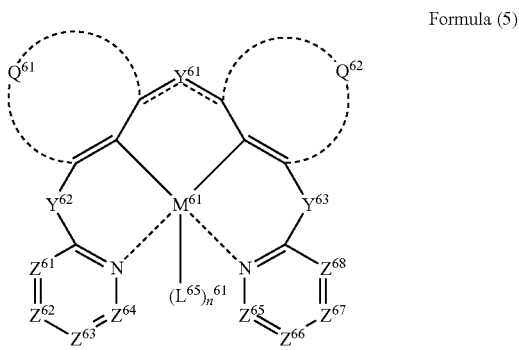

Formula (5)

In formula (5), $M^{61}$ has the same meaning as $M^{11}$ in the above formula (I) and a similar preferable range.

$Q^{61}$ and $Q^{62}$ each independently represent a group forming a ring. The ring formed by $Q^{61}$ or $Q^{62}$ is not particularly limited, but examples thereof include a benzene ring, a pyridine ring, a pyridazine ring, a pyrimidine ring, a thiophene ring, an isothiazole ring, a furan ring, an isoxazole ring and a condensed ring body thereof.

The ring formed by $Q^{61}$ or $Q^{62}$ is preferably a benzene ring, a pyridine ring, a thiophene ring, a thiazole ring or a condensed ring body thereof, more preferably a benzene ring, a pyridine ring or a condensed ring body thereof, and even more preferably a benzene ring or a condensed ring body thereof.

$Y^{61}$ has the same meaning as $Y^{11}$ in the above formula (I) and a similar preferable range.

$Y^{62}$ and $Y^{63}$ each independently represent a linking group or a single bond. The linking group is not particularly limited, but examples thereof include a carbonyl linking group, a thiocarbonyl linking group, an alkylene group, an alkenylene group, an arylene group, a heteroarylene group, an oxygen atom linking group, a nitrogen atom linking group and a linking group formed by a combination thereof.

$Y^{62}$ and $Y^{63}$ each independently represent preferably a single bond, a carbonyl linking group, an alkylene linking group, an alkenylene group, more preferably a single bond or an alkenylene group, and even more preferably a single bond.

$L^{65}$ has the same meaning as $L^{15}$ in the above formula (I) and a similar preferable range.

$n^{61}$ has the same meaning as $n^{11}$ in the above formula (I) and a similar preferable range.

$Z^{61}, Z^{62}, Z^{63}, Z^{64}, Z^{65}, Z^{66}, Z^{67}$ and $Z^{68}$ each independently represent a substituted or unsubstituted carbon atom, or a nitrogen atom, and preferably a substituted or unsubstituted carbon atom. Examples of the substituent on the carbon atom include the groups explained for $R^{21}$ in the above formula (1). Furthermore, $Z^{61}$ and $Z^{62}$, $Z^{62}$ and $Z^{63}$, $Z^{63}$ and $Z^{64}$, $Z^{65}$ and $Z^{66}$, $Z^{66}$ and $Z^{67}$, and $Z^{67}$ and $Z^{68}$ each may combine each other through a linking group to form a condensed ring (for example, a benzo condensed ring, a pyridine condensed ring or the like). The rings formed by $Q^{61}$ or $Q^{62}$ each may form a ring by combining with $Z^{61}$ or $Z^{68}$ respectively through a linking group.

Specific examples of the substituent on the carbon atom preferably include an alkyl group, an alkoxy group, an alkylamino group, an aryl group, a group forming a condensed ring (for example, benzo condensed ring, a pyridine condensed ring or the like) or a halogen atom, more preferably an alkylamino group, an aryl group, or a group forming a condensed ring (for example, a benzo condensed ring, a pyridine condensed ring or the like), and even more preferably an aryl group or a group forming a condensed ring (for example, a benzo condensed ring, a pyridine condensed ring or the like). Among them, a group forming a condensed ring (for example, a benzo condensed ring, a pyridine condensed ring or the like) is particularly preferable.

Preferable embodiment of the metal complex having a tridentate ligand in the present invention is a compound represented by the following formula (II).

The compound represented by formula (II) is to be described.

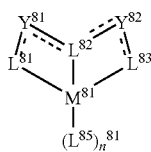

Formula (II)

In formula (II), $M^{81}$ has the same meaning as $M^{11}$ in the above formula (I) and a similar preferable range.

$L^{81}$, $L^{82}$ and $L^{83}$ each independently have the same meaning as $L^{11}$, $L^{12}$ and $L^{14}$ in the above formula (I) and a similar preferable range.

$Y^{81}$ and $Y^{82}$ each independently have the same meaning as $Y^{12}$ and $Y^{13}$ in the above formula (I) and a similar preferable range.

$L^{85}$ represents a ligand which coordinates to $M^{81}$. $L^{85}$ preferably represents a monodentate to tridentate ligand, and more preferably an anionic monodentate to tridentate ligand. The anionic monodentate to tridentate ligand is not particularly limited, but specific examples thereof preferably include a halogen ligand, a tridentate ligand formed by $L^{81}, Y^{81}, L^{82}, Y^{82}$ and $L^{83}$, and more preferably a tridentate ligand formed by $L^{81}, Y^{81}, L^{82}, Y^{82}$ and $L^{83}$. $L^{85}$ does not link to $L^{81}$ or $L^{83}$ without interposition of a metal. The coordination numbers and ligand numbers do not exceed the coordination number of the metal.

$n^{81}$ is from 0 to 5. In the case where $M^{81}$ is a metal having a coordination number of 4, n is 1, and $L^{85}$ represents a monodentate ligand. In the case where $M^{81}$ is a metal having a coordination number of 6, $n^{81}$ is preferably from 1 to 3, more preferably 1 or 3, and even more preferably 1. When $M^{81}$ is a metal having a coordination number of 6, and $n^{81}$ is 1, $L^{85}$ represents a bidentate ligand. When $M^{81}$ is a metal having a coordination number of 6, and $n^{81}$ is 2, $L^{85}$ represents one monodentate ligand and one bidentate ligand. When $M^{81}$ is a metal having a coordination number of 6, and $n^{81}$ is 3, $L^{85}$ represents a monodentate ligand. In the case where $M^{81}$ is a metal having a coordination number of 8, $n^{81}$ is preferably from 1 to 5, more preferably 1 or 2, and even more preferably 1. When $M^{81}$ is a metal having a coordination number of 8, and $n^{81}$ is 1, $L^{85}$ represents a pentadentate ligand. When $M^{81}$ is a metal having a coordination number of 8, and $n^{81}$ is 2, $L^{85}$ represents one tridentate ligand and one bidentate ligand. When $M^{81}$ is a metal having a coordination number of 8, and $n^{81}$ is 3, $L^{85}$ represents one tridentate ligand and two monodentate ligands, or two bidentate ligands and one monodentate ligand. When $M^{81}$ is a metal having a coordination number of 8, and $n^{81}$ is 4, $L^{85}$ represents one bidentate ligand and three monodentate ligands. When $M^{81}$ is a metal having a coordination number of 8, and $n^{81}$ is 5, $L^{85}$ represents five monodentate ligands. When $n^{81}$ is 2 or more, plural $L^{85}$s may be the same or different from each other.

Preferable embodiment of the above formula (II) includes that in the above formula (II), $L^{81}$, $L^{82}$ and $L^{83}$ each represent an aromatic carbon ring or a heterocycle, each of which coordinates to $M^{81}$ through a carbon atom, or a nitrogen-containing heterocycle which coordinates to $M^{81}$ through a nitrogen atom, and at least one from among $L^{81}$, $L^{82}$ and $L^{83}$ is a nitrogen-containing heterocycle. The aromatic carbon ring or heterocycle which coordinates through a carbon atom and the nitrogen-containing heterocycle which coordinates through a nitrogen atom include similar examples as explained for the ligand which coordinates to $M^{11}$ through a carbon atom or a nitrogen atom in the above formula (I) and preferable ranges thereof are also similar. $Y^{81}$ and $Y^{82}$ each represent preferably a single bond or a methylene group.

Other preferable embodiments of the compound represented by the above formula (II) are a compound represented by formula (II-A) and a compound represented by (II-B) described below.

The compound represented by formula (II-A) is to be described.

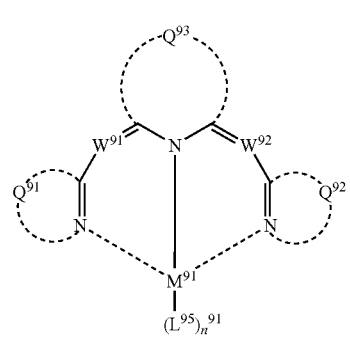

Formula (II-A)

In formula (II-A), $M^{91}$ has the same meaning as $M^{81}$ in the above formula (II) and a similar preferable range.

$Q^{91}$ and $Q^{92}$ each represent a group forming a nitrogen-containing heterocycle (including a nitrogen atom which coordinates to $M^{91}$). The nitrogen-containing heterocycle formed by $Q^{91}$ or $Q^{92}$ is not particularly limited, but examples thereof include a pyridine ring, a pyrazine ring, a pyrimidine ring, a pyridazine ring, a triazine ring, a thiazole ring, an oxazole ring, a pyrrole ring, a pyrazole ring, an imidazole ring, a triazole ring, a condensed ring body thereof (for example, a quinoline ring, a benzoxazole ring, a benzimidazole ring, an indolenine ring or the like) and a tautomer thereof.

Examples of the nitrogen-containing heterocycle formed by $Q^{91}$ or $Q^{92}$ preferably include a pyridine ring, a pyrazole ring, a thiazole ring, an imidazole ring, a pyrrole ring, a condensed ring body thereof (for example, a quinoline ring, a benzthiazole ring, a benzimidazole ring, indolenine ring or the like) and a tautomer thereof, more preferably a pyridine ring, a pyrrole ring, a condensed ring body thereof (for example, a quinoline ring or the like), and a tautomer thereof, and even more preferably a pyridine ring and a condensed ring body thereof (for example, a quinoline ring or the like). Among them, a pyridine ring is particularly preferred.

$Q^{93}$ represents a group forming a nitrogen-containing heterocycle (including a nitrogen atom which coordinates to $M^{91}$). The nitrogen-containing heterocycle formed by $Q^{93}$ is not particularly limited, but examples thereof preferably include tautomers of a pyrrole ring, imidazole ring, or triazole ring, and a condensed ring body thereof (for example, benzopyrrole or the like), and more preferably a tautomer of a pyrrole ring and a tautomer of a condensed ring body including a pyrrole ring (for example, benzopyrrole or the like).

$W^{91}$ and $W^{92}$ each independently have the same meaning as $W^{51}$ and $W^{52}$ in the above formula (2) and a similar preferable range.

$L^{95}$ has the same meaning as $L^{85}$ in formula (II) described above and a similar preferable range.

$n^{91}$ has the same meaning as $n^{81}$ in formula (II) described above and a similar preferable range.

The compound represented by the following formula (II-B) is to be described.

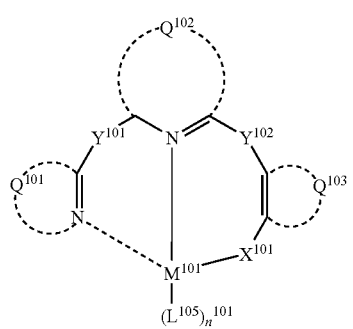

Formula (II-B)

In formula (II-B), $M^{101}$ has the same meaning as $M^{81}$ in the above formula (II) and a similar preferable range.

$Q^{102}$ has the same meaning as $Q^{21}$ in formula (1) described above and a similar preferable range.

$Q^{101}$ has the same meaning as $Q^{91}$ in formula (II-A) described above and a similar preferable range.

$Q^{103}$ represents a group forming an aromatic ring. The aromatic ring formed by $Q^{103}$ is not particularly limited, but examples thereof preferably include a benzene ring, a furan ring, a thiophene ring, a pyrrole ring, and a condensed ring body thereof (for example, a naphthalene ring, a benzofuran ring, a benzothiophene ring, an indole ring or the like), more preferably a benzene ring and a condensed ring body containing a benzene ring (for example, a naphthalene ring or the like), and particularly preferably a benzene ring.

$Y^{101}$ and $Y^{101}$ each independently have the same meaning as $Y^{22}$ in formula (1) described above and a similar preferable range.

$L^{105}$ has the same meaning as $L^{85}$ in formula (II) described above and a similar preferable range.

$n^{101}$ has the same meaning as $n^{81}$ in formula (II) described above and a similar preferable range.

$X^{101}$ has the same meaning as $X^{21}$ in formula (1) described above and a similar preferable range.

Another preferred embodiment of the metal complex having a tridentate ligand in the present invention is a compound represented by the following formula (II-C).

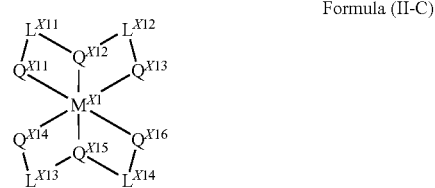

Formula (II-C)

In formula (II-C), $M^{X1}$ represents a metal ion. $Q^{X11}$ to $Q^{X16}$ represent an atom which coordinates to $M^{X1}$ or an atomic group containing an atom which coordinates to $M^{X1}$. $L^{X11}$ to $L^{X14}$ each represent a single bond, a double bond or a linking group. Namely, an atomic group formed by $Q^{X11}$-$L^{X11}$-$Q^{X12}$-$L^{X12}$-$Q^{X13}$, and an atomic group formed by $Q^{X14}$-$L^{X13}$-$Q^{X15}$-$L^{X14}$-$Q^{X16}$ are each a tridentate ligand. Bonds between $M^{X1}$ and $Q^{X11}$ to $Q^{X16}$ are each a coordination bond, an ionic bond or a covalent bond.

The compound represented by formula (II-C) is to be described in detail.

In formula (II-C), $M^{X1}$ represents a metal ion. The metal ion is not particularly limited, but is preferably a monovalent to trivalent metal ion, more preferably a divalent or trivalent metal ion, and even more a trivalent metal ion. Specific examples thereof include a platinum ion, an iridium ion, a rhenium ion, a palladium ion, a rhodium ion, a ruthenium ion, a copper ion, a europium ion, a gadolinium ion and a terbium ion, more preferably an iridium ion and a europium ion, and even more preferably an iridium ion.

$Q^{X11}$ to $Q^{X16}$ each represent an atom which coordinates to $M^{X1}$ or an atomic group containing an atom which coordinates to $M^{X1}$.

In the case where $Q^{X11}$ to $Q^{X16}$ represents an atom which coordinates to $M^{X1}$, specific examples of the atom include a carbon atom, a nitrogen atom, an oxygen atom, a silicon atom, a phosphorus atom and a sulfur atom, preferably a nitrogen atom, an oxygen atom, a sulfur atom and a phosphorus atom, and more preferably a nitrogen atom and an oxygen atom.

In the case where $Q^{X11}$ to $Q^{X16}$ represents an atomic group containing an atom which coordinates to $M^{X1}$, examples of an atomic group containing a carbon atom which coordinates to $M^{X1}$ include an imino group, an aromatic hydrocarbon ring group (for example, benzene, naphthalene or the like), a heterocyclic group (for example, thiophene, pyridine, pyrazine, pyrimidine, pyridazine, triazine, thiazole, oxazole, pyrrole, imidazole, pyrazole, triazole or the like), a condensed ring thereof, and a tautomer thereof.

Examples of an atomic group containing a nitrogen atom which coordinates to $M^{X1}$ include a nitrogen-containing heterocyclic group (for example, pyridine, pyrazine, pyrimidine, pyridazine, triazine, thiazole, oxazole, pyrrole, imidazole, pyrazole, triazole or the like), an amino group (including an alkylamino group (having preferably 2 to 30 carbon atoms, more preferably 2 to 20 carbon atoms, and even more preferably 2 to 10 carbon atoms; for example, methylamino), an arylamino group (for example, phenylamino), and the like), an acylamino group (having preferably 2 to 30 carbon atoms, more preferably 2 to 20 carbon atoms, and even more preferably 2 to 10 carbon atoms; for example, acetylamino, benzoylamino or the like), an alkoxycarbonylamino group (having preferably 2 to 30 carbon atoms, more preferably 2 to 20 carbon atoms and even more preferably 2 to 12 carbon atoms; for example, methoxycarbonylamino or the like), an aryloxycarbonylamino group (having preferably 7 to 30 carbon atoms, more preferably 7 to 20 carbon atoms and even more preferably 7 to 12 carbon atoms; for example, phenyloxycarbonylamino or the like), and a sulfonylamino group (having preferably 1 to 30 carbon atoms, more preferably 1 to 20 carbon atoms, and even more preferably 1 to 12 carbon atoms; for example, methanesulfonylamino, benzenesulfonylamino or the like), an imino group and the like. These groups may be further substituted.

Examples of the atomic group containing an oxygen atom which coordinates to $M^{X1}$ include an alkoxy group (having preferably 1 to 30 carbon atoms, more preferably 1 to 20 carbon atoms, and even more preferably 1 to 10 carbon atoms; for example, methoxy, ethoxy, butoxy, 2-ethylhexyloxy or the like), an aryloxy group (having preferably 6 to 30 carbon atoms, more preferably 6 to 20 carbon atoms, and even more preferably 6 to 12 carbon atoms; for example, phenyloxy, 1-naphthyloxy, 2-naphthyloxy or the like), a heterocyclic oxy group (having preferably 1 to 30 carbon atoms, more preferably 1 to 20 carbon atoms, and even more preferably 1 to 12 carbon atoms; for example, pyridyloxy, pyrazinyloxy, primidyloxy, quinolyloxy, or the like), an acyloxy group (having preferably 2 to 30 carbon atoms, more preferably 2 to 20 carbon atoms, and even more preferably 2 to 10 carbon atoms; for example, acetoxy, benzoyloxy or the like), a silyloxy group (having preferably 3 to 40 carbon atoms, more preferably 3 to 30 carbon atoms, and even more preferably 3 to 24 carbon atoms; for example, trimethylsilyloxy, triphenysilyloxy or the like), a carbonyl group (for example, a ketone group, an ester group, an amido group or the like), an ether group (for example, a dialkylether group, a diarylether group, a furyl group or the like) and the like.

Examples of the atomic group containing a silicon atom which coordinates to $M^{X1}$ include an alkylsilyl group (having preferably 3 to 30 carbon atoms; for example, trimethylsilyl group or the like), an arylsilyl group (having preferably 18 to 30 carbon atoms; for example, triphenylsilyl group or the like) and the like. These groups may be further substituted.

Examples of the atomic group containing a sulfur atom which coordinates to $M^{X1}$ include an alkylthio group (having preferably 1 to 30 carbon atoms, more preferably 1 to 20 carbon atoms, and even more preferably 1 to 12 carbon atoms; for example, methylthio, ethylthio or the like), an arylthio group (having preferably 6 to 30 carbon atoms, more preferably 6 to 20 carbon atoms, and even more preferably 6 to 12 carbon atoms; for example, phenylthio or the like), a heterocyclic thio group (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio or the like), a thiocarbonyl group (for example, a thioketone group, a thioester group or the like), a thioether group (for example, a dialkylthioether group, a diarylthioether group, a thiofuryl group or the like) and the like.

Examples of the atomic group containing a phosphorus atom which coordinates to $M^{X1}$ include a dialkylphosphino group, a diarylphosphino group, a trialkylphosphine group, a triarylphosphine group, a phosphinine group and the like. These groups may be further substituted.

Preferable examples of the atomic group represented by $Q^{X11}$ to $Q^{X16}$ include an aromatic hydrocarbon ring group which coordinates to $M^{X1}$ through a carbon atom, an aromatic heterocyclic group which coordinates to $M^{X1}$ through a carbon atom, a nitrogen-containing aromatic heterocyclic group which coordinates to $M^{X1}$ through a nitrogen atom, an alkyloxy group, an aryloxy group, an alkylthio group, an arylthio group, and a dialkylphosphino group, more preferably an aromatic hydrocarbon ring group which coordinates to $M^{X1}$ through a carbon atom, an aromatic heterocyclic group which coordinates to $M^{X1}$ through a carbon atom, and a nitrogen-containing aromatic heterocyclic group which coordinates to $M^{X1}$ through a nitrogen atom.

Bonds between $M^{X1}$ and $Q^{X11}$ to $Q^{X16}$ are each independently a coordination bond, an ionic bond or a covalent bond.

In formula (II-C), $L^{X11}$ to $L^{X14}$ each represent a single bond, a double bond or a linking group. The linking group is not particularly limited, but preferable is a linking group comprising an atom selected from among carbon, nitrogen, oxygen, sulfur and silicon. Examples of the linking group are shown below, but the invention is not limited to these examples.

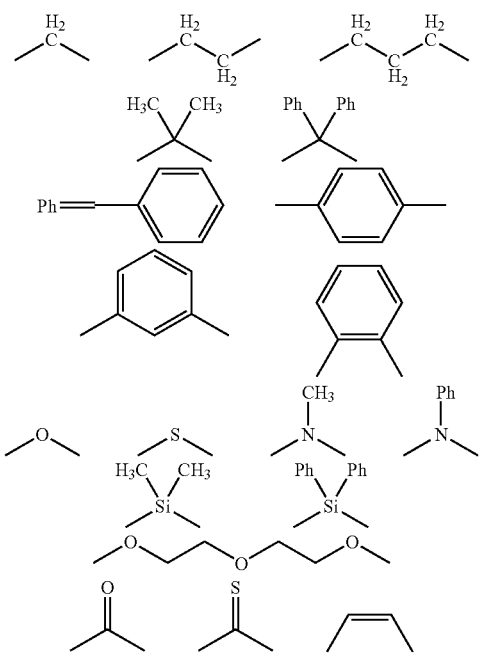

These linking groups may be further substituted by a substituent. As the substituent, the substituents described as substituents represented by $R^{21}$ to $R^{24}$ in the above formula (2) can be applied, and preferable range of the substituent is similar. $L^{X11}$ to $L^{X14}$ each preferably represent a single bond, a dimethylmethylene group or a dimethylsilylene group.

Among the compounds represented by formula (II-C), a compound represented by the following formula (X2) is preferred, and more preferred is a compound represented by formula (X3) described below.

In the first place, the compound represented by formula (X2) is to be described.

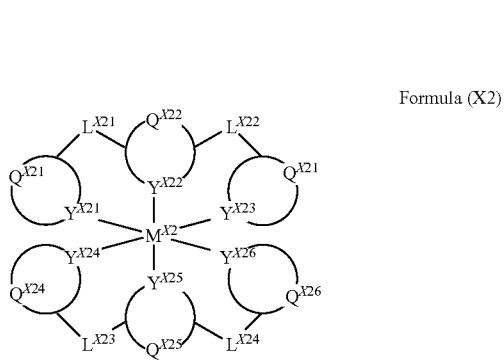

Formula (X2)

In formula (X2), $M^{X2}$ represents a metal ion. $Y^{X21}$ to $Y^{X26}$ each represent an atom which coordinates to $M^{X2}$. $Q^{X21}$ to $Q^{X26}$ represent an atomic group forming an aromatic ring or an aromatic heterocycle with $Y^{X21}$ to $Y^{X26}$, respectively. $L^{X21}$ to $L^{X24}$ each represent a single bond, a double bond or a linking group. The bond between $M^{X2}$ and $Y^{X21}$ to $Y^{X26}$ are each independently a coordination bond, an ionic bond or a covalent bond.

The compound represented by formula (X2) is to be described in detail.

In formula (X2), $M^{X2}$ has the same meaning as $M^{X1}$ in the above formula (II-C) and a similar preferable range. $Y^{X21}$ to $Y^{X26}$ each represent an atom which coordinates to $M^{X2}$. Bonds between $M^{X2}$ and $Y^{X21}$ to $Y^{X26}$ are each independently a coordination bond, an ionic bond or a covalent bond. Examples of $Y^{X21}$ to $Y^{X26}$ include a carbon atom, a nitrogen atom, an oxygen atom, a sulfur atom, a phosphorus atom and a silicon atom, and preferably a carbon atom and a nitrogen atom. $Q^{X21}$ to $Q^{X26}$ represent an atomic group forming an aromatic hydrocarbon ring or an aromatic heterocycle containing $Y^{X21}$ to $Y^{X26}$, respectively. Examples of the aromatic hydrocarbon ring or the aromatic heterocycle include a benzene ring, a pyridine ring, a pyrazine ring, a pyrimidine ring, a pyridazine ring, a triazine ring, a pyrrole ring, a pyrazole ring, an imidazole ring, a triazole ring, an oxazole ring, a thiazole ring, an oxadiazole ring, a thiadiazole ring, a thiophene ring, and a furan ring, more preferably a benzene ring, a pyridine ring, a pyrazine ring, a pyrimidine ring, a pyrazole ring, an imidazole ring and a triazole ring, and even more preferably a benzene ring, a pyridine ring, a pyrazine ring, a pyrazole ring and a triazole ring. Among them, a benzene ring and a pyridine ring are particularly preferable. These may have further a condensed ring or a substituent.

$L^{X21}$ to $L^{X24}$ each have the same meaning as $L^{X11}$ to $L^{X14}$ in the above formula (II-C) and a similar preferable range.

The compound represented by the above formula (II-C) is more preferably a compound represented by the following formula (X3).

Formula (X3) is to be described.

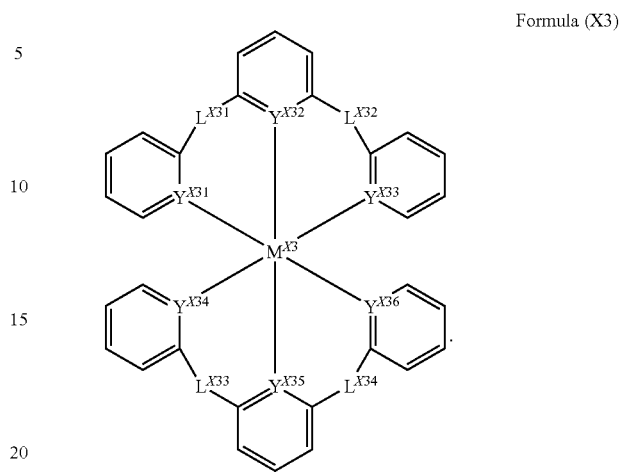

Formula (X3)

In formula (X3), $M^{X3}$ represents a metal ion. $Y^{X31}$ to $Y^{X36}$ each represent a carbon atom, a nitrogen atom or a phosphorus atom. $L^{X31}$ to $L^{X34}$ each represent a single bond, a double bond or a linking group. Bonds between $M^{X3}$ and $Y^{X31}$ to $Y^{X36}$ are each independently a coordination bond, an ionic bond or a covalent bond.

$M^{X3}$ has the same meaning as $M^{X1}$ in the above formula (II-C) and a similar preferable range. $Y^{X31}$ to $Y^{X36}$ represent an atom which coordinates to $M^{X3}$. Examples of $Y^{X31}$ to $Y^{X36}$ include a carbon atom, a nitrogen atom and a phosphorus atom, and preferably a carbon atom and a nitrogen atom. $L^{X31}$ to $L^{X34}$ each have the same meaning as $L^{X11}$ to $L^{X14}$ in the above formula (II-C) and a similar preferable range.

Specific examples of the compound represented by the above formula (I) or formula (II) include Compound Nos. (1) to (247) described in JP-A No. 20007-103493, but the present invention is not limited to these compounds.

Among examples of the compound described above, however, such compounds, in which the compounds having a ligand selected from a tetradentate ligand containing dipyridyl or phenanthroline as the partial structure, a Schiff base type tetradentate ligand, a phenylbipyridyl tridentate ligand, a diphenylpyridine tridentate ligand and a terpyridine tridentate ligand are excluded, are more preferable.

(Synthesis of Metal Complexes According to the Present Invention)

The metal complexes [compounds represented by the above formula (I), (1), (1-A), (2), (3), (3-B), (3-C), (4), (4-A), (5), (II), (II-A), (II-B), (II-C), (X2) or (X3)] according to the present invention can be synthesized according to various manners.

For example, the compounds can be obtained by reacting a ligand or its dissociated product with a metal compound, in the presence or absence of a solvent (e.g., a halogen solvent, an alcohol solvent, an ether solvent, an ester solvent, a ketone solvent, a nitrile solvent, an amide solvent, a sulfone solvent, a sulfoxide solvent, water or the like), in the presence or absence of a base (various inorganic or organic base, for example, sodium methoxide, potassium t-butoxy, triethylamine, potassium carbonate or the like), at room temperature or below, or by heating (in addition to an ordinary heating, a method of heating by means of microwave is also effective).

A reaction time that is applied in synthesizing the metal complex according to the present invention varies depending on activity of raw materials, and there is no particular limitation as to the reaction time, but the reaction time is preferably in a range of from 1 minute to 5 days, more preferably in a range of from 5 minutes to 3 days, and even more preferably in a range of from 10 minutes to 1 day.

A reaction temperature that is applied in synthesizing the metal complex according to the present invention varies depending on reaction activity, and there is no particular limitation as to the reaction temperature, but the reaction temperature is preferably in a range of from 0° C. to 300° C., more preferably in a range of from 5° C. to 250° C., and even more preferably in a range of from 10° C. to 200° C.

The metal complex in the present invention (e.g., compounds represented by the above formula (I), (1), (1-A), (2), (3), (3-B), (3-C), (4), (4-A), (5), (II), (II-A), (II-B), (II-C), (X2) or (X3)) can be prepared by selecting properly a ligand comprising a partial structure of the intended complex.

For example, the compound represented by formula (1-A) can be synthesized by adding 6,6'-bis(2-hydroxyphenyl)-2,2'-bipyridyl ligand or a derivative thereof (for example, 2,9-bis(2-hydroxyphenyl)-1,10-phenanthroline ligand, 2,9-bis(2-hydroxylphenyl)-4,7-diphenyl-1,10-phenanthroline ligand, 6,6'-bis(2-hydroxy-5-tert-butylphenyl)-2,2'-bipyridyl ligand or the like) preferably in an amount of 0.1 equivalents to 10 equivalents, more preferably 0.3 equivalents to 6 equivalents and even more preferably 0.5 equivalents to 4 equivalents with respect to a metal compound used.

In the synthetic method of the compound represented by formula (I-A), the reaction solvent, the reaction time and the reaction temperature are each similar to that in the above-described synthetic method for the metal complex according to the invention.

The derivatives of 6,6'-bis(2-hydroxyphenyl)-2,2'-bipyridyl ligand can be synthesized according to various conventional methods.

For example, they can be synthesized by subjecting a 2,2-bipyridyl derivative (for example, 1,10-phenanthroline or the like) and an anisole derivative (for example, 4-fluoroanisole or the like) to a reaction according to the method described in Journal of Organic Chemistry, 741, 11 (1946). Alternatively, they can be synthesized by subjecting a halogenated 2,2'-bipyridyl derivative (for example, 2,9-dibromo-1,10-phenanthroline or the like) and a 2-methoxyphenyl boronic acid derivative (for example, 2-methoxy-5-fluorophenyl boronic acid or the like) as starting materials, to the Suzuki coupling reaction, followed by elimination of the methyl group as a protective group (according to the method described in Journal of Organic Chemistry, 741, 11 (1946), or the method of heating in the presence of pyridine hydrochloride or the like). Alternatively, they can be synthesized by subjecting a 2,2'-bipyridyl boronic acid derivative (for example, 6,6'-bis(4,4,5,5-tetramethyl-1,3,2-dioxaboronyl)-2,2'-bipyridyl or the like) and a halogenated anisole derivative (for example, 2-bromoanisole or the like) as starting materials, to the Suzuki coupling reaction, followed by elimination of the methyl group as a protective group (according to the method described in Journal of Organic Chemistry, 741, 11 (1946), the method of heating in the presence of pyridine hydrochloride or the like).

The compound represented by the following formula (III) is to be described.

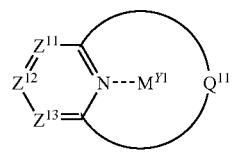

Formula (III)

In formula (III), $Q^{11}$ represents an atomic group forming a nitrogen-containing heterocycle. $Z^{11}$, $Z^{12}$ and $Z^{13}$ each represent a substituted or unsubstituted carbon atom, or a nitrogen atom. $M^{Y1}$ represents a metal ion which may have a ligand further.

In formula (III), $Q^{11}$ represents an atomic group forming a nitrogen-containing heterocycle containing two carbon atoms bonded to $Q^{11}$ and a nitrogen atom bonded directly to the carbon atom. A number of the member in the nitrogen-containing heterocycle formed by $Q^{11}$ is not particularly limited, but is preferably from 12 to 20, more preferably from 14 to 16, and even more preferably 16.

$Z^{11}$, $Z^{12}$ and $Z^{13}$ each independently represent a substituted or unsubstituted carbon atom or a nitrogen atom. With respect to the combination of $Z^{11}$, $Z^{12}$ and $Z^{13}$, at least one from among $Z^{11}$, $Z^{12}$ and $Z^{13}$ is preferably a nitrogen atom.

Examples of the substituent on the carbon atom include an alkyl group (having preferably 1 to 30 carbon atoms, more preferably 1 to 20 carbon atoms, and even more preferably 1 to 10 carbon atoms; for example, methyl, ethyl, iso-propyl, tert-butyl, n-octyl, n-decyl, n-hexadecyl, cyclopropyl, cyclopentyl, cyclohexyl or the like), an alkenyl group (having preferably 2 to 30 carbon atoms, more preferably 2 to 20 carbon atoms, and even more preferably 2 to 10 carbon atoms; for example, vinyl, allyl, 2-butenyl, 3-pentenyl or the like), an alkynyl group (having preferably 2 to 30 carbon atoms, more preferably 2 to 20 carbon atoms, and even more preferably 2 to 10 carbon atoms; for example, propargyl, 3-pentynyl or the like), an aryl group (having preferably 6 to 30 carbon atoms, more preferably 6 to 20 carbon atoms, and even more preferably 6 to 12 carbon atoms; for example, phenyl, p-methylphenyl, naphthyl, anthranyl, or the like), an amino group (having preferably 0 to 30 carbon atoms, more preferably 0 to 20 carbon atoms, and even more preferably 0 to 10 carbon atoms; for example, amino, methylamino, dimethylamino, diethylamino, dibenzylamino, diphenylamino, ditolylamino or the like), an alkoxy group (having preferably 1 to 30 carbon atoms, more preferably 1 to 20 carbon atoms, and even more preferably 1 to 10 carbon atoms; for example, methoxy, ethoxy, butoxy, 2-ethylhexyloxy or the like), an aryloxy group (having preferably 6 to 30 carbon atoms, more preferably 6 to 20 carbon atoms, and even more preferably 6 to 12 carbon atoms; for example, phenyloxy, 1-naphthyloxy, 2-naphthyloxy or the like), a heterocyclic oxy group (having preferably 1 to 30 carbon atoms, more preferably 1 to 20 carbon atoms, and even more preferably 1 to 12 carbon atoms; for example, pridyloxy, pyrazinyloxy, pyrimidyloxy, quinolyloxy or the like), an acyl group (having preferably 1 to 30 carbon atoms, more preferably 1 to 20 carbon atoms, and even more preferably 1 to 12 carbon atoms; for example, acetyl, benzoyl, formyl, pivaloyl or the like), an alkoxycarbonyl group (having preferably 2 to 30 carbon atoms, more preferably 2 to 20 carbon atoms, and even more preferably 2 to 12 carbon atoms; for example, methoxycarbonyl, ethoxycarbonyl or the like), an aryloxycarbonyl group (having preferably 7 to 30 carbon atoms, more preferably 7 to 20 carbon atoms, and even more preferably 7 to 12 carbon atoms; for example, phenyloxycarbonyl or the like), an acyloxy group (having preferably 2 to 30 carbon atoms, more preferably 2 to 20 carbon atoms, and even more preferably 2 to 10 carbon atoms; for example, acetoxy, benzoyloxy or the like), an acylamino group (having preferably 2 to 30 carbon atoms, more preferably 2 to 20 carbon atoms, and even more preferably 2 to 10 carbon atoms; for example, acetylamino, benzoylamino or the like), an alkoxycarbonylamino group (having preferably 2 to 30 carbon atoms, more preferably 2 to 20 carbon atoms, and even more preferably 2 to 12 carbon atoms; for example, methoxycarbonylamino or the like), an aryloxycarbonylamino group (having preferably 7 to 30 carbon atoms, more preferably 7 to 20 carbon atoms, and even more preferably 7 to 12 carbon atoms; for example, phenyloxycarbonylamino or the like), a sulfonylamino group (having preferably from 1 to 30 carbon atoms, more preferably from 1 to 20 carbon atoms, and even more preferably from 1 to 12 carbon atoms; for example, methanesulfonylamino, benzenesulfonylamino or the like), a sulfamoyl group (having preferably 0 to 30 carbon atoms, more preferably 0 to 20 carbon atoms, and even more preferably 0 to 12 carbon atoms; for example, sulfamoyl, methylsulfamoyl, dimethylsulfamoyl, phenylsulfamoyl or the like), a carbamoyl group (having preferably 1 to 30 carbon atoms, more preferably 1 to 20 carbon atoms, and even more preferably 1 to 12 carbon atoms; for example, carbamoyl, methylcarbamoyl, diethylcarbamoyl, phenylcarbamoyl or the like), an alkylthio group (having preferably 1 to 30 carbon atoms, more preferably 1 to 20 carbon atoms, and even more preferably 1 to 12 carbon atoms; for example, methylthio, ethylthio or the like), an arylthio group (having preferably 6 to 30 carbon atoms, more preferably 6 to 20 carbon atoms, and even more preferably 6 to 12 carbon atoms; for example, phenylthio or the like), a heterocyclic thio group (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio or the like), a sulfonyl group (having preferably 1 to 30 carbon atoms, more preferably 1 to 20 carbon atoms, and even more preferably 1 to 12 carbon atoms; for example, mesyl, tosyl or the like), a sulfinyl group (having preferably 1 to 30 carbon atoms, more preferably 1 to 20 carbon atoms, and even more preferably 1 to 12 carbon atoms; for example, methanesulfinyl, benzenesulfinyl or the like), a ureido group (having preferably 1 to 30 carbon atoms, more preferably 1 to 20 carbon atoms, and even more preferably 1 to 12 carbon atoms; for example, ureido, methylureido, phenylureido or the like), a phosphoric amido group (having preferably 1 to 30 carbon atoms, more preferably 1 to 20 carbon atoms, and even more preferably 1 to 12 carbon atoms; for example, diethylphosphoric amido, phenylphosphoric amido or the like), a hydroxy group, a mercapto group, a halogen atom (for example, a fluorine atom, a chlorine atom, a bromine atom, or an iodine atom), a cyano group, a sulfo group, a carboxy group, a nitro group, a hydroxamic acid group, a sulfino group, a hydrazino group, an imino group, a heterocyclic group (having preferably 1 to 30 carbon atoms and more preferably 1 to 12 carbon atoms; examples of the heteroatom including a nitrogen atom, an oxygen atom and a sulfur atom; specific examples of the heterocyclic group including an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, an azepinyl group or the like), a silyl group (having preferably 3 to 40 carbon atoms, more preferably 3 to 30 carbon atoms, and even more preferably 3 to 24 carbon atoms; for example, trimethylsilyl, triphenylsilyl or the like), and a silyloxy group (having preferably 3 to 40 carbon atoms, more preferably 3 to 30 carbon atoms, and even more preferably 3 to 24 carbon atoms; for example, trimethylsilyloxy, triphenylsilyloxy or the like). These substituents may be further substituted by a substituent.

Among the substituents described above, examples of the substituent on the carbon atom include preferably an alkyl group, an aryl group, a heterocyclic group and a halogen atom, more preferably an aryl group and a halogen atom, and even more preferably a phenyl group and a fluorine atom.

Examples of the substituent on the nitrogen atom include the same substituents as explained above for the substituent on the carbon atom, and the substituent on the nitrogen atom has a similar preferable range to the substituent on the carbon atom described above.

In formula (III), $M^{Y1}$ represents a metal ion which may have a ligand further. Preferably, $M^{Y1}$ is a metal ion having no additional ligand.

The metal ion represented by $M^{Y1}$ is not particularly limited, but a divalent or a trivalent metal ion is preferred. Examples of the divalent and trivalent metal ions include preferably a cobalt ion, a magnesium ion, a zinc ion, a palladium ion, a nickel ion, a copper ion, a platinum ion, a lead ion, an aluminum ion, an iridium ion, and a europium ion, more preferably a cobalt ion, a magnesium ion, a zinc ion, a palladium ion, a nickel ion, a copper ion, a platinum ion, and a lead ion, and even more preferably a copper ion and a platinum ion. Among them, a platinum ion is particularly preferred. $M^{Y1}$ may be bonded or not bonded to an atom included in $Q^{11}$, but is preferably bonded to an atom included in $Q^{11}$.

The ligand which can be coordinated to $M^{Y1}$ further is not particularly limited, but a monodentate or bidentate ligand is preferred, and more preferred is a bidentate ligand. The atom which coordinates is not particularly limited, but examples thereof include preferably an oxygen atom, a sulfur atom, a nitrogen atom, a carbon atom and a phosphorus atom, more preferably an oxygen atom, a nitrogen atom and a carbon atom, and even more preferably an oxygen atom and a nitrogen atom.

Preferable examples of the compound represented by the above formula (III) include a compound represented by formula (a) to (j) and a tautomer thereof described below.

Examples of the compound represented by formula (III) include more preferably a compound represented by formula (a) or (b) and a tautomer thereof, and even more preferably a compound represented by formula (b) and a tautomer thereof.

Furthermore, more preferable examples of the compound represented by formula (III) also include a compound represented by formula (c) or (g).

Examples of the compound represented by formula (c) preferably include a compound represented by formula (d) and a tautomer thereof, a compound represented by formula (e) and a tautomer thereof and a compound represented by formula (f) and a tautomer thereof, more preferably a compound represented by formula (d) and a tautomer thereof, and a compound represented by formula (e) and a tautomer thereof, and even more preferably a compound represented by formula (d) and a tautomer thereof.

Examples of the compound represented by formula (g) preferably include a compound represented by formula (h) and a tautomer thereof, a compound represented by formula (i) and a tautomer thereof, and a compound represented by formula (j) and a tautomer thereof, more preferably a compound represented by formula (h) and a tautomer thereof, and a compound represented by formula (i) and a tautomer thereof, and even more preferably a compound represented by formula (h) and a tautomer thereof.

The compound represented by formula (a) to (j) is to be described below in detail.

Formula (a)

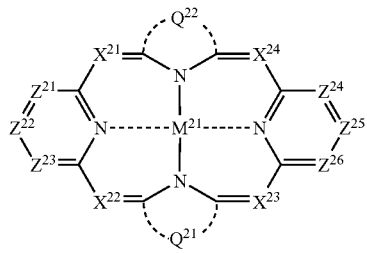

The compound represented by formula (a) is to be described.

In formula (a), $Z^{21}$, $Z^{22}$, $Z^{23}$, $Z^{24}$, $Z^{25}$, $Z^{26}$ and $M^{21}$ each have the same meaning as $Z^{11}$, $Z^{12}$, $Z^{13}$, $Z^{11}$, $Z^{12}$, $Z^{13}$ and $M^{Y1}$ in the above formula (III) respectively and a similar preferable range.

$Q^{21}$ and $Q^{22}$ each represent a group forming a nitrogen-containing heterocycle. The nitrogen-containing heterocycle formed by $Q^{21}$ or $Q^{22}$ is not particularly limited, but examples thereof include preferably a pyrrole ring, an imidazole ring, a triazole ring, a condensed ring body thereof (for example, benzopyrrole) and a tautomer thereof (for example, in formula (b) described later, a nitrogen-containing 5-membered ring wherein $R^{43}$, $R^{44}$, $R^{45}$ and $R^{46}$ are substituted is defined as the tautomer of pyrrole), and more preferably a pyrrole ring and a condensed ring body containing a pyrrole ring (e.g., benzopyrrole).

$X^{21}$, $X^{22}$, $X^{23}$ and $X^{24}$ each independently represent a substituted or unsubstituted carbon atom, or a nitrogen atom, more preferably an unsubstituted carbon atom or a nitrogen atom, and even more preferably a nitrogen atom.

The compound represented by the following formula (b) is to be described.

Formula (b)

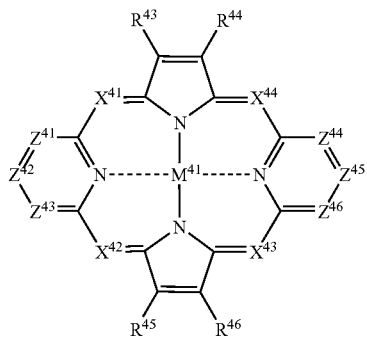

In formula (b), $Z^{41}$, $Z^{42}$, $Z^{43}$, $Z^{44}$, $Z^{45}$, $Z^{46}$, $X^{41}$, $X^{42}$, $X^{43}$, $X^{44}$ and $M^{41}$ each have the same meaning as $Z^{21}$, $Z^{22}$, $Z^{23}$, $Z^{24}$, $Z^{25}$, $Z^{26}$, $X^{21}$, $X^{22}$, $X^{23}$, $X^{24}$ and $M^{21}$ in the above formula (a) respectively and a similar preferable range.

$R^{43}$, $R^{44}$, $R^{45}$ and $R^{46}$ each independently represent a hydrogen atom, an alkyl group or an aryl group explained as the substituent for $Z^{11}$ or $Z^{12}$ in the above formula (III), or a group forming a ring structure formed by combining $R^{43}$ and $R^{44}$, or $R^{45}$ and $R^{46}$ (for example, a benzo condensed ring, a pyridine condensed ring or the like), more preferably an alkyl group, an aryl group, or a group forming a ring structure formed by combining $R^{43}$ and $R^{44}$, or $R^{45}$ and $R^{46}$ (for example, a benzo condensed ring, a pyridine condensed ring or the like), and even more preferably a group forming a ring structure formed by $R^{43}$ and $R^{44}$, or $R^{45}$ and $R^{46}$ (for example, a benzo condensed ring, a pyridine condensed ring or the like).

$R^{43}$, $R^{44}$, $R^{45}$ and $R^{46}$ each independently represent a hydrogen atom or a substituent. Examples of the substituent include a group explained as the substituent on the carbon atom for $Z^{11}$ or $Z^{12}$ in the above formula (III).

The compound represented by the following formula (c) is to be described.

Formula (c)

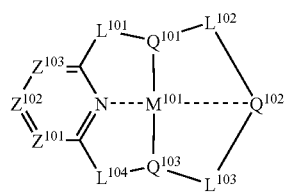

In formula (c), $Z^{101}$, $Z^{102}$ and $Z^{103}$ each independently represent a substituted or unsubstituted carbon atom or a nitrogen atom. Preferably, at least one from among $Z^{101}$, $Z^{102}$ and $Z^{103}$ is a nitrogen atom.

$L^{101}$, $L^{102}$, $L^{103}$ and $L^{104}$ each independently represent a single bond or a linking group. The linking group is not particularly limited, but examples thereof include a carbonyl linking group, an alkylene group, an alkenylene group, an arylene group, a heteroarylene group, a nitrogen-containing heterocyclic linking group, an oxygen atom linking group, an amino linking group, an imino linking group, a carbonyl linking group, a linking group formed by a combination thereof and the like.

$L^{101}$, $L^{102}$, $L^{103}$ and $L^{104}$ each independently represent a single bond, an alkylene group, an alkenylene group, an amino linking group, or an imino linking group, more preferably a single bond, an alkylene group, an alkenylene group, or an imino linking group, and even more preferably a single bond or an alkylene group.

$Q^{101}$ and $Q^{103}$ each independently represent a group which coordinates to $M^{101}$ through a carbon atom, a group which coordinates to $M^{101}$ through a nitrogen atom, a group which coordinates to $M^{101}$ through a phosphorus atom, a group which coordinates to $M^{101}$ through an oxygen atom or a group which coordinates to $M^{101}$ through a sulfur atom.

Examples of the group which coordinates to $M^{101}$ through a carbon atom include an aryl group which coordinates through a carbon atom, a 5-membered heteroaryl group which coordinates through a carbon atom, and a 6-membered heteroaryl group which coordinates through a carbon atom, more preferably an aryl group which coordinates through a carbon atom, a nitrogen-containing 5-membered heteroaryl group which coordinates through a carbon atom and a nitrogen-containing 6-membered heteroaryl group which coordinates through a carbon atom, and even more preferably an aryl group which coordinates through a carbon atom.

Examples of the group which coordinates to $M^{101}$ through a nitrogen atom include a nitrogen-containing 5-membered heteroaryl group which coordinates through a nitrogen atom and a nitrogen-containing 6-membered heteroaryl group which coordinates through a nitrogen atom, and more preferably a nitrogen-containing 6-membered heteroaryl group which coordinates through a nitrogen atom.

Examples of the group which coordinates to $M^{101}$ through a phosphorus atom include an alkylphosphine group which coordinates through a phosphorus atom, an arylphosphine group which coordinates through a phosphorus atom, an alkoxyphosphine group which coordinates through a phosphorus atom, an aryloxyphosphine group which coordinates through a phosphorus atom, a heteroaryloxyphosphine group which coordinates through a phosphorus atom, a phosphinine group which coordinates through a phosphorus atom, and a phosphole group which coordinates to a phosphorus atom, and more preferably an alkylphosphine group which coordinates through a phosphorus atom, and an arylphosphine group which coordinates through a phosphorus atom.

Examples of the group which coordinates to $M^{101}$ through an oxygen atom include preferably an oxy group and a carbonyl group which coordinates through an oxygen atom, and more preferably an oxy group.

Examples of the group which coordinates to $M^{101}$ through a sulfur atom include preferably a sulfide group, a thiophene group, and a thiazole group, and more preferably a thiophene group.

Examples of $Q^{101}$ and $Q^{103}$ preferably include a group which coordinates to $M^{101}$ through a carbon atom, a group which coordinates to $M^{101}$ through a nitrogen atom, and a group which coordinates to $M^{101}$ through an oxygen atom, more preferably a group which coordinates to $M^{101}$ through a carbon atom and a group which coordinates to $M^{101}$ through a nitrogen atom, and even more preferably a group which coordinates to $M^{101}$ through a carbon atom.

$Q^{102}$ represents a group which coordinates to $M^{101}$ through a nitrogen atom, a group which coordinates to $M^{101}$ through a phosphorus atom, a group which coordinates to $M^{101}$ through an oxygen atom or a group which coordinates to $M^{101}$ through a sulfur atom, and preferably a group which coordinates to $M^{101}$ through a nitrogen atom.

$M^{101}$ has the same meaning as $M^{11}$ in the above formula (I) and a similar preferable range.

The compound represented by formula (d) is to be described.

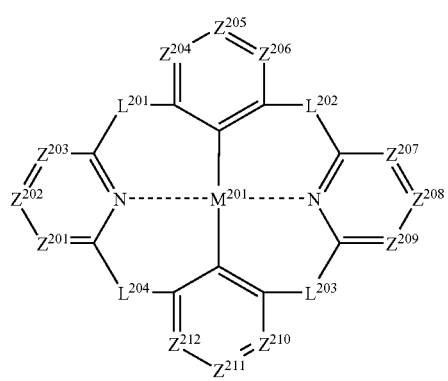

Formula (d)

In formula (d) $Z^{201}$, $Z^{202}$, $Z^{203}$, $Z^{207}$, $Z^{208}$, $Z^{209}$, $L^{201}$, $L^{202}$, $L^{203}$, $L^{204}$ and $M^{201}$ each have the same meaning as $Z^{101}$, $Z^{102}$, $Z^{103}$, $Z^{101}$, $Z^{102}$, $Z^{103}$, $L^{101}$, $L^{102}$, $L^{103}$, $L^{104}$ and $M^{101}$ in the above formula (c) respectively, and a similar preferable range. $Z^{204}$, $Z^{205}$, $Z^{206}$, $Z^{210}$, $Z^{211}$ and $Z^{212}$ each represent a substituted or unsubstituted carbon atom, or a nitrogen atom, and more preferably a substituted or unsubstituted carbon atom.

The compound represented by formula (e) is to be described.

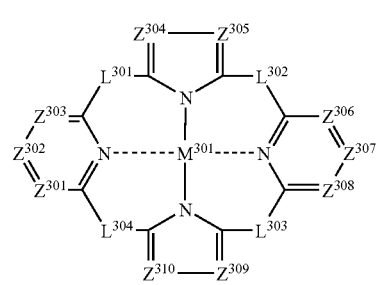

Formula (e)

In formula (e), $Z^{301}$, $Z^{302}$, $Z^{303}$, $Z^{304}$, $Z^{305}$, $Z^{306}$, $Z^{307}$, $Z^{308}$, $Z^{309}$, $Z^{310}$, $L^{301}$, $L^{302}$, $L^{303}$, $L^{304}$ and $M^{301}$ each have the same meaning as $Z^{201}$, $Z^{202}$, $Z^{203}$, $Z^{204}$ $Z^{206}$, $Z^{207}$, $Z^{208}$, $Z^{209}$, $Z^{210}$, $Z^{212}$, $L^{101}$, $L^{102}$, $L^{103}$, $L^{104}$ and $M^{101}$ in the above formulae (d) and (c) respectively, and a similar preferable range.

The compound represented by formula (f) is to be described.

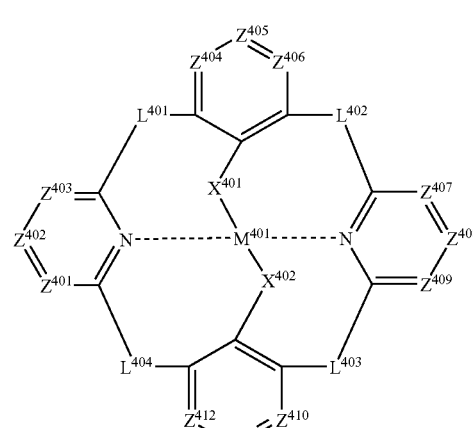

Formula (f)

In formula (f), $Z^{401}$, $Z^{402}$, $Z^{403}$, $Z^{404}$, $Z^{405}$, $Z^{406}$, $Z^{407}$, $Z^{408}$, $Z^{409}$, $Z^{410}$, $Z^{411}$, $Z^{412}$, $L^{401}$, $L^{402}$, $L^{403}$, $L^{404}$ and $M^{401}$ each have the same meaning as $Z^{201}$, $Z^{202}$, $Z^{203}$, $Z^{204}$, $Z^{205}$, $Z^{206}$, $Z^{207}$, $Z^{208}$, $Z^{209}$, $Z^{210}$, $Z^{211}$, $Z^{212}$, $L^{101}$, $L^{103}$, $L^{104}$ and $M^{101}$ in the above formulae (d) and (c) respectively, and a similar preferable range.

$X^{401}$ and $X^{402}$ each independently represent an oxygen atom, a substituted or unsubstituted nitrogen atom, or a sulfur atom, preferably an oxygen atom or a substituted nitrogen atom, and more preferably an oxygen atom.

The compound represented by formula (g) is to be described.

Formula (g)

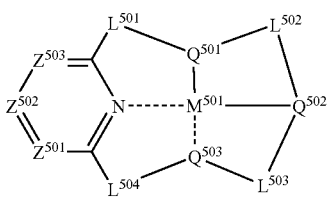

In formula (g), $Z^{501}$, $Z^{502}$, $Z^{503}$, $L^{501}$, $L^{502}$, $L^{503}$, $L^{504}$, $Q^{501}$, $Q^{502}$, $Q^{503}$ and $M^{501}$ each have the same meaning as $Z^{101}$, $Z^{102}$, $Z^{103}$, $L^{101}$, $L^{102}$, $L^{103}$, $L^{104}$, $Q^{101}$, $Q^{103}$, $Q^{102}$ and $M^{101}$ in the above formula (c) respectively, and a similar preferable range.

The compound represented by formula (h) is to be described.

Formula (h)

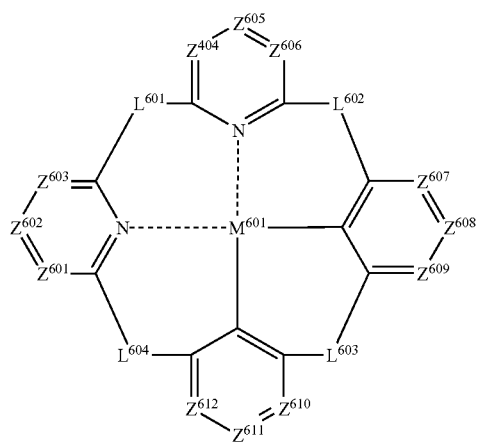

In formula (h), $Z^{601}$, $Z^{602}$, $Z^{603}$, $Z^{604}$, $Z^{605}$, $Z^{606}$, $Z^{607}$, $Z^{608}$, $Z^{609}$, $Z^{610}$, $Z^{611}$, $Z^{612}$, $L^{601}$, $L^{602}$, $L^{603}$, $L^{604}$ and $M^{601}$ each have the same meaning as $Z^{201}$, $Z^{202}$, $Z^{203}$, $Z^{207}$, $Z^{208}$, $Z^{209}$, $Z^{204}$, $Z^{205}$, $Z^{206}$, $Z^{210}$, $Z^{211}$, $Z^{212}$, $L^{101}$, $L^{102}$, $L^{103}$, $L^{104}$ and $M^{101}$ in the above formulae (d) and (c) respectively, and a similar preferable range.

The compound represented by formula (i) is to be described.

Formula (i)

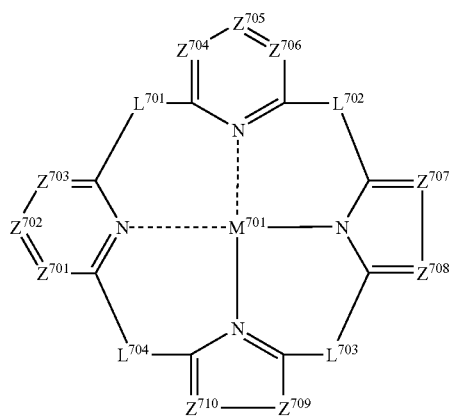

In formula (i), $Z^{701}$, $Z^{702}$, $Z^{703}$, $Z^{704}$, $Z^{705}$, $Z^{706}$, $Z^{707}$, $Z^{708}$, $Z^{709}$, $Z^{710}$, $L^{701}$, $L^{702}$, $L^{703}$, $L^{704}$ and $M^{701}$ each have the same meaning as $Z^{201}$, $Z^{202}$, $Z^{203}$, $Z^{207}$, $Z^{208}$, $Z^{209}$, $Z^{204}$, $Z^{206}$, $Z^{210}$, $Z^{212}$, $L^{101}$, $L^{102}$, $L^{103}$, $L^{104}$ and $M^{101}$ in the above formulae (d) and (c) respectively, and a similar preferable range.

The compound represented by formula (j) is to be described.

Formula (j)

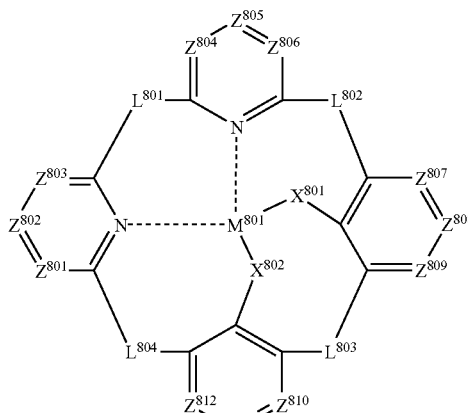

In formula (j), $Z^{801}$, $Z^{802}$, $Z^{803}$, $Z^{804}$, $Z^{805}$, $Z^{806}$, $Z^{807}$, $Z^{808}$, $Z^{809}$, $Z^{810}$, $Z^{811}$, $Z^{812}$, $L^{801}$, $L^{802}$, $L^{803}$, $L^{804}$, $M^{801}$, $X^{801}$ and $X^{802}$ each have the same meaning as $Z^{201}$, $Z^{202}$, $Z^{203}$, $Z^{207}$, $Z^{208}$, $Z^{209}$, $Z^{204}$, $Z^{205}$, $Z^{206}$, $Z^{210}$, $Z^{211}$, $Z^{212}$, $L^{101}$, $L^{102}$, $L^{103}$, $L^{104}$, $M^{101}$, $X^{401}$ and $X^{402}$ in the above formulae (d), (c) and (f) respectively, and a similar preferable range.

Specific examples of the compound represented by formula (III) include Compound Nos. (2) to (8), Compound Nos. (15) to (20), Compound Nos. (27) to (32), Compound Nos. (36) to (38), Compound Nos. (42) to (44), Compound Nos. (50) to (52), and Compound Nos. (57) to (154) described in JP-W No. 2006-526278, but the present invention is not limited to these compounds.

Furthermore, preferred examples of the metal complex in the present invention include a compound represented by formulae (A-1), (B-1), (C-1), (D-1), (E-1) or (F-1) described below.

Formula (A-1) is to be described.

Formula (A-1)

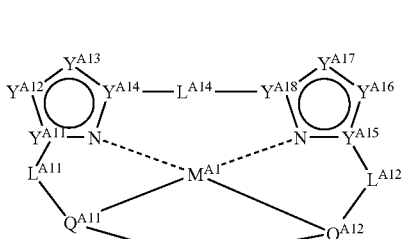

In formula (A-1), $M^{A1}$ represents a metal ion. $Y^{A11}$, $Y^{A14}$, $Y^{A15}$ and $Y^{A18}$ each independently represent a carbon atom or a nitrogen atom. $Y^{A12}$, $Y^{A13}$, $Y^{A16}$ and $Y^{A17}$ each independently represent a substituted or unsubstituted carbon atom, a substituted or unsubstituted nitrogen atom, an oxygen atom, or a sulfur atom. $L^{A11}$, $L^{A12}$, $L^{A13}$ and $L^{A14}$ each represent a linking group. These linking groups may have the same or different structures. $Q^{411}$ and $Q^{412}$ each represent a partial structure having an atom which bonds to $M^{41}$ with a coordination bond, an ionic bond or a covalent bond.

The compound represented by formula (A-1) is to be described in detail.

$M^{41}$ represents a metal ion. The metal ion is not particularly limited, but examples thereof preferably include a divalent metal ion, more preferably $Pt^{2+}$, $Pd^{2+}$, $Cu^{2+}$, $Ni^{2+}$, $Co^{2+}$, $Zn^{2+}$, $Mg^{2+}$ and $Pb^{2+}$, and even more preferably $Pt^{2+}$ and $Cu^{2+}$. Among them, $Pt^{2+}$ is particularly preferable.

$Y^{411}$, $Y^{414}$, $Y^{415}$ and $Y^{418}$ each independently represent a carbon atom or a nitrogen atom. Preferably, $Y^{411}$, $Y^{414}$, $Y^{415}$ and $Y^{418}$ each represent a carbon atom.

$Y^{412}$, $Y^{413}$, $Y^{416}$ and $Y^{417}$ each independently represent a substituted or unsubstituted carbon atom, a substituted or unsubstituted nitrogen atom, an oxygen atom or a sulfur atom. Preferably, $Y^{412}$, $Y^{413}$, $Y^{416}$ and $Y^{417}$ represent a substituted or unsubstituted carbon atom or a substituted or unsubstituted nitrogen atom.

$L^{411}$, $L^{412}$, $L^{413}$ and $L^{414}$ each represent a divalent linking group. Examples of the divalent linking group represented by $L^{411}$, $L^{412}$, $L^{413}$ or $L^{414}$ include preferably a single bond and a linking group comprising carbon, nitrogen, silicon, sulfur, oxygen, germanium or phosphorus, more preferably a single bond, a substituted or unsubstituted carbon atom, a substituted or unsubstituted nitrogen atom, a substituted silicon atom, an oxygen atom, a sulfur atom, a divalent aromatic hydrocarbon ring group and a divalent aromatic heterocyclic group, and even more preferably a single bond, a substituted or unsubstituted carbon atom, a substituted or unsubstituted nitrogen atom, a substituted silicon atom, a divalent aromatic hydrocarbon ring group and a divalent aromatic heterocyclic group. Among them, a single bond and a substituted or unsubstituted methylene group are particularly preferable. Examples of the divalent linking group represented by $L^{411}$, $L^{412}$, $L^{413}$ or $L^{414}$ are described below.

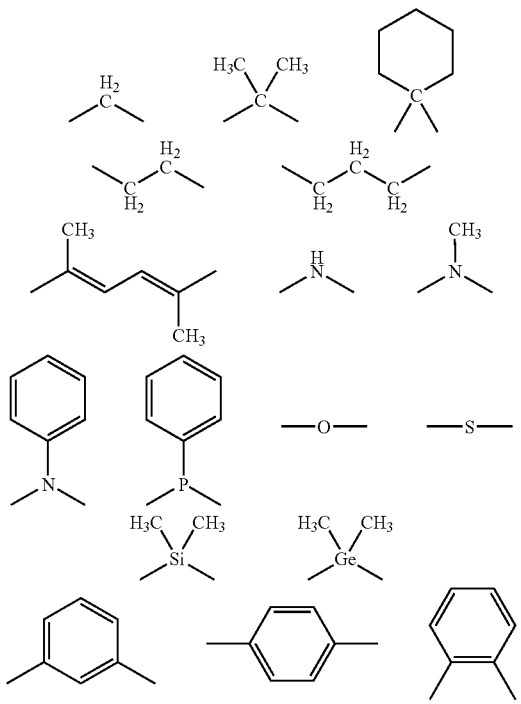

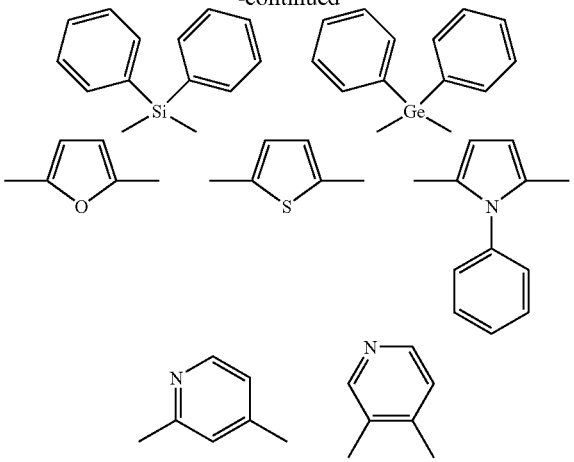

The divalent linking group represented by $L^{411}$, $L^{412}$, $L^{413}$ or $L^{414}$ may be substituted further by a substituent. Examples of the substituent to be introduced thereto include an alkyl group (having preferably 1 to 30 carbon atoms, more preferably 1 to 20 carbon atoms, and even more preferably 1 to 10 carbon atoms; for example, methyl, ethyl, iso-propyl, tert-butyl, n-octyl, n-decyl, n-hexadecyl, cyclopropyl, cyclopentyl, cyclohexyl or the like), an alkenyl group (having preferably 2 to 30 carbon atoms, more preferably 2 to 20 carbon atoms, and even more preferably 2 to 10 carbon atoms; for example, vinyl, allyl, 2-butenyl, 3-pentenyl or the like), an alkynyl group (having preferably 2 to 30 carbon atoms, more preferably 2 to 20 carbon atoms, and even more preferably 2 to 10 carbon atoms; for example, propargyl, 3-pentynyl or the like), an aryl group (having preferably 6 to 30 carbon atoms, more preferably 6 to 20 carbon atoms, and even more preferably 6 to 12 carbon atoms; for example, phenyl, p-methylphenyl, naphthyl, anthranyl or the like), an amino group (having preferably 0 to 30 carbon atoms, more preferably 0 to 20 carbon atoms, and even more preferably 0 to 10 carbon atoms; for example, amino, methylamino, dimethylamino, diethylamino, dibenzylamino, diphenylamino, ditolylamino or the like), an alkoxy group (having preferably 1 to 30 carbon atoms, more preferably 1 to 20 carbon atoms, and even more preferably 1 to 10 carbon atoms; for example, methoxy, ethoxy, butoxy, 2-ethylhexyloxy or the like), an aryloxy group (having preferably 6 to 30 carbon atoms, more preferably 6 to 20 carbon atoms, and even more preferably 6 to 12 carbon atoms; for example, phenyloxy, 1-naphthyloxy, 2-naphthyloxy or the like), a heterocyclic oxy group (having preferably 1 to 30 carbon atoms, more preferably 1 to 20 carbon atoms, and even more preferably 1 to 12 carbon atoms; for example, pyridyloxy, pyrazinyloxy, pyrimidyloxy, quinolyloxy or the like), an acyl group (having preferably 1 to 30 carbon atoms, more preferably 1 to 20 carbon atoms, and even more preferably 1 to 12 carbon atoms; for example, acetyl, benzoyl, formyl, pivaloyl or the like), an alkoxycarbonyl group (having preferably 2 to 30 carbon atoms, more preferably 2 to 20 carbon atoms, and even more preferably 2 to 12 carbon atoms; for example, methoxycarbonyl, ethoxycarbonyl or the like), an aryloxycarbonyl group (having preferably 7 to 30 carbon atoms, more preferably 7 to 20 carbon atoms, and even more preferably 7 to 12 carbon atoms; for example, phenyloxycarbonyl or the like), an acyloxy group (having preferably 2 to 30 carbon atoms, more preferably 2 to 20 carbon atoms, and even more preferably 2 to 10 carbon atoms; for example, acetoxy, benzoyloxy or the like), an acylamino group (having preferably 2 to 30 carbon atoms, more preferably 2 to 20 carbon atoms, and even more preferably 2 to 10 carbon atoms; for example, acetylamino, benzoylamino or the like), an alkoxycarbonylamino group (having preferably 2 to 30 carbon atoms, more preferably 2 to 20 carbon atoms, and even more preferably 2 to 12 carbon atoms; for example, methoxycarbonylamino or the like), an aryloxycarbonylamino group (having preferably 7 to 30 carbon atoms, more preferably 7 to 20 carbon atoms, and even more preferably 7 to 12 carbon atoms; for example, phenyloxycarbonylamino or the like), a sulfonylamino group (having preferably 1 to 30 carbon atoms, more preferably 1 to 20 carbon atoms, and even more preferably 1 to 12 carbon atoms; for example, methanesulfonylamino, benzenesulfonylamino or the like), a sulfamoyl group (having preferably 0 to 30 carbon atoms, more preferably 0 to 20 carbon atoms, and even more preferably 0 to 12 carbon atoms; for example, sulfamoyl, methylsulfamoyl, dimethylsulfamoyl, phenylsulfamoyl or the like), a carbamoyl group (having preferably 1 to 30 carbon atoms, more preferably 1 to 20 carbon atoms, and even more preferably 1 to 12 carbon atoms; for example, carbamoyl, methylcarbamoyl, diethylcarbamoyl, phenylcarbamoyl or the like), an alkylthio group (having preferably 1 to 30 carbon atoms, more preferably 1 to 20 carbon atoms, and even more preferably 1 to 12 carbon atoms; for example, methylthio, ethylthio or the like), an arylthio group (having preferably 6 to 30 carbon atoms, more preferably 6 to 20 carbon atoms, and even more preferably 6 to 12 carbon atoms; for example, phenylthio or the like), a heterocyclic thio group (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio or the like), a sulfonyl group (having preferably 1 to 30 carbon atoms, more preferably 1 to 20 carbon atoms, and even more preferably 1 to 12 carbon atoms; for example, mesyl, tosyl or the like), a sulfinyl group (having preferably 1 to 30 carbon atoms, more preferably 1 to 20 carbon atoms, and even more preferably 1 to 12 carbon atoms; for example, methanesulfinyl, benzenesulfinyl or the like), a ureido group (having preferably 1 to 30 carbon atoms, more preferably 1 to 20 carbon atoms, and even more preferably 1 to 12 carbon atoms; for example, ureido, methylureido, phenylureido or the like), a phosphoric amido group (having preferably 1 to 30 carbon atoms, more preferably 1 to 20 carbon atoms, and even more preferably 1 to 12 carbon atoms; for example, diethylphosphoric amido, phenylphosphoric amido or the like), a hydroxy group, a mercapto group, a halogen atom (for example, a fluorine atom, a chlorine atom, a bromine atom, or an iodine atom), a cyano group, a sulfo group, a carboxy group, a nitro group, a hydroxamic acid group, a sulfino group, a hydrazino group, an imino group, a heterocyclic group (having preferably 1 to 30 carbon atoms, and more preferably 1 to 12 carbon atoms; examples of the heteroatom including a nitrogen atom, an oxygen atom and a sulfur atom; for example, an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, an azepinyl group or the like), a silyl group (having preferably 3 to 40 carbon atoms, more preferably 3 to 30 carbon atoms, and even more preferably 3 to 24 carbon atoms; for example, trimethylsilyl, triphenylsilyl or the like), and a silyloxy group (having preferably 3 to 40 carbon atoms, more preferably 3 to 30 carbon atoms, and even more preferably 3 to 24 carbon atoms; for example, trimethylsilyloxy, triphenylsilyloxy or the like).

These substituents may be further substituted by a substituent. Examples of the substituent preferably include an alkyl group, an aryl group, a heterocyclic group, a halogen atom and a silyl group, more preferably an alkyl group, an aryl group, a heterocyclic group and a halogen atom, and even more preferably an alkyl group, an aryl group, an aromatic heterocyclic group and a fluorine atom.

$Q^{411}$ and $Q^{412}$ each represent a partial structure containing an atom which bonds to $M^{41}$ with a coordination bond, an ionic bond or a covalent bond. $Q^{411}$ and $Q^{412}$ each independently represent preferably a group which bonds to $M^{41}$ through a carbon atom, a group which bonds to $M^{41}$ through a nitrogen atom, a group which bonds to $M^{41}$ through a silicon atom, a group which bonds to $M^{41}$ through a phosphorus atom, a group which bonds to $M^{41}$ through a oxygen atom or a group which bonds to $M^{41}$ through a sulfur atom, more preferably a group which bonds to $M^{41}$ through a carbon atom, a group which bonds to $M^{41}$ through a nitrogen atom, a group which bonds to $M^{41}$ through an oxygen atom or a group which bonds to $M^{41}$ through a sulfur atom, and even more preferably a group which bonds to $M^{41}$ through a carbon atom or a group which bonds to $M^{41}$ through a nitrogen atom. Among them, a group which bonds to $M^{41}$ through a carbon atom is particularly preferable.

Examples of the group which bonds to $M^{41}$ through a carbon atom include preferably an aryl group which bonds through a carbon atom, a 5-membered heteroaryl group which bonds through a carbon atom and a 6-membered heteroaryl group which bonds through a carbon atom, more preferably an aryl group which bonds through a carbon atom, a nitrogen-containing 5-membered heteroaryl group which bonds through a carbon atom and a nitrogen-containing 6-membered heteroaryl group which bonds through a carbon atom, and particularly preferably an aryl group which bonds through a carbon atom.

Examples of the group which bonds to $M^{41}$ through a nitrogen atom include a substituted amino group and a nitrogen-containing 5-membered heteroaryl group which bonds through a nitrogen atom, and particularly preferably include a nitrogen-containing 5-membered heteroaryl group which bonds through a nitrogen atom.

Examples of the group which bonds to $M^{41}$ through a phosphorus atom include preferably a substituted phosphino group. Examples of the group which bonds to $M^{41}$ through a silicon atom include preferably a substituted silyl group. Examples of the group which bonds to $M^{41}$ through an oxygen atom include preferably an oxy group. Examples of the group which bonds to $M^{41}$ through a sulfur atom include preferably a sulfide group.

The compound represented by the above formula (A-1) is preferably a compound represented by formula (A-2), (A-3) or (A-4) described below.

Formula (A-2)

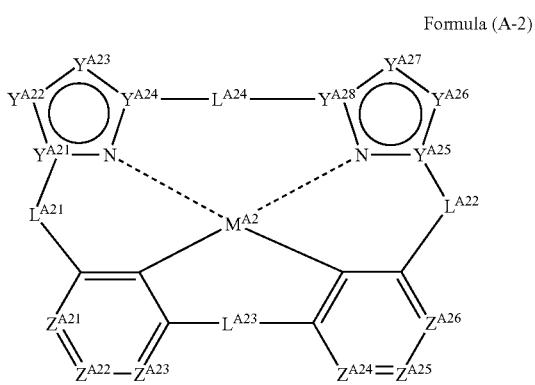

In formula (A-2), $M^{A2}$ represents a metal ion. $Y^{A21}$, $Y^{A24}$, $Y^{A25}$ and $Y^{A28}$ each independently represent a carbon atom or a nitrogen atom. $Y^{A22}$, $Y^{A23}$, $Y^{A26}$ and $Y^{A27}$ each independently represent a substituted or unsubstituted carbon atom, a substituted or unsubstituted nitrogen atom, an oxygen atom, or a sulfur atom. $L^{A21}$, $L^{A22}$, $L^{A23}$ and $L^{A24}$ each represent a linking group. $Z^{A21}$, $Z^{A22}$, $Z^{A23}$, $Z^{A24}$, $Z^{A25}$ and $Z^{A26}$ each independently represent a nitrogen atom, or a substituted or unsubstituted carbon atom.

Formula (A-3)

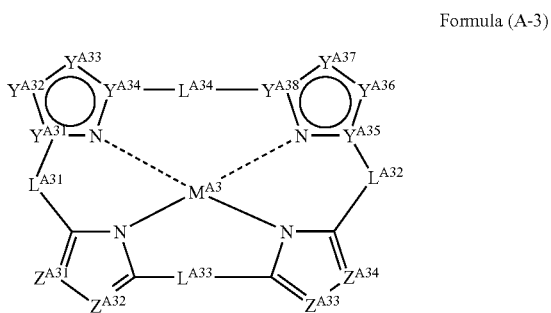

In formula (A-3), $M^{A3}$ represents a metal ion. $Y^{A31}$, $Y^{A34}$, $Y^{A35}$ and $Y^{A38}$ each independently represent a carbon atom or a nitrogen atom. $Y^{A32}$, $Y^{A33}$, $Y^{A36}$ and $Y^{A37}$ each independently represent a substituted or unsubstituted carbon atom, a substituted or unsubstituted nitrogen atom, an oxygen atom or a sulfur atom. $L^{A31}$, $L^{A32}$, $L^{A33}$ and $L^{A34}$ each represent a linking group. $Z^{A31}$, $Z^{A32}$, $Z^{A33}$ and $Z^{A34}$ each independently represent a nitrogen atom, or a substituted or unsubstituted carbon atom.

Formula (A-4)

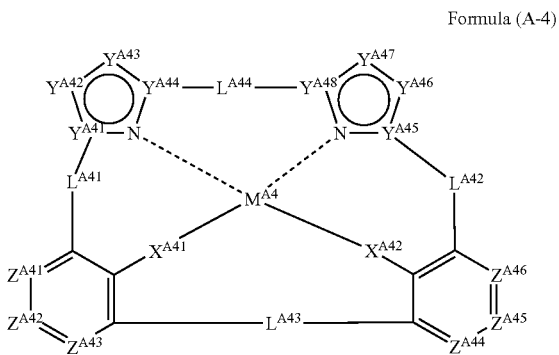

In formula (A-4), $M^{A4}$ represents a metal ion. $Y^{A41}$, $Y^{A44}$, $Y^{A45}$ and $Y^{A48}$ each independently represent a carbon atom or a nitrogen atom. $Y^{A42}$, $Y^{A43}$, $Y^{A46}$ and $Y^{A47}$ each independently represent a substituted or unsubstituted carbon atom, a substituted or unsubstituted nitrogen atom, an oxygen atom, or a sulfur atom. $L^{A41}$, $L^{A42}$, $L^{A43}$ and $L^{A44}$ each represent a linking group. $Z^{A41}$, $Z^{A42}$, $Z^{A43}$, $Z^{A44}$, $Z^{A45}$ and $Z^{A46}$ each independently represent a nitrogen atom or a substituted or unsubstituted carbon atom. $X^{A41}$ and $X^{A42}$ each independently represent an oxygen atom, a sulfur atom, or a substituted or unsubstituted nitrogen atom.

The compound represented by formula (A-2) is to be described in detail. $M^{A2}$, $Y^{A21}$, $Y^{A24}$, $Y^{A25}$, $Y^{A28}$, $Y^{A22}$, $Y^{A23}$, $Y^{A26}$, $Y^{A27}$, $L^{A21}$, $L^{A22}$, $L^{A23}$, and $L^{A24}$ each have the same meaning as $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$ in formula (A-1) respectively, and a similar preferable range.

$Z^{A21}$, $Z^{A22}$, $Z^{A23}$, $Z^{A24}$, $Z^{A25}$ and $Z^{A26}$ each independently represent a nitrogen atom, or a substituted or unsubstituted carbon atom. Preferably, $Z^{A21}$, $Z^{A22}$, $Z^{A23}$, $Z^{A24}$, $Z^{A25}$ and $Z^{A26}$ each independently represent a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

The compound represented by formula (A-3) is to be described in detail. $M^{A3}$, $Y^{A31}$, $Y^{A34}$, $Y^{A35}$, $Y^{A38}$, $Y^{A32}$, $Y^{A33}$, $Y^{A36}$, $Y^{A37}$, $L^{A31}$, $L^{A32}$, $L^{A33}$ and $L^{A34}$ each have the same meaning as $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$ in the above formula (A-1) respectively, and a similar preferable range.

$Z^{A31}$, $Z^{A32}$, $Z^{A33}$ and $Z^{A34}$ each independently represent a nitrogen atom, or a substituted or unsubstituted carbon atom. $Z^{A31}$, $Z^{A32}$, $Z^{A33}$ and $Z^{A34}$ are each preferably a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

The compound represented by formula (A-4) is to be described in detail. $M^{A4}$, $Y^{A41}$, $Y^{A44}$, $Y^{A45}$, $Y^{A48}$, $Y^{A42}$, $Y^{A43}$, $Y^{A46}$, $Y^{A47}$, $L^{A41}$, $L^{A42}$, $L^{A43}$ and $L^{A44}$ each have the same meaning as $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$ in the above formula (A-1) respectively, and a similar preferable range.

$Z^{A41}$, $Z^{A42}$, $Z^{A43}$, $Z^{A44}$, $Z^{A45}$ and $Z^{A46}$ each independently represent a nitrogen atom, or a substituted or unsubstituted carbon atom. Preferably, $Z^{A41}$, $Z^{A42}$, $Z^{A43}$, $Z^{A44}$, $Z^{A45}$ and $Z^{A46}$ are each independently a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

$X^{A41}$ and $X^{A42}$ each independently represent an oxygen atom, a sulfur atom, or a substituted or unsubstituted nitrogen atom. Preferably, $X^{A41}$ and $X^{A42}$ each independently represent an oxygen atom or a sulfur atom, and more preferably an oxygen atom.

Specific examples of the compound represented by formula (A-1) include Compound Nos. (A1) to (A80) described in JP-A No. 2007-103493, but the present invention is not limited to these compounds.

Preferred compounds among the metal complexes according to the present invention include a compound represented by the following formula (B-1).

Formula (B-1)

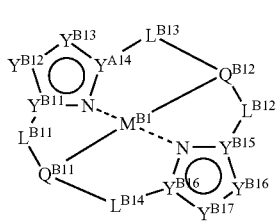

In formula (B-1), $M^{B1}$ represents a metal ion. $Y^{B11}$, $Y^{B14}$, $Y^{B15}$ and $Y^{B18}$ each independently represent a carbon atom or a nitrogen atom. $Y^{B12}$, $Y^{B13}$, $Y^{B16}$ and $Y^{B17}$ each independently represent a substituted or unsubstituted carbon atom, a substituted or unsubstituted nitrogen atom, an oxygen atom or a sulfur atom. $L^{B11}$, $L^{B12}$, $L^{B13}$ and $L^{B14}$ each represent a linking group. $Q^{B11}$ and $Q^{B12}$ each represent a partial structure containing an atom which bonds to $M^{B1}$ with a covalent bond.

Formula (B-1) is to be described in detail.

In formula (B-1), $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$, $L^{B14}$, $Q^{B11}$ and $Q^{B12}$ each have the same meaning as $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$, $L^{A14}$, $Q^{A11}$ and $Q^{A12}$ in the above formula (A-1) respectively and a similar preferable range.

The compound represented by formula (B-1) is preferably a compound represented by the following formula (B-2), (B-3) or (B-4).

Formula (B-2)

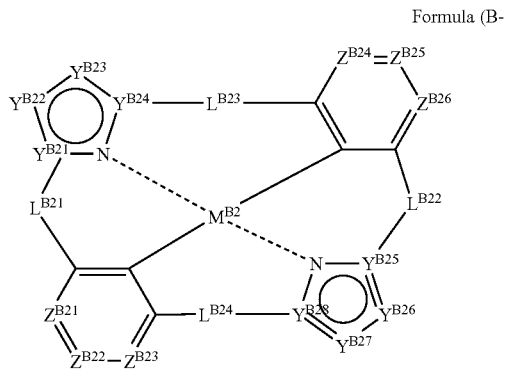

In formula (B-2), $M^{B2}$ represents a metal ion. $Y^{B21}$, $Y^{B24}$, $Y^{B25}$ and $Y^{B28}$ each independently represent a carbon atom or a nitrogen atom. $Y^{B22}$, $Y^{B23}$, $Y^{B26}$ and $Y^{B27}$ each independently represent a substituted or unsubstituted carbon atom, a substituted or unsubstituted nitrogen atom, an oxygen atom, or a sulfur atom. $L^{B21}$, $L^{B22}$, $L^{B23}$ and $L^{B24}$ each represent a linking group. $Z^{B21}$, $Z^{B22}$, $Z^{B23}$, $Z^{B24}$, $Z^{B25}$ and $Z^{B26}$ each independently represent a nitrogen atom, or a substituted or unsubstituted carbon atom.

Formula (B-3)

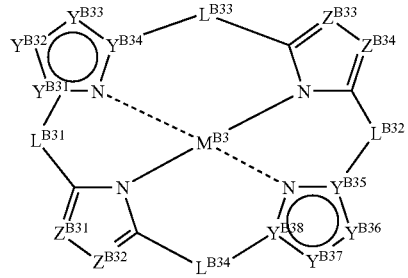

In formula (B-3), $M^{B3}$ represents a metal ion. $Y^{B3}$ $Y^{B34}$ $Y^{B35}$ and $Y^{B38}$ each independently represent a carbon atom or a nitrogen atom. $Y^{B32}$, $Y^{B33}$, $Y^{B36}$ and $Y^{B37}$ each independently represent a substituted or unsubstituted carbon atom, a substituted or unsubstituted nitrogen atom, an oxygen atom, or a sulfur atom. $L^{B31}$, $L^{B32}$, $L^{B33}$ and $L^{B34}$ each represent a linking group. $Z^{B31}$, $Z^{B32}$, $Z^{B33}$ and $Z^{B34}$ each independently represent a nitrogen atom, or a substituted or unsubstituted carbon atom.

Formula (B-4)

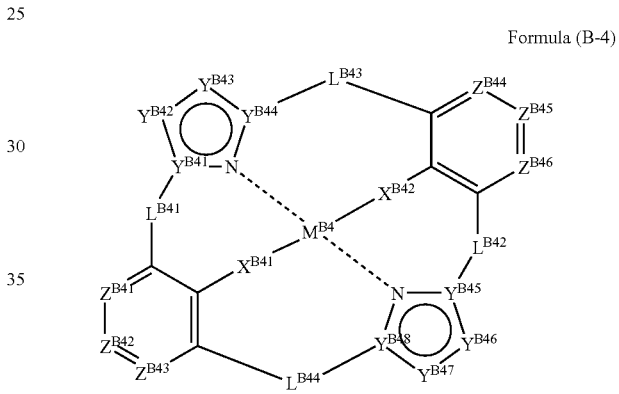

In formula (B-4), $M^{B4}$ represents a metal ion. $Y^{B41}$, $Y^{B44}$, $Y^{B45}$ and $Y^{B48}$ each independently represent a carbon atom or a nitrogen atom. $Y^{B42}$, $Y^{B43}$, $Y^{B46}$ and $Y^{B47}$ each independently represent a substituted or unsubstituted carbon atom, a substituted or unsubstituted nitrogen atom, an oxygen atom, or a sulfur atom. $L^{B41}$, $L^{B42}$, $L^{B43}$ and $L^{B44}$ each represent a linking group. $Z^{B41}$, $Z^{B42}$, $Z^{B43}$, $Z^{B44}$, $Z^{B45}$ and $Z^{B46}$ each independently represent a nitrogen atom, or a substituted or unsubstituted carbon atom. $X^{B41}$ and $X^{B42}$ each independently represent an oxygen atom, a sulfur atom, or a substituted or unsubstituted nitrogen atom.

The compound represented by formula (B-2) is to be described in detail.

In formula (B-2), $M^{B2}$, $Y^{B21}$, $Y^{B24}$, $Y^{B25}$, $Y^{B28}$, $Y^{B22}$, $Y^{B23}$, $Y^{B26}$, $Y^{B27}$, $L^{B21}$, $L^{B22}$, $L^{B23}$ and $L^{B24}$ each have the same meaning as $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in the above formula (B-1) respectively, and a similar preferable range.

$Z^{B21}$, $Z^{B22}$, $Z^{B23}$, $Z^{B24}$, $Z^{B25}$ and $Z^{B26}$ each independently represent a nitrogen atom, or a substituted or unsubstituted carbon atom. $Z^{B21}$, $Z^{B22}$, $Z^{B23}$, $Z^{B24}$, $Z^{B25}$ and $Z^{B26}$ each represent preferably a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

The compound represented by formula (B-3) is to be described in detail.

In formula (B-3), $M^{B3}$, $Y^{B31}$, $Y^{B34}$, $Y^{B35}$, $Y^{B38}$, $Y^{B32}$, $Y^{B33}$, $Y^{B36}$, $Y^{B37}$ $L^{B31}$, $L^{B32}$, $L^{B33}$ and $L^{B34}$ each have the same meaning as $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in formula (B-1) respectively, and a similar preferable range.

$Z^{B31}$, $Z^{B32}$, $Z^{B33}$ and $Z^{B34}$ each independently represent a nitrogen atom, or a substituted or unsubstituted carbon atom. $Z^{B31}$, $Z^{B32}$, $Z^{B33}$ and $Z^{B34}$ each represent preferably a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

The compound represented by formula (B-4) is to be described in detail.

In formula (B-4), $M^{B4}$, $Y^{B41}$, $Y^{B44}$, $Y^{B45}$, $Y^{B48}$, $Y^{B42}$, $Y^{B43}$, $Y^{B46}$, $Y^{B47}$, $L^{B41}$, $L^{B42}$, $L^{B43}$ and $L^{B44}$ each have the same meaning as $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $Y^{B11}$, $L^{B12}$, $L^{B13}$ and $L^{B14}$ in the above formula (B-1) respectively, and a similar preferable range.

$Z^{B41}$, $Z^{B42}$, $Z^{B43}$, $Z^{B44}$, $Z^{B45}$ and $Z^{B46}$ each independently represent a nitrogen atom, or a substituted or unsubstituted carbon atom. $Z^{B41}$, $Z^{B42}$, $Z^{B43}$, $Z^{B44}$, $Z^{B45}$ and $Z^{B46}$ each represent preferably a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

$X^{B41}$ and $X^{B42}$ each independently represent an oxygen atom, a sulfur atom, or a substituted or unsubstituted nitrogen atom. $X^{B41}$ and $X^{B42}$ each preferably represent an oxygen atom or a sulfur atom, and more preferably an oxygen atom.

Specific examples of the compound represented by formula (B-1) include Compound Nos. (B1) to (B55) described in JP-A No. 2007-103493, but the present invention is not limited to these compounds.

One of the preferable compounds among the metal complexes in the present invention is a compound represented by the following formula (C-1).

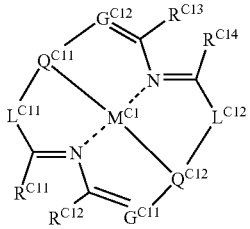

Formula (C-1)

In formula (C-1), $M^{C1}$ represents a metal ion. $R^{C11}$ and $R^{C12}$ each independently represent a hydrogen atom, a substituent forming a 5-membered ring by combining each other or a substituent which does not link together. $R^{C13}$ and $R^{C14}$ each independently represent a hydrogen atom, a substituent forming a 5-membered ring by combining each other or a substituent which does not link together. $G^{C11}$ and $G^{C12}$ each independently represent a nitrogen atom, or a substituted or unsubstituted carbon atom. $L^{C11}$ and $L^{C12}$ each represent a linking group. $Q^{C11}$ and $Q^{C12}$ each represent a partial structure containing an atom which bonds to $M^{C1}$ with a coordination bond, an ionic bond or a covalent bond.

Formula (C-1) is to be described in detail.

In formula (C-1), $M^{C1}$, $L^{C11}$, $L^{C12}$, $Q^{C11}$ and $Q^{C12}$ each have the same meaning as $M^{A1}$, $L^{A11}$, $L^{A12}$, $Q^{A11}$ and $Q^{A12}$ in the above formula (A-1) respectively and a similar preferable range.

$G^{C21}$ and $G^{C22}$ each independently represent a nitrogen atom or a substituted or unsubstituted carbon atom, preferably a nitrogen atom or an unsubstituted carbon atom, and more preferably a nitrogen atom.

$R^{C11}$ and $R^{C12}$ each independently represent a hydrogen atom or a substituent. $R^{C11}$ and $R^{C12}$ may link together to form a 5-membered ring. $R^{C13}$ and $R^{C14}$ each independently represent a hydrogen atom or a substituent. $R^{C13}$ and $R^{C14}$ may link together to form a 5-membered ring.

Examples of the substituent represented by $R^{C11}$, $R^{C12}$, $R^{C13}$ or $R^{C14}$ include an alkyl group (having preferably 1 to 30 carbon atoms, more preferably 1 to 20 carbon atoms, and even more preferably 1 to 10 carbon atoms; for example, methyl, ethyl, iso-propyl, tert-butyl, n-octyl, n-decyl, n-hexadecyl, cyclopropyl, cyclopentyl, cyclohexyl, or the like), an alkenyl group (having preferably 2 to 30 carbon atoms, more preferably 2 to 20 carbon atoms, and even more preferably 2 to 10 carbon atoms; for example, vinyl, allyl, 2-butenyl, 3-pentenyl, or the like), an alkynyl group (having preferably 2 to 30 carbon atoms, more preferably 2 to 20 carbon atoms, and even more preferably 2 to 10 carbon atoms; for example, propargyl, 3-pentynyl or the like), an aryl group (having preferably 6 to 30 carbon atoms, more preferably 6 to 20 carbon atoms, and even more preferably 6 to 12 carbon atoms; for example, phenyl, p-methylphenyl, naphthyl, anthranyl or the like), an amino group (having preferably 0 to 30 carbon atoms, more preferably 0 to 20 carbon atoms, and even more preferably 0 to 10 carbon atoms; for example, amino, methylamino, dimethylamino, diethylamino, dibenzylamino, diphenylamino, ditolylamino or the like), an alkoxy group (having preferably 1 to 30 carbon atoms, more preferably 1 to 20 carbon atoms, and even more preferably 1 to 10 carbon atoms; for example, methoxy, ethoxy, butoxy, 2-ethylhexyloxy or the like), an aryloxy group (having preferably 6 to 30 carbon atoms, more preferably 6 to 20 carbon atoms, and even more preferably 6 to 12 carbon atoms; for example, phenyloxy, 1-naphthyloxy, 2-naphthyloxy or the like), a heterocyclic oxy group (having preferably 1 to 30 carbon atoms, more preferably 1 to 20 carbon atoms, and even more preferably 1 to 12 carbon atoms; for example, pyridyloxy, pyrazinyloxy, pyrimidyloxy, quinolyloxy or the like), an acyl group (having preferably 1 to 30 carbon atoms, more preferably 1 to 20 carbon atoms, and even more preferably 1 to 12 carbon atoms; for example, acetyl, benzoyl, formyl, pivaloyl or the like), an alkoxycarbonyl group (having preferably 2 to 30 carbon atoms, more preferably 2 to 20 carbon atoms, and even more preferably 2 to 12 carbon atoms; for example, methoxycarbonyl, ethoxycarbonyl or the like), an aryloxycarbonyl group (having preferably 7 to 30 carbon atoms, more preferably 7 to 20 carbon atoms, and even more preferably 7 to 12 carbon atoms; for example, phenyloxycarbonyl or the like), an acyloxy group (having preferably 2 to 30 carbon atoms, more preferably 2 to 20 carbon atoms, and even more preferably 2 to 10 carbon atoms; for example, acetoxy, benzoyloxy or the like), an acylamino group (having preferably 2 to 30 carbon atoms, more preferably 2 to 20 carbon atoms, and even more preferably 2 to 10 carbon atoms; for example, acetylamino, benzoylamino or the like), an alkoxycarbonylamino group (having preferably 2 to 30 carbon atoms, more preferably 2 to 20 carbon atoms, and even more preferably 2 to 12 carbon atoms; for example, methoxycarbonylamino or the like), an aryloxycarbonylamino group (having preferably 7 to 30 carbon atoms, more preferably 7 to 20 carbon atoms, and even more preferably 7 to 12 carbon atoms; for example, phenyloxycarbonylamino or the like), an alkylthio group (having preferably 1 to 30 carbon atoms, more preferably 1 to 20 carbon atoms, and even more preferably 1 to 12 carbon atoms; for example, methylthio, ethylthio or the like), an arylthio group (having preferably 6 to 30 carbon atoms, more preferably 6 to 20 carbon atoms, and even more preferably 6 to 12 carbon atoms; for example, phenylthio or the like), a heterocyclic thio group (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio or the like), a halogen atom (for example, a fluorine atom, a chlorine atom, a bromine atom, or an iodine atom), a cyano group, a heterocyclic group (having preferably 1 to 30 carbon atoms, and more preferably 1 to 12 carbon atoms; examples of the heteroatom including a nitrogen atom, an oxygen atom and a sulfur atom; for example, an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, an azepinyl group or the like), a silyl group (having preferably 3 to 40 carbon atoms, more preferably 3 to 30 carbon atoms, and even more preferably 3 to 24 carbon atoms; for example, trimethylsilyl, triphenylsilyl or the like) and a silyloxy group (having preferably 3 to 40 carbon atoms, more preferably 3 to 30 carbon atoms and even more preferably 3 to 24 carbon atoms; for example, trimethylsilyloxy, triphenylsilyloxy or the like).

Preferred examples of the substituent represented by $R^{C11}$, $R^{C12}$, $R^{C13}$ or $R^{C14}$ include an alkyl group, an aryl group, a group forming a 5-membered ring by combining $R^{C11}$ and $R^{C12}$, or $R^{C13}$ and $R^{C14}$, and more preferably a group forming a 5-membered ring by combining $R^{C11}$ and $R^{C12}$, or $R^{C13}$ and $R^{C14}$.

The compound represented by formula (C-1) is preferably a compound represented by the following formula (C-2).

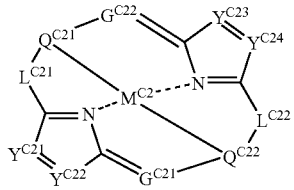

Formula (C-2)

In formula (C-2), $M^{C2}$ represents a metal ion.

$Y^{C21}$, $Y^{C22}$, $Y^{C23}$ and $Y^{C24}$ each independently represent a nitrogen atom, or a substituted or unsubstituted carbon atom. $G^{C21}$ and $G^{C22}$ each independently represent a nitrogen atom, or a substituted or unsubstituted carbon atom. $L^{C21}$ and $L^{C22}$ each represent a linking group. $Q^{C21}$ and $Q^{C22}$ each represent a partial structure containing an atom which bonds to $M^{C2}$ with a coordination bond, an ionic bond or a covalent bond.

Formula (C-2) is to be described in detail.

In formula (C-2), $M^{C2}$, $L^{C2}$, $L^{C22}$, $Q^{C21}$, $Q^{C22}$, $G^{C21}$ and $G^{C22}$ each have the same meaning as $M^{C11}$, $L^{C11}$, $L^{C12}$, $Q^{C11}$, $Q^{C12}$, $G^{C11}$ and $G^{C12}$ in the above formula (C-1) respectively and a similar preferable range.

$Y^{C21}$, $Y^{C22}$, $Y^{C23}$ and $Y^{C24}$ each independently represent a nitrogen atom, or a substituted or unsubstituted carbon atom, more preferably a substituted or unsubstituted carbon atom, and even more preferably an unsubstituted carbon atom.

The compound represented by formula (C-2) is preferably a compound represented by the following formula (C-3), (C-4) or (C-5).

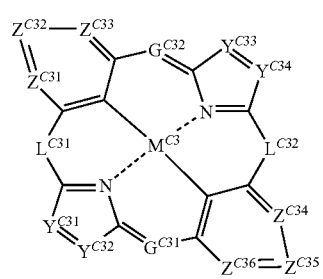

Formula (C-3)

In formula (C-3), $M^{C3}$ represents a metal ion.

$Y^{C31}$, $Y^{C32}$, $Y^{C33}$ and $Y^{C34}$ each independently represent a nitrogen atom, or a substituted or unsubstituted carbon atom. $G^{C31}$ and $G^{C32}$ each independently represent a nitrogen atom, or a substituted or unsubstituted carbon atom. $L^{C31}$ and $L^{C32}$ each represent a linking group. $Z^{C31}$, $Z^{C32}$, $Z^{C33}$, $Z^{C34}$, $Z^{C35}$ and $Z^{C36}$ each independently represent a nitrogen atom, or a substituted or unsubstituted carbon atom.

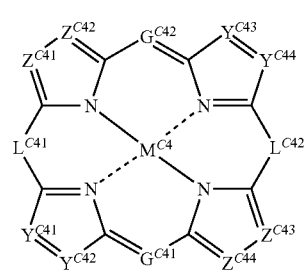

Formula (C-4)

In formula (C-4), $M^{C4}$ represents a metal ion. $Y^{C41}$, $Y^{C42}$, $Y^{C43}$ and $Y^{C44}$ each independently represent a nitrogen atom, or a substituted or unsubstituted carbon atom. $G^{C41}$ and $G^{C42}$ each independently represent a nitrogen atom, or a substituted or unsubstituted carbon atom. $L^{C41}$ and $L^{C42}$ each represent a linking group. $Z^{C41}$, $Z^{C42}$, $Z^{C43}$ and $Z^{C44}$ each independently represent a nitrogen atom, or a substituted or unsubstituted carbon atom.

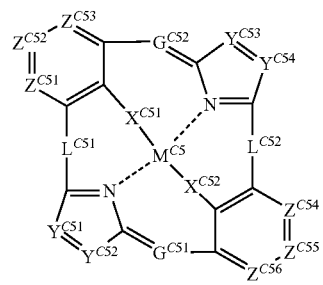

Formula (C-5)

In formula (C-5), $M^{C5}$ represents a metal ion.

$Y^{C51}$, $Y^{C52}$, $Y^{C5}$ and $Y^{C54}$ each independently represent a nitrogen atom, or a substituted or unsubstituted carbon atom. $G^{C51}$ and $G^{C52}$ each independently represent a nitrogen atom, or a substituted or unsubstituted carbon atom. $L^{C5}$ and $L^{C52}$ each represent a linking group. $Z^{C51}$, $Z^{C52}$, $Z^{C53}$, $Z^{C54}$, $Z^{C55}$ and $Z^{C56}$ each independently represent a nitrogen atom, or a substituted or unsubstituted carbon atom. $X^{C51}$ and $X^{C52}$ each independently represent an oxygen atom, a sulfur atom, or a substituted or unsubstituted nitrogen atom.

The compound represented by formula (C-3) is to be described in detail.

In formula (C-3), $M^{C3}$, $L^{C31}$, $L^{C32}$, $G^{C31}$ and $G^{C32}$ each have the same meaning as $M^{C1}$, $L^{C11}$, $L^{C12}$, $G^{C11}$ and $G^{C12}$ in the above formula (C-1) respectively and a similar preferable range.

$Z^{C31}$, $Z^{C32}$, $Z^{33}$, $Z^{34}$, $Z^{C35}$ and $Z^{C36}$ each independently represent a nitrogen atom, or a substituted or unsubstituted carbon atom. $Z^{C31}$, $Z^{C32}$, $Z^{C33}$, $Z^{C34}$, $Z^{C35}$ and $Z^{C36}$ each preferably represent a substituted or unsubstituted carbon atom, and more preferably an unsubstituted carbon atom.

The compound represented by formula (C-4) is to be described in detail.

In formula (C-4), $M^{C4}$, $L^{C41}$, $L^{C42}$, $G^{C41}$ and $G^{C42}$ each have the same meaning as $M^{C1}$, $L^{C11}$, $L^{C12}$, $G^{C11}$ and $G^{C12}$ in the above formula (C-1) respectively and a similar preferable range.

$Z^{C41}$, $Z^{C42}$, $Z^{C43}$ and $Z^{C44}$ each independently represent a nitrogen atom, or a substituted or unsubstituted carbon atom. $Z^{C41}$, $Z^{C42}$, $Z^{C43}$ and $Z^{C44}$ each preferably represent a substituted or unsubstituted carbon atom, and more preferably an unsubstituted carbon atom.

The compound represented by formula (C-5) is to be described in detail.

$M^{C5}$, $L^{C51}$, $L^{C52}$, $G^{C51}$ and $G^{C52}$ each have the same meaning as $M^{C1}$, $L^{C11}$, $L^{C12}$, $G^{C11}$ and $G^{C12}$ in the above formula (C-1) respectively, and a similar preferable range.

$Z^{C51}$, $Z^{C52}$, $Z^{C53}$, $Z^{C54}$, $Z^{C55}$ and $Z^{C56}$ each independently represent a nitrogen atom, or a substituted or unsubstituted carbon atom. $Z^{C51}$, $Z^{C52}$, $Z^{C53}$, $Z^{C54}$, $Z^{C55}$ and $Z^{C56}$ each represent preferably a substituted or unsubstituted carbon atom, and more preferably an unsubstituted carbon atom.

$X^{C51}$ and $X^{C52}$ each independently represent an oxygen atom, a sulfur atom, or a substituted or unsubstituted nitrogen atom. $X^{C51}$ and $X^{C52}$ each represent preferably an oxygen atom or a sulfur atom, and more preferably an oxygen atom.

Specific examples of the compound represented by formula (C-1) include Compound Nos. (C1) to (C63) described in JP-A No. 2007-103493, but the present invention is not limited to these compounds.

One of the preferable compounds among the metal complexes in the present invention is a compound represented by the following formula (D-1).

Formula (D-1)

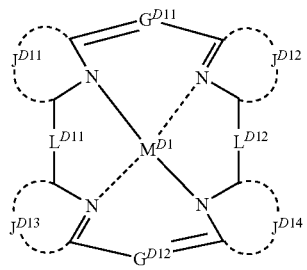

In formula (D-1), $M^{D1}$ represents a metal ion.

$G^{D11}$ and $G^{D12}$ each independently represent a nitrogen atom, or a substituted or unsubstituted carbon atom. $J^{D11}$, $J^{D12}$, $J^{D13}$ and $J^{D14}$ each represent an atomic group necessary for forming a 5-membered ring. $L^{D11}$ and $L^{D12}$ each represent a linking group.

Formula (D-1) is to be described in detail.

In formula (D-1), $M^{D1}$, $L^{D11}$ and $L^{D12}$ each have the same meaning as $M^{41}$, $L^{A11}$ and $L^{A12}$ in the above formula (A-1) respectively and a similar preferable range.

$G^{D11}$ and $G^{D12}$ each have the same meaning as $G^{C11}$ and $G^{C12}$ in the above formula (C-1) respectively and a similar preferable range.

$J^{D11}$, $J^{D12}$, $J^{D13}$ and $J^{D14}$ each represent an atomic group necessary for forming a nitrogen-containing 5-membered heterocycle with the atomic group to which that links.

The compound represented by formula (D-1) is preferably a compound represented by the following formula (D-2), (D-3) or (D-4).

Formula (D-2)

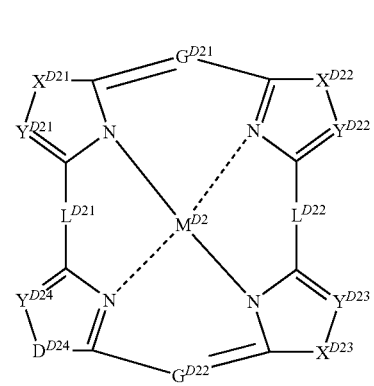

In formula (D-2), $M^{D2}$ represents a metal ion.

$G^{D21}$ and $G^{D22}$ each independently represent a nitrogen atom, or a substituted or unsubstituted carbon atom.

$Y^{D21}$, $Y^{D22}$, $Y^{D23}$ and $Y^{D24}$ each independently represent a nitrogen atom, or a substituted or unsubstituted carbon atom.

$X^{D21}$, $X^{D22}$, $X^{D23}$ and $X^{D14}$ each independently represent an oxygen atom, a sulfur atom, —$NR^{D21}$— or —$C(R^{D22})R^{D23}$—.

$R^{D21}$, $R^{D22}$ and $R^{D23}$ each independently represent a hydrogen atom or a substituent. $L^{D21}$ and $L^{D22}$ each represent a linking group.

Formula (D-3)

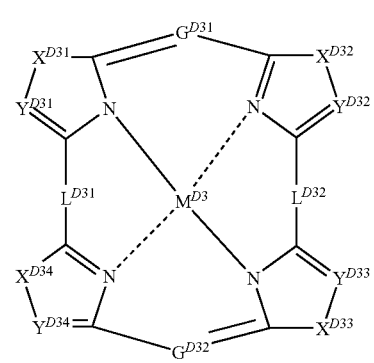

In formula (D-3), $M^{D3}$ represents a metal ion.

$G^{D31}$ and $G^{D32}$ each independently represent a nitrogen atom or a substituted or unsubstituted carbon atom.

$Y^{D31}$, $Y^{D32}$, $Y^{D33}$ and $Y^{D34}$ each independently represent a nitrogen atom, or a substituted or unsubstituted carbon atom.

$X^{D31}$, $X^{D32}$, $X^{D33}$ and $X^{D34}$ each independently represent an oxygen atom, a sulfur atom, $-NR^{D31}-$ or $-C(R^{D32})R^{D33}-$.

$R^{D31}$, $R^{D32}$ and $R^{D33}$ each independently represent a hydrogen atom or a substituent. $L^{D31}$ and $L^{D32}$ each represent a linking group.

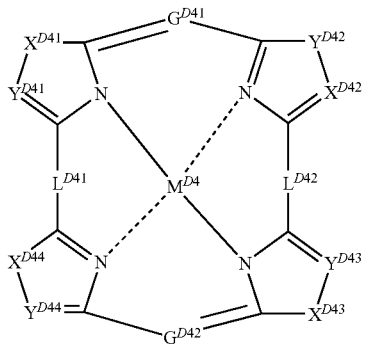

Formula (D-4)

In formula (D-4), $M^{D4}$ represents a metal ion.

$G^{D41}$ and $G^{D42}$ each independently represent a nitrogen atom, or a substituted or unsubstituted carbon atom.

$Y^{D41}$, $Y^{D42}$, $Y^{D43}$ and $Y^{D44}$ each independently represent a nitrogen atom, or a substituted or unsubstituted carbon atom.

$X^{D41}$, $X^{D42}$ $X^{D43}$ and $X^{D44}$ each independently represent an oxygen atom, a sulfur atom, $-NR^{D41}-$ or $-C(R^{D42})R^{D43}-$. $R^{D41}$, $R^{D42}$ and $R^{D43}$ each independently represent a hydrogen atom or a substituent. $L^{D41}$ and $L^{D42}$ each represent a linking group.

The compound represented by formula (D-2) is to be described in detail.

$M^{D2}$, $L^{D21}$, $L^{D22}$, $G^{D21}$ and $G^{D22}$ each have the same meaning as $M^{D1}$, $L^{D11}$, $L^{D12}$, $G^{D11}$ and $G^{D12}$ in the above formula (D-1) respectively and a similar preferable range.

$Y^{D21}$, $Y^{D22}$, $Y^{D23}$ and $Y^{D24}$ each independently represent a nitrogen atom, or a substituted or unsubstituted carbon atom, preferably a substituted or unsubstituted carbon atom, and more preferably an unsubstituted carbon atom.

$X^{D21}$, $X^{D22}$, $X^{D23}$ and $X^{D24}$ each independently represent an oxygen atom, a sulfur atom, $-NR^{D21}-$ or $-C(R^{D22})R^{D23}-$, preferably a sulfur atom, $-NR^{D21}-$ or $-C(R^{D22})R^{D23}-$, more preferably $-NR^{D21}-$ or $-C(R^{D22})R^{D23}-$, and even more preferably $-NR^{D21}-$.

$R^{D21}$, $R^{D22}$ and $R^{D23}$ each independently represent a hydrogen atom or a substituent. Examples of the substituent represented by $R^{D21}$, $R^{D22}$ or $R^{D23}$ include an alkyl group (having preferably 1 to 20 carbon atoms, more preferably 1 to 12 carbon atoms, and even more preferably 1 to 8 carbon atoms; for example, methyl, ethyl, iso-propyl, tert-butyl, n-octyl, n-decyl, n-hexadecyl, cyclopropyl, cyclopentyl, cyclohexyl or the like), an alkenyl group (having preferably 2 to 20 carbon atoms, more preferably 2 to 12 carbon atoms, and even more preferably 2 to 8 carbon atoms; for example, vinyl, allyl, 2-butenyl, 3-pentenyl or the like), an alkynyl, group (having preferably 2 to 20 carbon atoms, more prefer- ably 2 to 12 carbon atoms, and even more preferably 2 to 8 carbon atoms; for example, propargyl, 3-pentynyl or the like), an aryl group (having preferably 6 to 30 carbon atoms, more preferably 6 to 20 carbon atoms, and even more preferably 6 to 12 carbon atoms; for example, phenyl, p-methylphenyl, naphthyl or the like), a substituted carbonyl group (having preferably 1 to 20 carbon atoms, more preferably 1 to 16 carbon atoms, and even more preferably 1 to 12 carbon atoms; for example, acetyl, benzoyl, methoxycarbonyl, phenyloxy- carbonyl, dimethylaminocarbonyl, phenylaminocarbonyl or the like), a substituted sulfonyl group (having preferably 1 to 20 carbon atoms, more preferably 1 to 16 carbon atoms, and even more preferably 1 to 12 carbon atoms; for example, mesyl, tosyl or the like), and a heterocyclic group (an ali- phatic heterocyclic group and an aromatic heterocyclic group are included. Preferred is a heterocyclic group comprising oxygen, sulfur or nitrogen, having preferably 1 to 50 carbon atoms, more preferably 1 to 30 carbon atoms, and even more preferably 2 to 12 carbon atoms. Examples thereof include an imidazolyl group, a pyridyl group, a furyl group, a piperidyl group, a morpholino group, a benzoxazolyl group, a triazolyl group and the like). $R^{D21}$, $R^{D22}$ and $R^{D23}$ are each preferably an alkyl group, an aryl group or an aromatic heterocyclic group, more preferably an alkyl group or an aryl group, and even more preferably an aryl group.

The compound represented by formula (D-3) is to be described in detail.

In formula (D-3), $M^{D3}$, $L^{D31}$, $L^{D32}$, $G^{D31}$ and $G^{D32}$ each have the same meaning as $M^{D1}$, $L^{D11}$, $L^{D12}$, $G^{D11}$ and $G^{D12}$ in the above formula (D-1) respectively and a similar preferable range.

$X^{D31}$, $X^{D32}$, $X^{D33}$ and $X^{D34}$ each have the same meaning as $X^{D21}$, $X^{D22}$, $X^{D23}$ and $X^{D24}$ in the above formula (D-2) respectively and a similar preferable range.

$Y^{D31}$, $Y^{D32}$, $Y^{D33}$ and $Y^{D34}$ each have the same meaning as $Y^{D21}$, $Y^{D22}$, $Y^{D23}$ and $Y^{D24}$ in the above formula (D-2) respectively and a similar preferable range.

The compound represented by formula (D-4) is to be described in detail.

In formula (D-4), $M^{D4}$, $L^{D41}$, $L^{D42}$, $G^{D41}$ and $G^{D42}$ each have the same meaning as $M^{D1}$, $L^{D11}$, $L^{D12}$, $G^{D11}$ and $G^{D12}$ in the above formula (D-1) respectively and a similar preferable range.

$X^{D41}$, $X^{D42}$, $X^{D43}$ and $X^{D44}$ each have the same meaning as $X^{D21}$, $X^{D22}$, $X^{D23}$ and $X^{D24}$ in the above formula (D-2) respectively and a similar preferable range. $Y^{D41}$ $Y^{D42}$, $Y^{D43}$ and $Y^{D44}$ each have the same meaning as $Y^{D21}$, $Y^{D22}$, $Y^{D23}$ and $Y^{D24}$ in the above formula (D-2) respectively and a simi- lar preferable range.

Specific examples of the compound represented by for- mula (D-1) include Compound Nos. (D1) to (D24) described in JP-A No. 2007-103493, but the present invention is not limited to these compounds.

One of the preferable compounds among the metal com- plexes according to the present invention is a compound represented by the following formula (E-1).

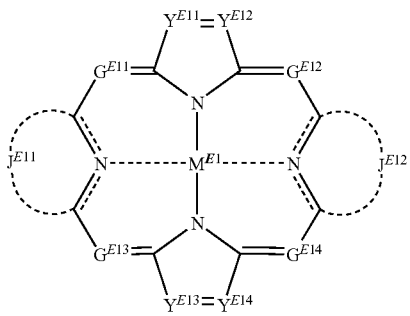

Formula (E-1)

In formula (E-1), $M^{E1}$ represents a metal ion. $J^{E11}$ and $J^{E12}$ each represent an atomic group necessary for forming a 5-membered ring. $G^{E11}$, $G^{E12}$, $G^{E13}$ and $G^{E14}$ each independently represent a nitrogen atom, or a substituted or unsubstituted carbon atom. $Y^{E11}$, $Y^{E12}$, $Y^{E13}$ and $Y^{E14}$ each independently represent a nitrogen atom, or a substituted or unsubstituted carbon atom.

The compound represented by formula (E-1) is to be described in detail.

In formula (E-1), $M^{E4}$ has the same meaning as $M^{41}$ in the above formula (A-1) and a similar preferable range. $G^{E11}$, $G^{E12}$, $G^{E13}$ and $G^{E14}$ each have the same meaning as $G^{C11}$ and $G^{C12}$ in the above formula (C-1), and a similar preferable range.

$J^{E11}$ and $J^{E12}$ each have the same meaning as $J^{D12}$ to $J^{D14}$ in the above formula (D-1), and a similar preferable range. $Y^{E11}$, $Y^{E12}$, $Y^{E13}$ and $Y^{E14}$ each have the same meaning as $Y^{C21}$, $Y^{C24}$, $Y^{C21}$ and $Y^{C24}$ in the above formula (C-2) respectively, and a similar preferable range.

The compound represented by formula (E-1) is preferably a compound represented by the following formula (E-2) or formula (E-3).

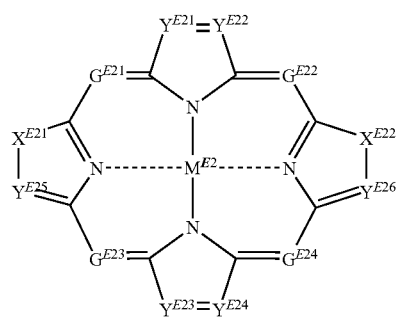

Formula (E-2)

In formula (E-2), $M^{E2}$ represents a metal ion. $G^{E21}$, $G^{E22}$, $G^{E23}$ and $G^{E24}$ each independently represent a nitrogen atom, or a substituted or unsubstituted carbon atom. $Y^{E21}$, $Y^{E22}$, $Y^{E23}$, $Y^{E24}$, $Y^{E25}$ and $Y^{E26}$ each independently represent a nitrogen atom, or a substituted or unsubstituted carbon atom.

$X^{E21}$ and $X^{E22}$ each independently represent an oxygen atom, a sulfur atom, $-NR^{E21}-$ or $-C(R^{E22})R^{E23}-$. $R^{E21}$, $R^{E22}$ and $R^{E23}$ each independently represent a hydrogen atom or a substituent.

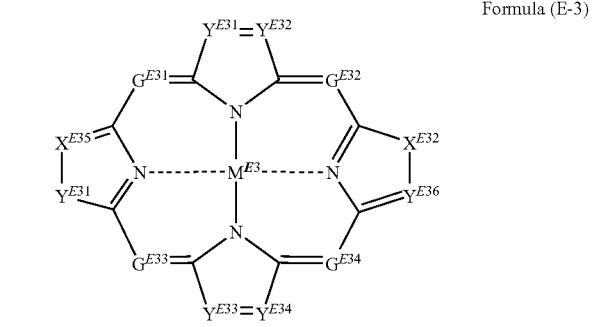

Formula (E-3)

In formula (E-3), $M^{E3}$ represents a metal ion. $G^{E31}$, $G^{E32}$, $G^{E33}$ and $G^{E34}$ each independently represent a nitrogen atom, or a substituted or unsubstituted carbon atom. $Y^{E31}$, $Y^{E32}$, $Y^{E33}$, $Y^{E34}$, $Y^{E35}$ and $Y^{E36}$ each independently represent a nitrogen atom, or a substituted or unsubstituted carbon atom. $X^{E31}$ and $X^{E32}$ each independently represent an oxygen atom, a sulfur atom, $-NR^{E31}-$ or $-C(R^{E32})R^{E33}-$. $R^{E31}$, $R^{E32}$ and $R^{E33}$ each independently represent a hydrogen atom or a substituent.

The compound represented by formula (E-2) is to be described in detail.

In formula (E-2), $M^{E2}$, $G^{E21}$, $G^{E22}$, $G^{E23}$, $G^{E24}$, $Y^{E21}$, $Y^{E22}$, $Y^{E23}$ and $Y^{E24}$ each have the same meaning as $M^{E1}$, $G^{E11}$, $G^{E12}$, $G^{E13}$, $G^{E14}$, $Y^{E11}$, $Y^{E12}$, $Y^{E13}$ and $Y^{E14}$ in the above formula (E-1) respectively, and a similar preferable range. $X^{E21}$ and $X^{E22}$ each have the same meaning as $X^{D21}$ and $X^{D22}$ in the above formula (D-2) and a similar preferable range.

The compound represented by formula (E-3) is to be described in detail.

In formula (E-3), $M^{E3}$, $G^{E31}$, $G^{E32}$, $G^{E33}$, $G^{E34}$, $Y^{E31}$, $Y^{E32}$, $Y^{E33}$ and $Y^{E34}$ each have the same meaning as $M^{E1}$, $G^{E11}$, $G^{E12}$, $G^{E13}$, $G^{E14}$, $Y^{E11}$, $Y^{E12}$, $Y^{E13}$ and $Y^{E14}$ in the above formula (E-1) respectively, and a similar preferable range. $X^{E31}$ and $X^{E32}$ each have the same meaning as $X^{E21}$ and $X^{E22}$ in the above formula (E-2) and a similar preferable range.

Specific examples of the compound represented by formula (E-1) include Compound Nos. (E1) to (E15) described in JP-A No. 2007-103493, but the present invention is not limited to these compounds.

One of the preferable compounds among the metal complexes according to the present invention is a compound represented by the following formula (F-1).

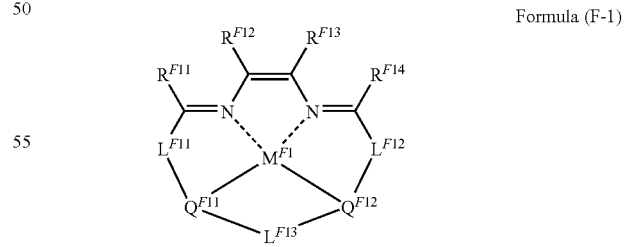

Formula (F-1)

In formula (F-1), $M^{F1}$ represents a metal ion. $L^{F11}$, $L^{F12}$ and $L^{F13}$ each represent a linking group. $R^{F11}$, $R^{F12}$, $R^{F13}$ and $R^{F14}$ each independently represent a hydrogen atom or a substituent. $R^{F11}$ and $R^{F12}$, $R^{F12}$ and $R^{F13}$, or $R^{F13}$ and $R^{F14}$ may combine each other to form a ring, if possible, wherein the ring formed by $R^{F11}$ and $R^{F12}$, or $R^{F13}$ and $R^{F14}$ is a 5-membered ring. $Q^{F11}$ and $Q^{F12}$ each represent a partial structure containing an atom which bonds to $M^{F1}$ with a coordination bond, an ionic bond or a covalent bond.

The compound represented by formula (F-1) is to be described in detail.

In formula (F-1), $M^{F1}$, $L^{F11}$, $L^{F12}$, $L^{F13}$, $Q^{F11}$ and $Q^{F12}$ each have the same meaning as $M^{A1}$, $L^{A11}$, $L^{A12}$, $L^{A13}$, $Q^{A11}$ and $Q^{A12}$ in formula (A-1) respectively, and a similar preferable range. $R^{F11}$, $R^{F12}$, $R^{F13}$ and $R^{F14}$ each independently represent a hydrogen atom or a substituent. $R^{F11}$ and $R^{F12}$, $R^{F12}$ and $R^{F13}$, or $R^{F13}$ and $R^{F14}$ may combine each other to form a ring, if possible, wherein the ring formed by $R^{F11}$ and $R^{F12}$, or $R^{F13}$ and $R^{F14}$ is a 5-membered ring. As the substituent represented by $R^{F11}$, $R^{F13}$ or $R^{F14}$, the substituent explained as the substituent represented by $R^{C11}$ to $R^{C14}$ in the above formula (C-1) can be respectively applied. $R^{F11}$, $R^{F12}$, $R^{F13}$ and $R^{F14}$ are preferably a group forming a 5-membered ring by combining $R^{F11}$ and $R^{F12}$ or $R^{F13}$ and $R^{F14}$ or a group forming an aromatic ring by combining $R^{F12}$ and $R^{F13}$.

The compound represented by formula (F-1) is preferably a compound represented by the following formula (F-2), (F-3) or (F-4).

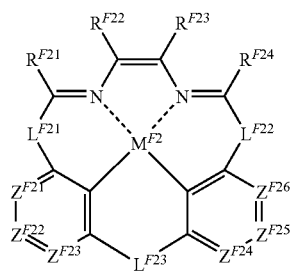

Formula (F-2)

In formula (F-2), $M^{F2}$ represents a metal ion. $L^{F21}$, $L^{F22}$ and $L^{F23}$ each represent a linking group. $R^{F21}$, $R^{F22}$, $R^{F23}$ and $R^{F24}$ each represent a substituent. $R^{F21}$ and $R^{F22}$, $R^{F22}$ and $R^{F23}$, or $R^{F23}$ and $R^{F24}$ may combine each other to form a ring, if possible, wherein the ring formed by $R^{F21}$ and $R^{F22}$ or $R^{F23}$ and $R^{F24}$ is a 5-membered ring. $Z^{F21}$, $Z^{F22}$, $Z^{F23}$, $Z^{F24}$, $Z^{F25}$ and $Z^{F26}$ each independently represent a nitrogen atom, or a substituted or unsubstituted carbon atom.

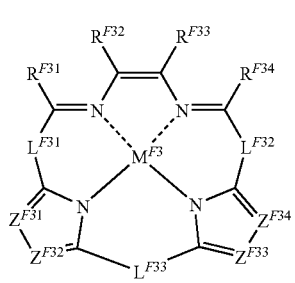

Formula (F-3)

In formula (F-3), $M^{F3}$ represents a metal ion. $L^{F31}$, $L^{F32}$ and $L^{F33}$ each represent a linking group. $R^{F31}$, $R^{F32}$, $R^{F33}$ and $R^{F34}$ each represent a substituent. $R^{F31}$ and $R^{F32}$, $R^{F32}$ and $R^{F33}$ or $R^{F33}$ and $R^{F34}$ may combine each other to form a ring if possible, wherein the ring formed by $R^{F31}$ and $R^{F32}$, or $R^{F33}$ and $R^{F34}$ is a 5-membered ring. $Z^{F31}$, $Z^{F32}$, $Z^{F33}$ and $Z^{F34}$ each independently represent a nitrogen atom, or a substituted or unsubstituted carbon atom.

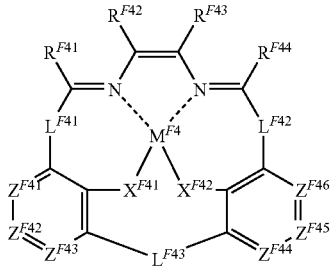

Formula (F-4)

In formula (F-4), $M^{F4}$ represents a metal ion. $L^{F41}$, $L^{F42}$ and $L^{F43}$ each represent a linking group. $R^{F41}$, $R^{F42}$, $R^{F43}$ and $R^{F44}$ represent a substituent. $R^{F41}$ and $R^{F42}$, $R^{F42}$ and $R^{F43}$ or $R^{F43}$ and $R^{F44}$ may combine each other to form a ring, if possible, wherein the ring formed by $R^{F41}$ and $R^{F42}$, or $R^{F43}$ and $R^{F44}$ is a 5-membered ring. $Z^{F41}$, $Z^{F42}$, $Z^{F43}$, $Z^{F44}$, $Z^{F45}$ and $Z^{F46}$ each independently represent a nitrogen atom or a substituted or unsubstituted carbon atom. $X^{F41}$ and $X^{F42}$ each independently represent an oxygen atom, a sulfur atom, or a substituted or unsubstituted nitrogen atom.

The compound represented by formula (F-2) is to be described in detail.

$M^{F2}$, $L^{F21}$, $L^{F22}$, $L^{F23}$, $R^{F21}$, $R^{F22}$, $R^{F23}$ and $R^{F24}$ each have the same meaning $M^{F1}$ $L^{F11}$, $L^{F12}$, $L^{F13}$, $R^{F11}$, $R^{F12}$, $RF^{13}$ and $R^{F14}$ in the above formula (F-1) respectively and a similar preferable range.

$Z^{F21}$, $Z^{F22}$, $Z^{F23}$, $Z^{F24}$, $Z^{F25}$ and $Z^{F26}$ each independently represent a nitrogen atom or a substituted or unsubstituted carbon atom. $Z^{F21}$, $Z^{F22}$, $Z^{F23}$, $Z^{F24}$, $Z^{F25}$ and $Z^{F26}$ each represent preferably a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

The compound represented by formula (F-3) is to be described in detail.

In formula (F-3), $M^{F3}$, $L^{F31}$, $L^{F32}$, $L^{F33}$, $R^{F31}$, $R^{F32}$, $R^{F33}$ and $R^{F34}$ each have the same meaning as $M^{F1}$, $L^{F11}$, $L^{F12}$, $L^{F13}$, $R^{F11}$, $R^{F12}$, $R^{F13}$ and $R^{F14}$ in formula (F-1) respectively, and a similar preferable range. $Z^{F31}$, $Z^{F32}$, $Z^{F33}$ and $Z^{F34}$ each independently represent a nitrogen atom, or a substituted or unsubstituted carbon atom. $Z^{F31}$, $Z^{F32}$, $Z^{F33}$ and $Z^{F34}$ each represent preferably a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

The compound represented by formula (F-4) is to be described in detail.

In formula (F-4), $M^{F4}$, $L^{F41}$, $L^{F42}$, $L^{F43}$, $R^{F41}$, $R^{F42}$, $R^{F43}$ and $R^{F44}$ each have the same meaning as $M^{F1}$, $L^{F11}$, $L^{F12}$, $L^{F13}$, $R^{F11}$, $R^{F12}$, $R^{F13}$ and $R^{F14}$ in the above formula (F-1) respectively, and a similar preferable range.

$Z^{F41}$, $Z^{F42}$, $Z^{F43}$, $Z^{F44}$, $Z^{F45}$ and $Z^{F46}$ each independently represent a nitrogen atom, or a substituted or unsubstituted carbon atom. $Z^{F41}$, $Z^{F42}$, $Z^{F43}$, $Z^{F44}$, $Z^{F45}$ and $Z^{F46}$ each represent preferably a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

$X^{F41}$ and $X^{F42}$ each independently represent an oxygen atom, a sulfur atom, or a substituted or unsubstituted nitrogen atom. $X^{F41}$ and $X^{F42}$ each preferably represent an oxygen atom or a sulfur atom, and more preferably an oxygen atom.

Specific examples of the compound represented by formula (F-1) include Compound Nos. (F1) to (F52) described in JP-A No. 2007-103493, but the present invention is not limited to these compounds.

The compounds represented by formula (A-1) to (F-1) described above can be prepared according to methods well known in the art.

(Hole Transporting Light-Emitting Material)

From the viewpoints of enhancing durability and reducing driving voltage, the hole transporting light-emitting material to be used in the light-emitting layer according to the invention preferably has an ionization potential (Ip) of from 5.1 eV to 6.4 eV, more preferably from 5.4 eV to 6.2 eV, and even more preferably from 5.6 eV to 6.0 eV. Also, from the viewpoints of enhancing durability and reducing driving voltage, the hole transporting light-emitting material to be used in the light-emitting layer according to the invention preferably has an electron affinity (Ea) of from 1.2 eV to 3.1 eV, more preferably from 1.4 eV to 3.0 eV, and even more preferably from 1.8 eV to 2.8 eV.

Specific examples of the hole transporting light-emitting material include pyrrole compounds, indole compounds, carbazole compounds, imidazole compounds, polyarylalkane compounds, arylamine compounds, styryl compounds, styrylamine compounds, thiophene compounds, condensed polycyclic aromatic compounds, metal complexes, and the like.

Though a metal ion in the foregoing metal complex is not particularly limited, from the viewpoints of enhancing light-emission efficiency, enhancing durability and reducing driving voltage, the metal ion is preferably a transition metal ion or a rare earth metal ion; more preferably an iridium ion, a platinum ion, a gold ion, a rhenium ion, a tungsten ion, a rhodium ion, a ruthenium ion, an osmium ion, a palladium ion, a silver ion, a copper ion, a cobalt ion, a nickel ion, a lead ion or a rare earth metal ion (for example, a europium ion, a gadolinium ion, a terbium ion, or the like); even more preferably an iridium ion, a platinum ion, a gold ion, a rhenium ion, a tungsten ion, a europium ion, a gadolinium ion or a terbium ion; particularly preferably an iridium ion, a platinum ion, a rhenium ion, a europium ion, a gadolinium ion or a terbium ion; and most preferably an iridium ion. Among the metal complexes having iridium ion, metal complexes having a carbon-Ir bond or a nitrogen-Ir bond (in that case, the bond may be any of a coordination bond, an ionic bond or a covalent bond) are especially preferable.

Specific examples of the hole transporting light-emitting material include the following materials, but it should be noted that the present invention is not limited to these materials.

HE-1

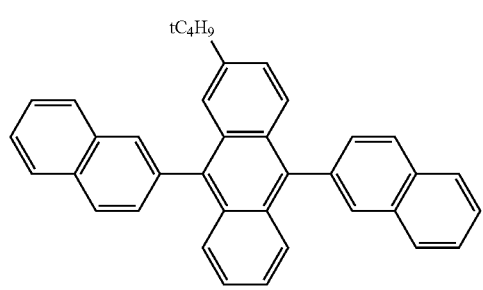

HE-2

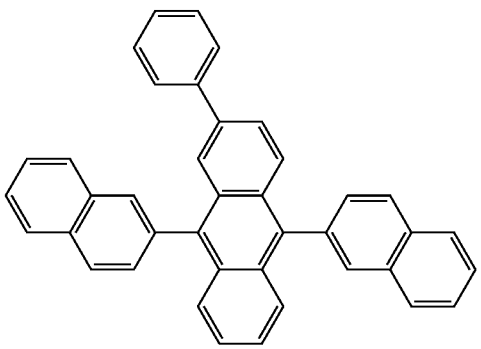

HE-3

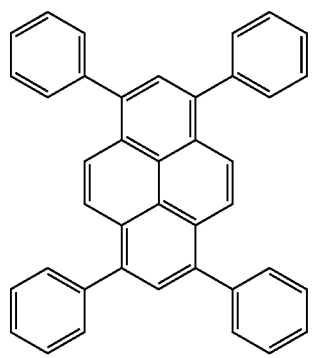

HE-4

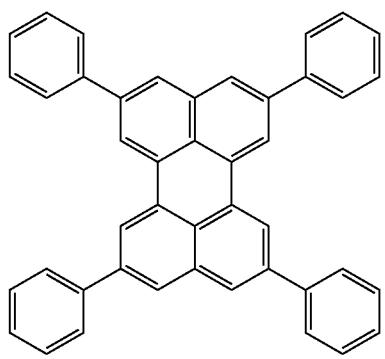

HE-5

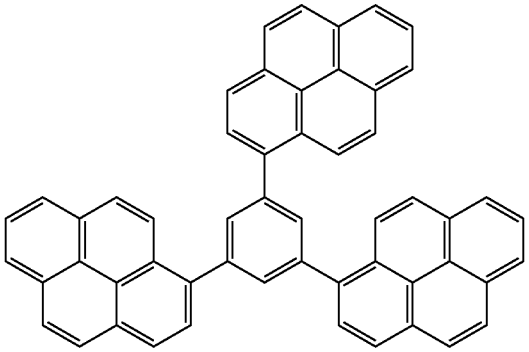

HE-6
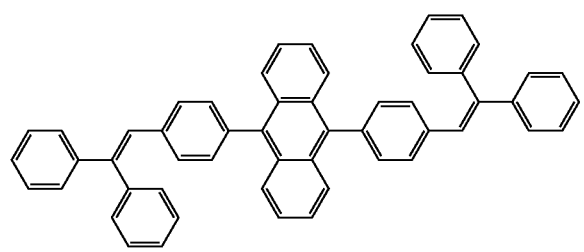
HE-7
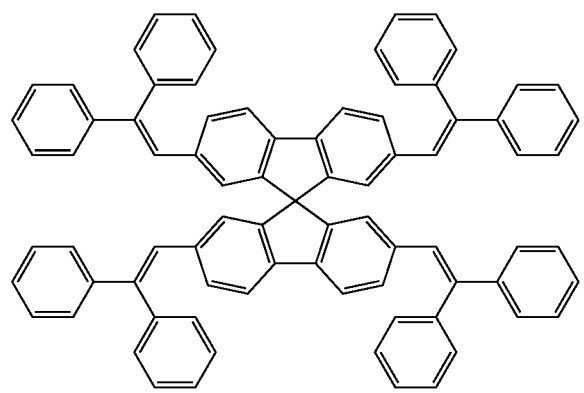
HE-8
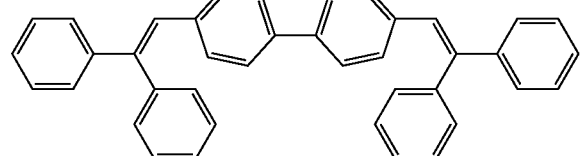
HE-9
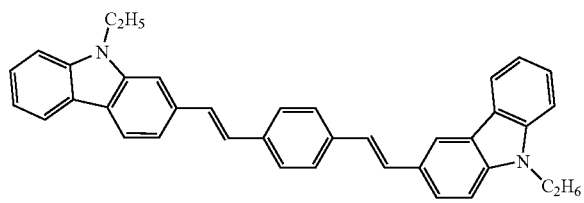
HE-10
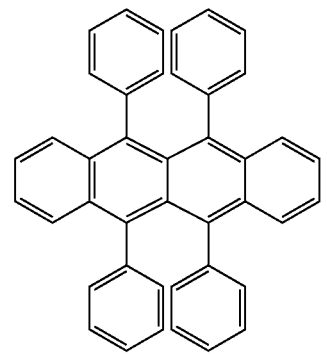
HE-11
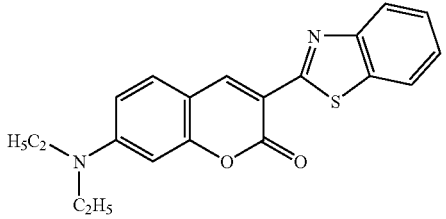
HE-12
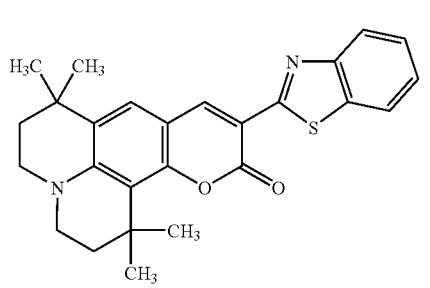
HE-13
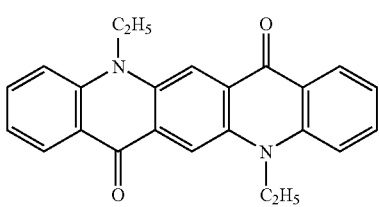
HE-14
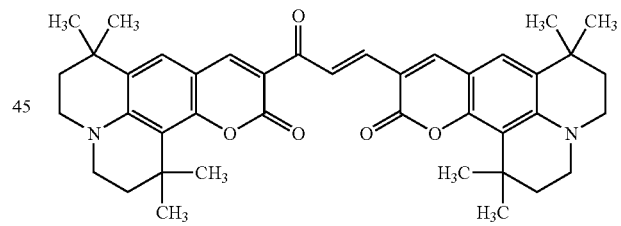
HE-15
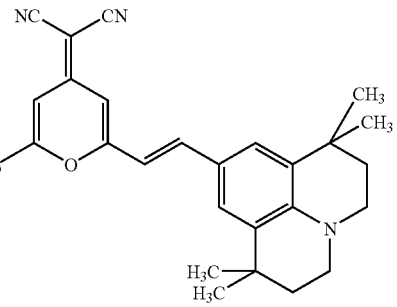

HE-16
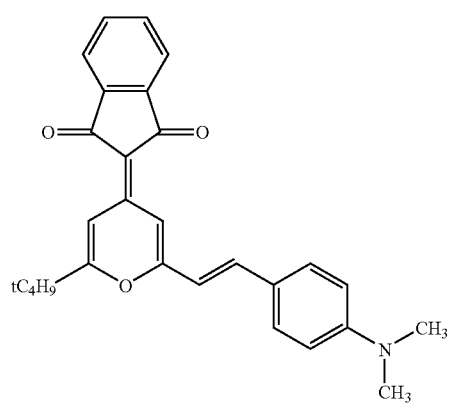
HE-21
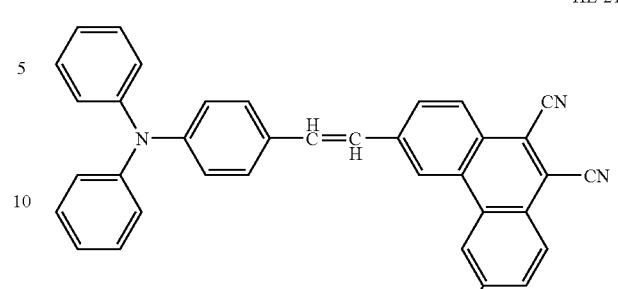
HE-17
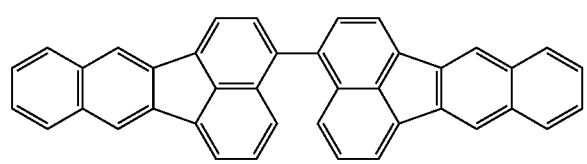
HE-22
HE-18
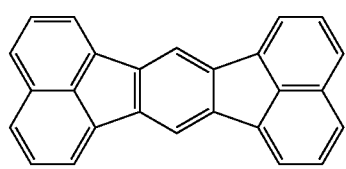
HE-23
HE-19
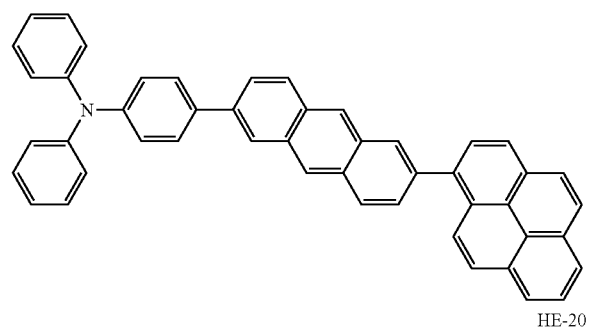
HE-24
HE-20
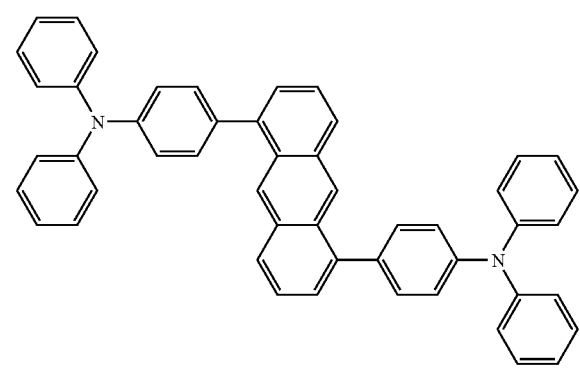
HE-25
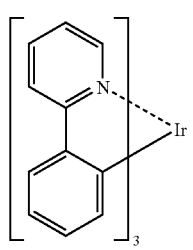

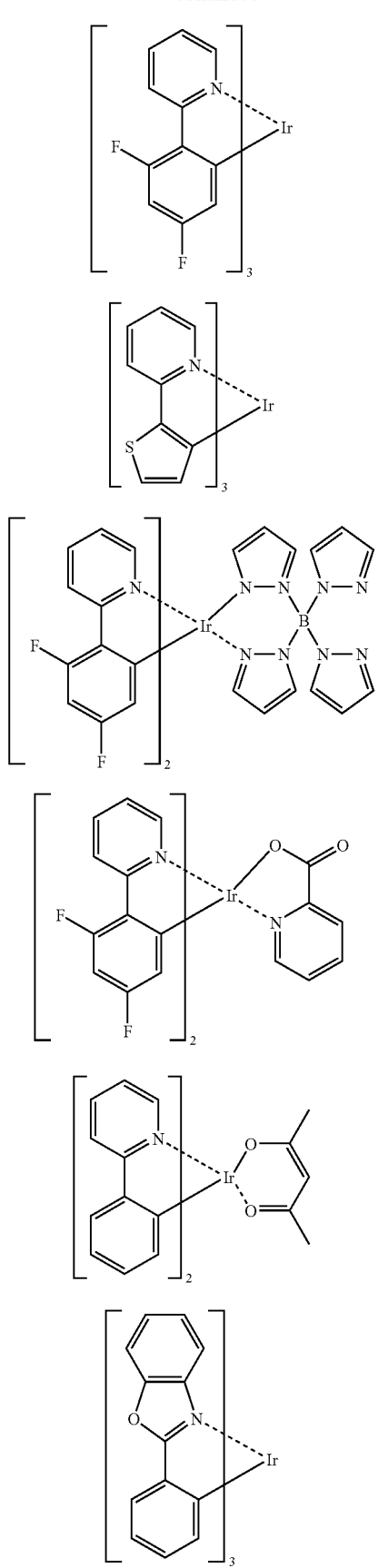
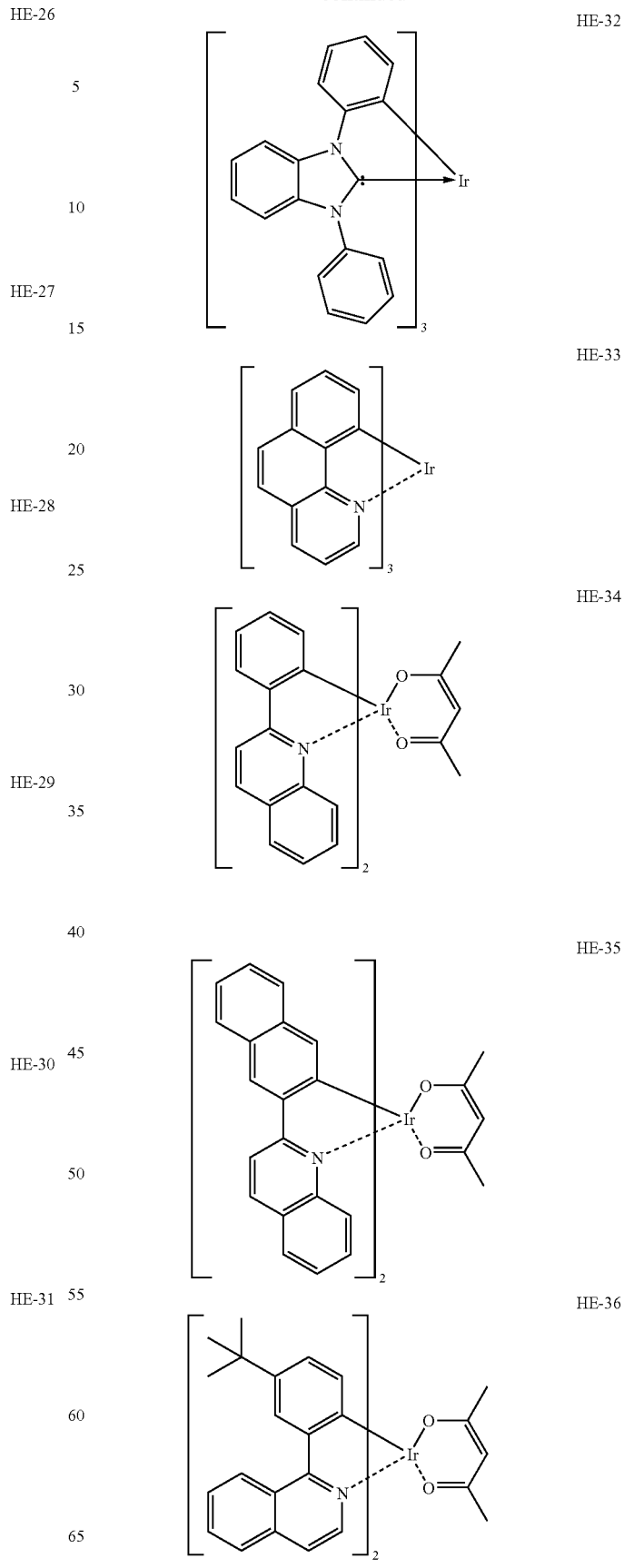

-continued

HE-37
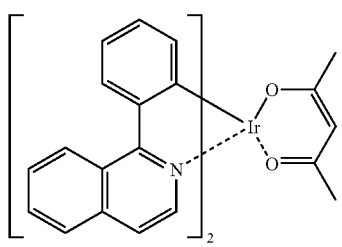

HE-38
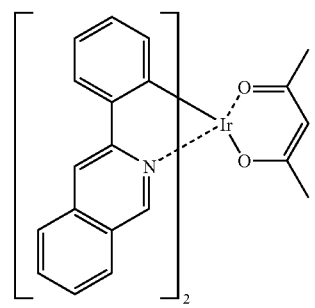

HE-39
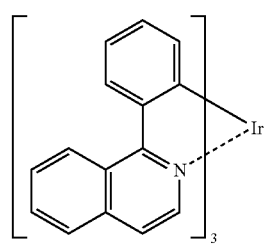

HE-40
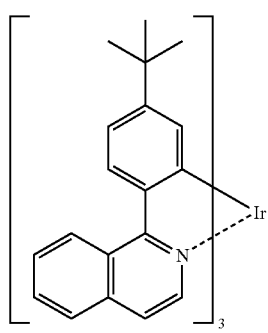

HE-41
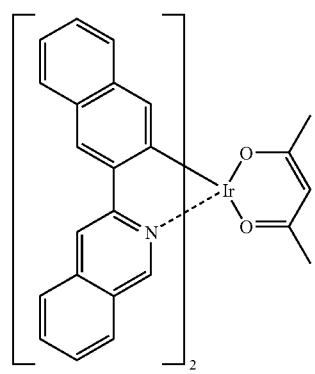

-continued

HE-42
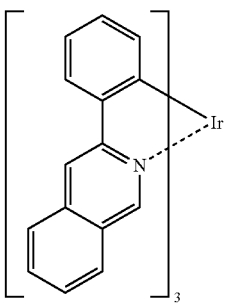

HE-43
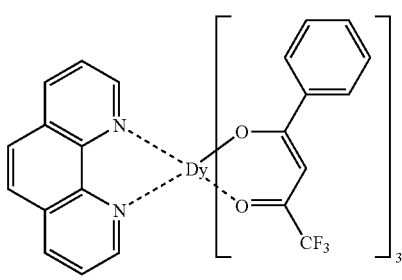

HE-44
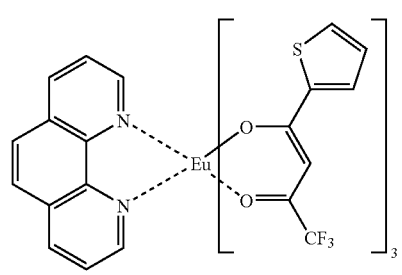

HE-45
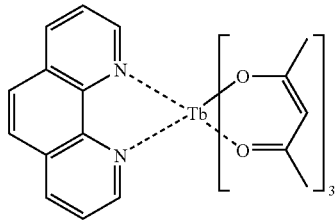

(Electron Transporting Host Material)

The electron transporting host material used in the present invention preferably has an electron affinity Ea of from 2.5 eV to 3.5 eV, more preferably from 2.6 eV to 3.4 eV, and even more preferably from 2.8 eV to 3.3 eV in view of improvement in durability and decrease in driving voltage. Furthermore, it is preferred that an ionization potential Ip of the electron transporting host material is from 5.7 eV to 7.5 eV, more preferably from 5.8 eV to 7.0 eV, and even more preferably from 5.9 eV to 6.5 eV in view of improvement in durability and decrease in driving voltage.

Specific examples of the electron transporting host material include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyrazine, fluorine-substituted aromatic compounds, aromatic ring tetracarboxylic anhydrides of naphthalene, perylene or the like, phthalocyanine, derivatives thereof (which may form a condensed ring with another ring), and a variety of metal complexes represented by metal complexes of an 8-quinolinol derivative, metal phthalocyanine, and metal complexes having benzoxazole or benzothiazole as the ligand.

Preferable electron transporting host materials are metal complexes, azole derivatives (benzimidazole derivatives, imidazopyridine derivatives and the like), and azine derivatives (pyridine derivatives, pyrimidine derivatives, triazine derivatives and the like). Among these, metal complex compounds are preferred in the present invention in view of durability. As the metal complex compound, a metal complex containing a ligand having at least one nitrogen atom, oxygen atom, or sulfur atom to be coordinated to the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferable is a beryllium ion, an aluminum ion, a gallium ion, a zinc ion, a platinum ion, or a palladium ion; and even more preferable is an aluminum ion, a zinc ion, a platinum ion or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Company in 1987; "YUHKI KINZOKU KAGAKU—KISO TO OUYOU—(Organometallic Chemistry—Fundamental and Application—)" authored by Akio Yamamoto, published by Shokabo Publishing Co., Ltd. in 1982; and the like.

The ligands are preferably nitrogen-containing heterocyclic ligands (having preferably 1 to 30 carbon atoms, more preferably 2 to 20 carbon atoms, and particularly preferably 3 to 15 carbon atoms), and they may be a unidentate ligand or a bi- or higher-dentate ligand. Preferable are bi- to hexa-dentate ligands, and mixed ligands of bi- to hexa-dentate ligands with a unidentate ligand are also preferable.

Examples of the ligands include azine ligands (e.g., pyridine ligands, bipyridyl ligands, terpyridine ligands and the like); hydroxyphenylazole ligands (e.g. hydroxyphenylbenzimidazole ligands, hydroxyphenylbenzoxazole ligands, hydroxyphenylimidazole ligands, hydroxyphenylimidazopyridine ligands and the like); alkoxy ligands (those having preferably 1 to 30 carbon atoms, more preferably 1 to 20 carbon atoms, and particularly preferably 1 to 10 carbon atoms, examples of which include methoxy, ethoxy, butoxy, 2-ethylhexyloxy and the like); aryloxy ligands (those having preferably 6 to 30 carbon atoms, more preferably 6 to 20 carbon atoms, and particularly preferably 6 to 12 carbon atoms, examples of which include phenyloxy, 1-naphthyloxy, 2-naphthyloxy, 2,4,6-trimethylphenyloxy, 4-biphenyloxy and the like); heteroaryloxy ligands (those having preferably 1 to 30 carbon atoms, more preferably 1 to 20 carbon atoms, and particularly preferably 1 to 12 carbon atoms, examples of which include pyridyloxy, pyrazinyloxy, pyrimidyloxy, quinolyloxy and the like); alkylthio ligands (those having preferably 1 to 30 carbon atoms, more preferably 1 to 20 carbon atoms, and particularly preferably 1 to 12 carbon atoms, examples of which include methylthio, ethylthio and the like); arylthio ligands (those having preferably 6 to 30 carbon atoms, more preferably 6 to 20 carbon atoms, and particularly preferably 6 to 12 carbon atoms, examples of which include phenylthio and the like); heteroarylthio ligands (those having preferably 1 to 30 carbon atoms, more preferably 1 to 20 carbon atoms, and particularly preferably 1 to 12 carbon atoms, examples of which include pyridylthio, 2-benzimidazolylthio, 2-benzoxazolylthio, 2-benzothiazolylthio and the like); siloxy ligands (those having preferably 1 to 30 carbon atoms, more preferably 3 to 25 carbon atoms, and particularly preferably 6 to 20 carbon atoms, examples of which include a triphenylsiloxy group, a triethoxysiloxy group, a triisopropylsiloxy group and the like); aromatic hydrocarbon anion ligands (those having preferably 6 to 30 carbon atoms, more preferably 6 to 25 carbon atoms, and particularly preferably 6 to 20 carbon atoms, examples of which include a phenyl anion, a naphthyl anion, an anthranyl anion and the like); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion, a benzothiophene anion and the like); indolenine anion ligands and the like. Among these, nitrogen-containing heterocyclic ligands, aryloxy ligands, heteroaryloxy groups, and siloxy ligands are preferable, and nitrogen-containing heterocyclic ligands, aryloxy ligands, siloxy ligands, aromatic hydrocarbon anion ligands, and aromatic heterocyclic anion ligands are more preferable.

Examples of the metal complex electron transporting host material include compounds described, for example, in JP-A Nos. 2002-235076, 2004-214179, 2004-221062, 2004-221065, 2004-221068, 2004-327313 and the like.

Specific examples of these electron transporting host materials include the following materials, but it should be noted that the present invention is not limited thereto.

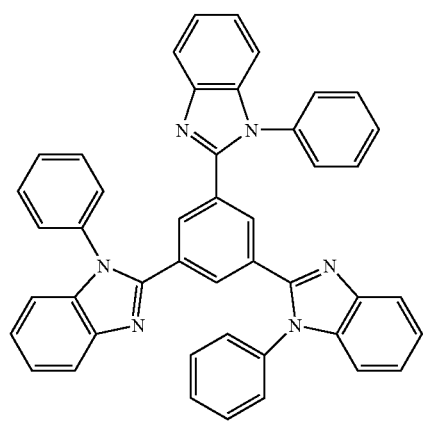

E-1

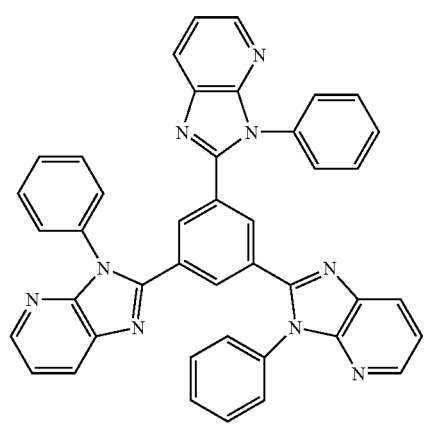

E-2

-continued
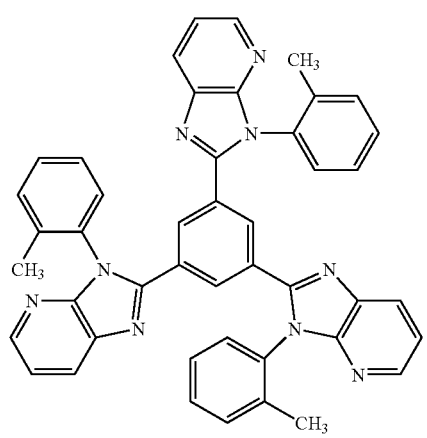
E-3
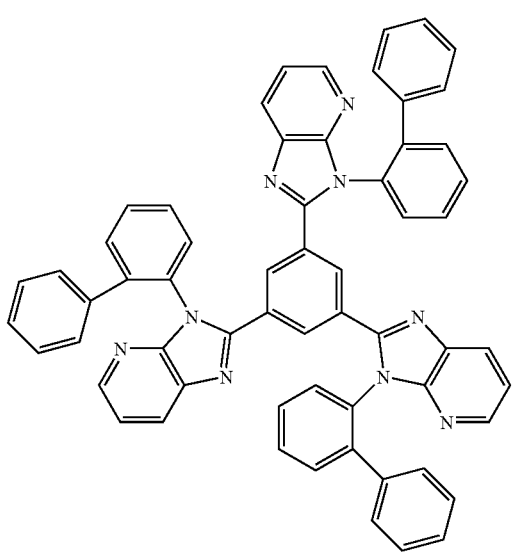
E-4
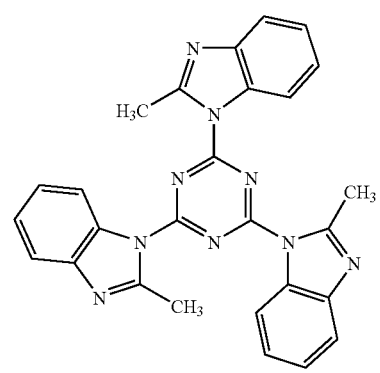
E-5
-continued
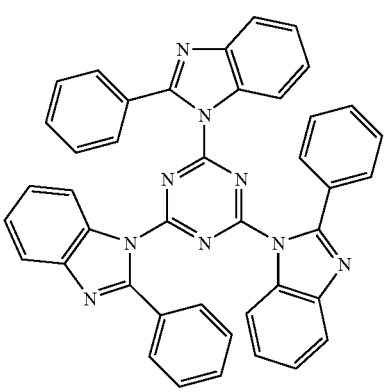
E-6
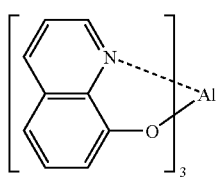
E-7
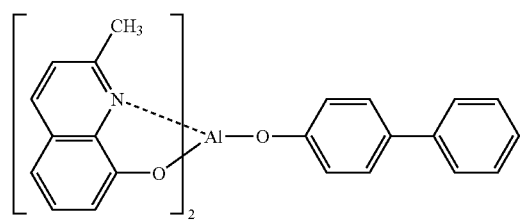
E-8
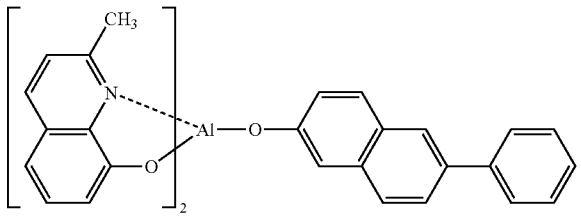
E-9
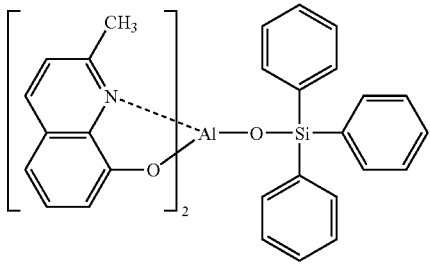
E-10
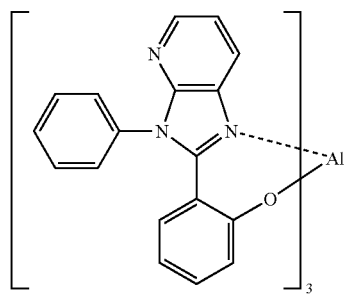
E-11

E-12 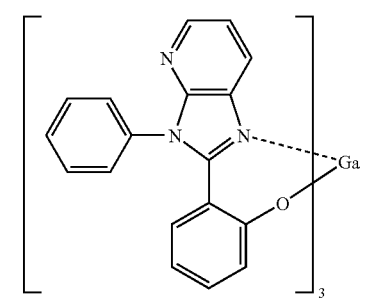

E-13 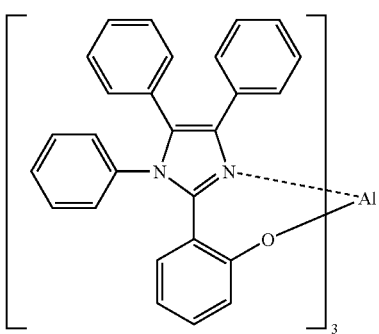

E-14 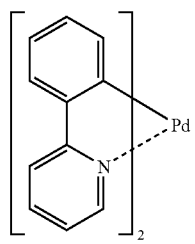

E-15 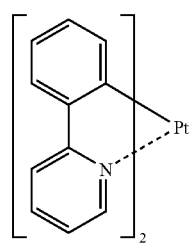

E-16 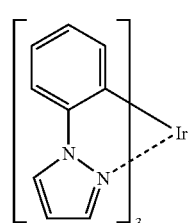

E-17 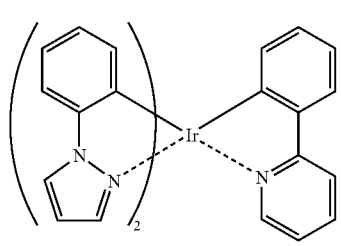

E-18 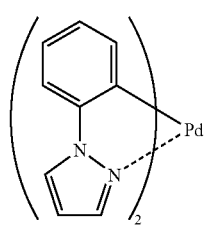

E-19 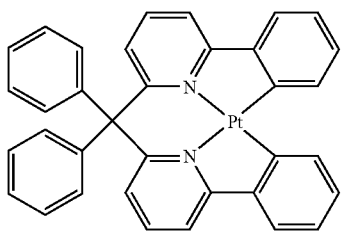

E-20 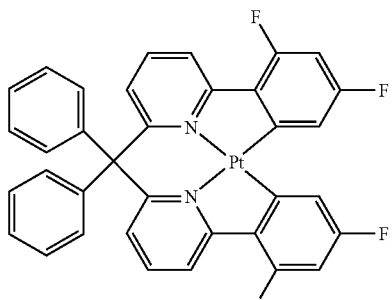

E-21 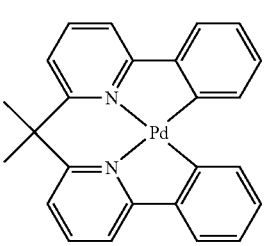

E-22 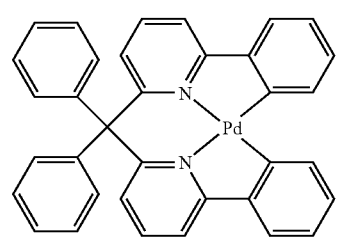

As the electron transporting host material, E-1 to E-6, E-8, E-9, E-10, E-21, or E-22 is preferred, E-3, E-4, E-6, E-8, E-9, E-10, E-21, or E-22 is more preferred, and E-3, E-4, E-21, or E-22 is even more preferred.

In the light-emitting layer of the present invention, it is preferred that when a phosphorescent light-emitting dopant is used as the light-emitting dopant, the lowest triplet excitation energy T1(D) in the phosphorescent light-emitting dopant and the minimum value among the lowest triplet excitation energies T1(H) min in the plural host compounds satisfy the relationship of T1(H) min>T1(D), in view of color purity, external quantum efficiency, and drive durability.

(Hole Transporting Host Material)

The hole transporting host material used in the light-emitting layer according to the present invention preferably has an ionization potential Ip of from 5.1 eV to 6.4 eV, more preferably from 5.4 eV to 6.2 eV, and even more preferably from 5.6 eV to 6.0 eV in view of improvements in durability and decrease in driving voltage. Furthermore, it preferably has an electron affinity Ea of from 1.2 eV to 3.1 eV, more preferably from 1.4 eV to 3.0 eV, and even more preferably from 1.8 eV to 2.8 eV in view of improvements in durability and decrease in driving voltage.

Specific examples of such hole transporting host material include pyrrole, carbazole, azacarbazole, indole, azaindole, triazole, oxazole, oxadiazole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electric conductive high-molecular oligomers such as thiophene oligomers, polythiophenes and the like, organic silanes, carbon films, derivatives thereof, and the like.

Among these, carbazole derivatives, indole derivatives, aromatic tertiary amine compounds, and thiophene derivatives are preferable, and particularly, compounds containing a plurality of carbazole skeletons, indole skeletons and/or aromatic tertiary amine skeletons in the molecule are preferred.

As specific examples of the hole transporting host material described above, the following compounds are listed, but the present invention is not limited thereto.

H-1

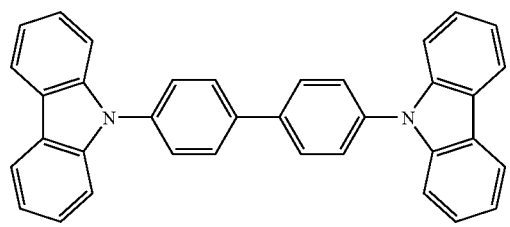

H-2

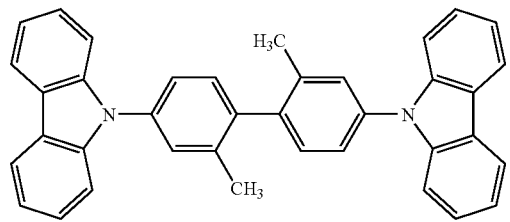

H-3

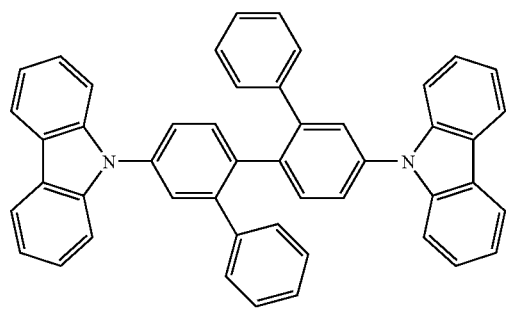

H-4
H-5

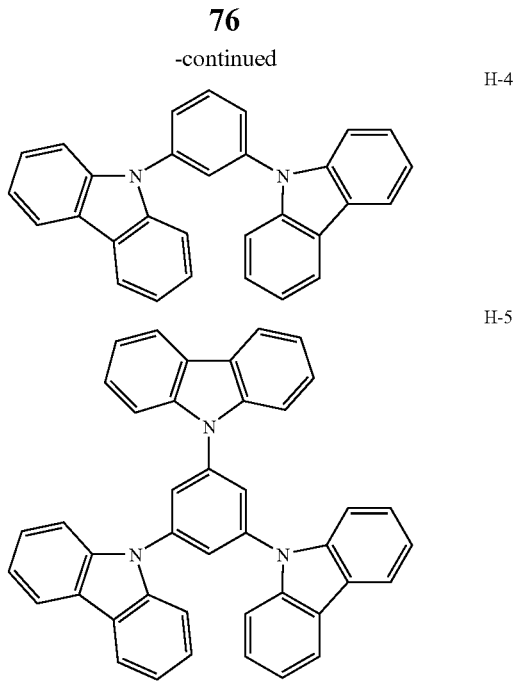

H-6

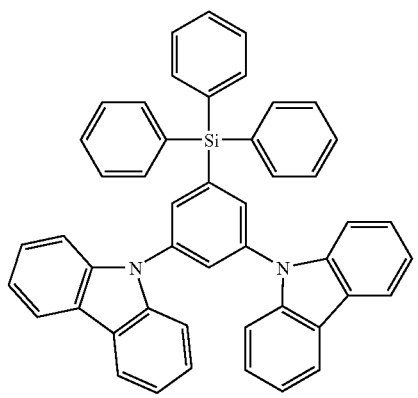

H-7

-continued
H-8
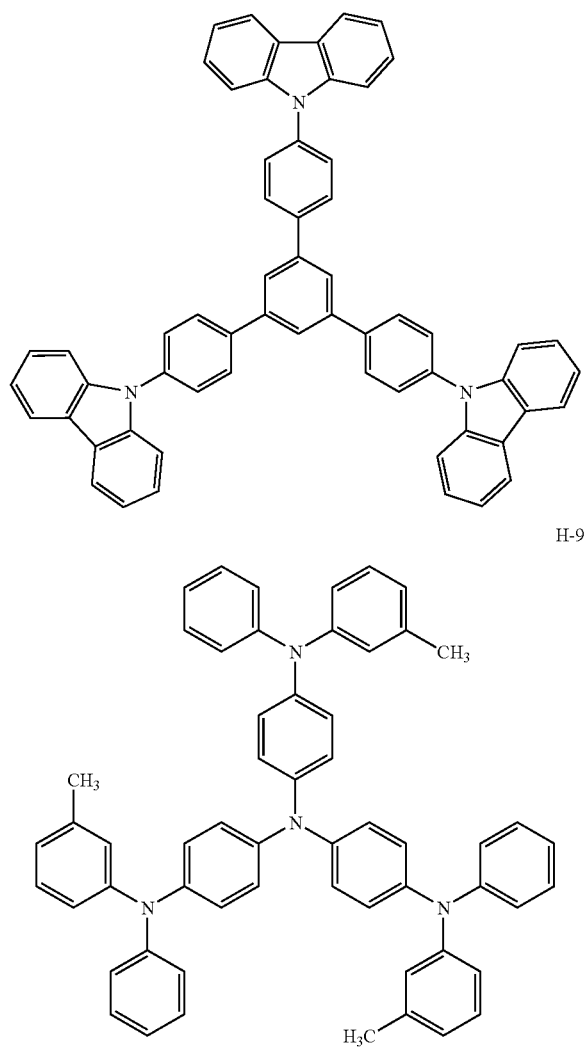
H-9
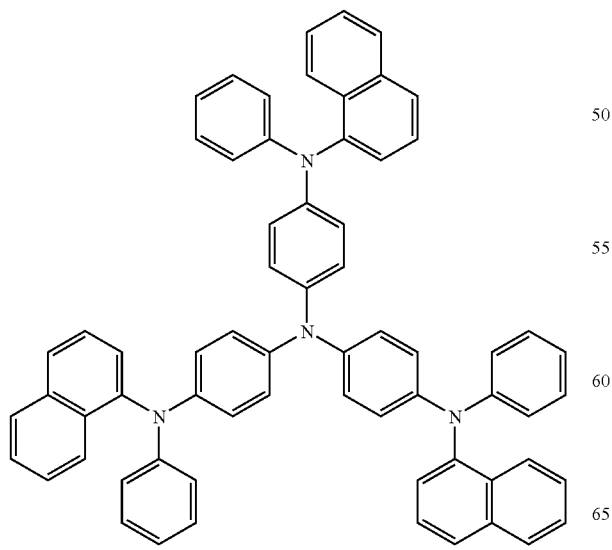
H-10
-continued
H-11
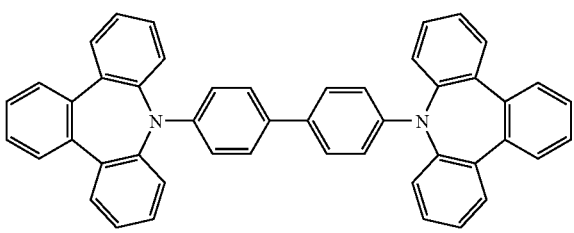
H-12
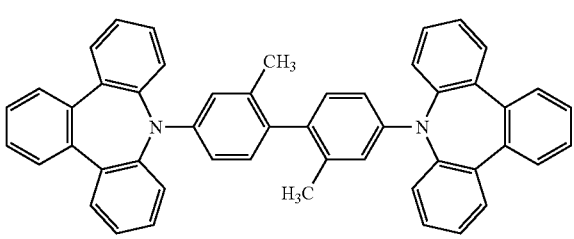
H-13
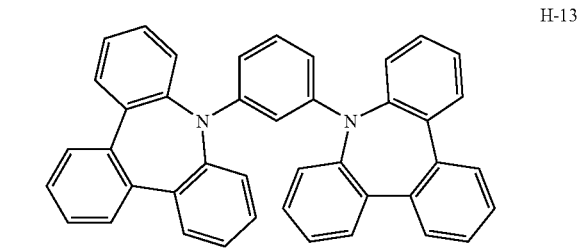
H-14
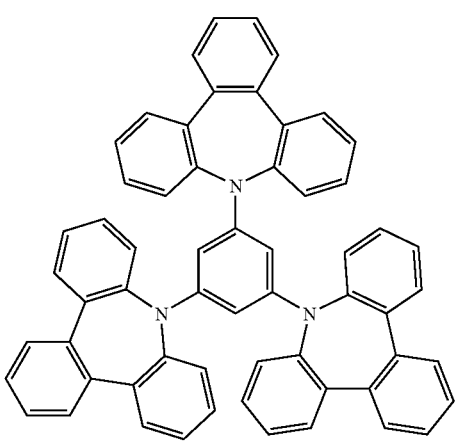

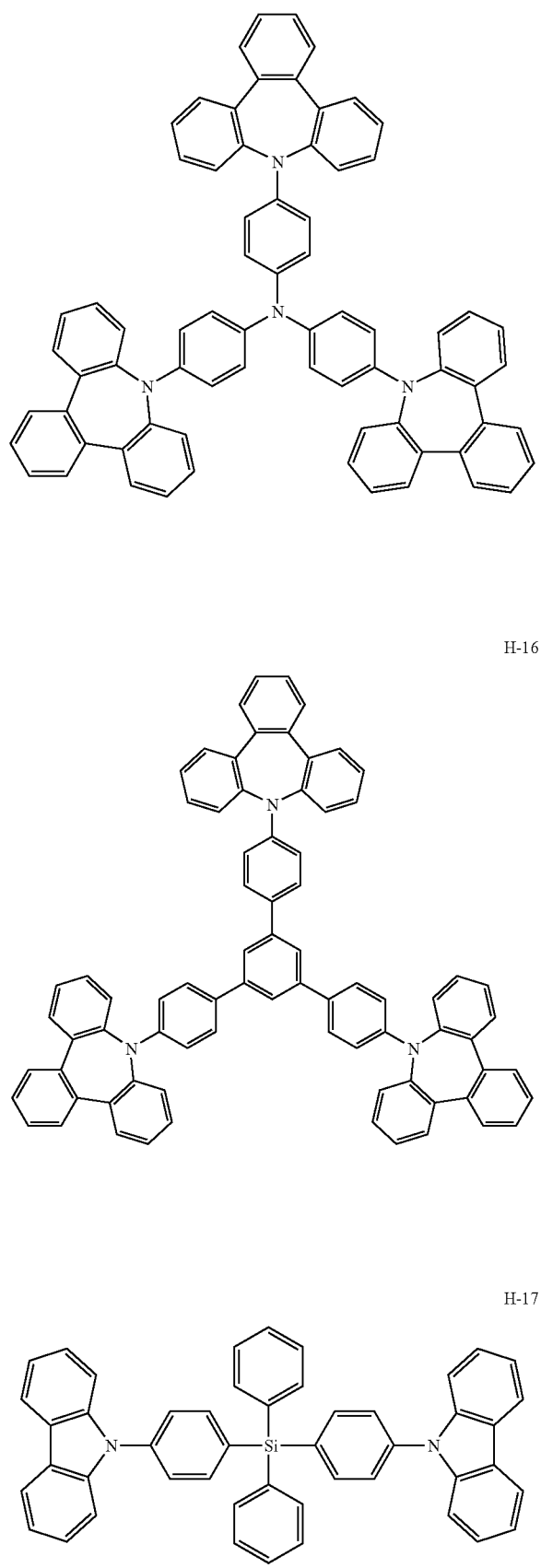

-continued

H-21

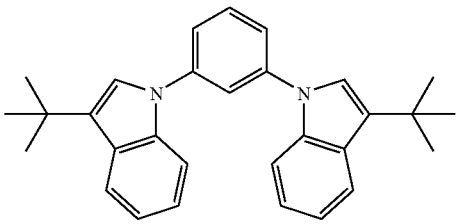

H-22

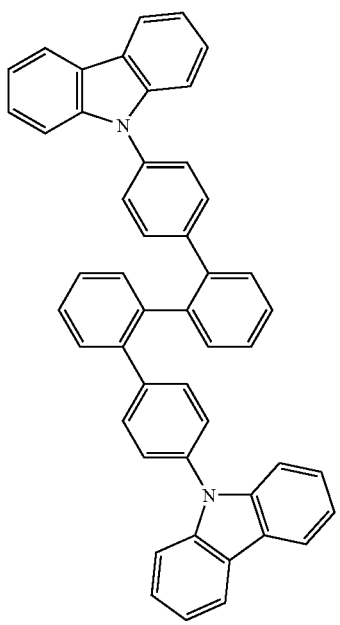

H-23

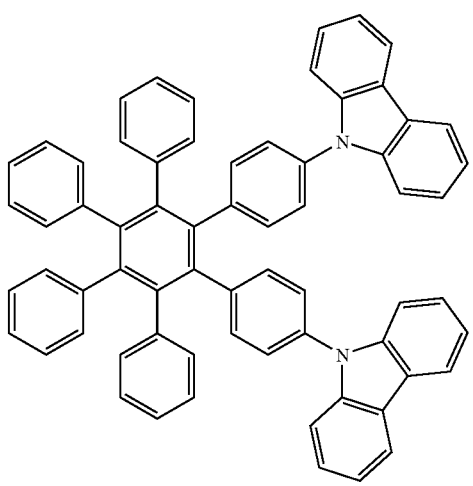

-continued

H-24

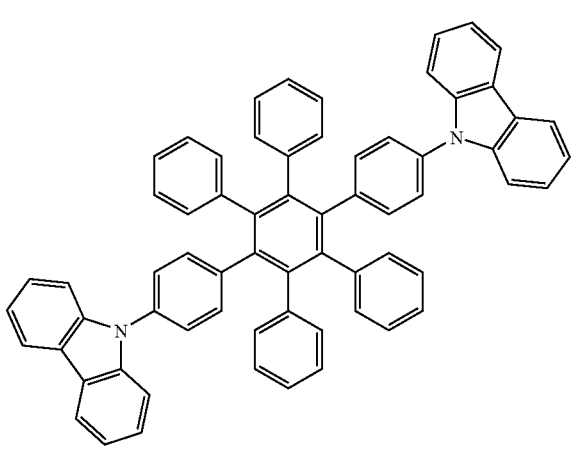

(Mixing Ratio of Light-Emitting Material and Host Material)

—Mixing Ratio of Hole Transporting Host Material and Electron Transporting Light-Emitting Material—

A concentration of the electron transporting light-emitting material in a region of the light-emitting layer in close proximity to the cathode is, in the region, preferably 70% by weight or less, more preferably 60% by weight or less and particularly preferably 50% by weight or less. In a phosphorescent material in particular, when the concentration becomes higher, chromaticity deterioration due to aggregation emission and a higher voltage due to deterioration in charge transportability are unfavorably caused, that is, a range outside the foregoing range is unfavorable.

A concentration of the electron transporting light-emitting material in a region of the light-emitting layer in close proximity to the anode is, in the region, preferably from 0% by weight to 40% by weight, and more preferably from 0% by weight to 20% by weight. In the specification of this application, the term "a region (an interface region) of the light-emitting layer in close proximity to the cathode" is defined to refer to a region extending to a thickness of 10% of the thickness of the whole of the light-emitting layer from an interface on the cathode side of the light-emitting layer; and the term "a region (an interface region) of the light-emitting layer in close proximity to the anode" is defined to refer to a region extending to a thickness of 10% of the thickness of the whole of the light-emitting layer from an interface on the anode side of the light-emitting layer. Also, an average concentration in that region is set within the preferable range described above.

Furthermore, in addition to the conditions described above, a concentration of the lowest concentration region of an electron transporting light-emitting material in the light-emitting layer is, with respect to a concentration of the highest concentration region, preferably 50% or less, more preferably 30% or less, and most preferably 20% or less.

Furthermore, a concentration of the hole transporting host material as well is preferably set to have a concentration gradation in the light-emitting layer. In addition to the hole transporting host material, an electrically inactive diluent may be contained therein.

—Mixing Ratio of Electron Transporting Host Material and Hole Transporting Light-Emitting Material—

A concentration of the hole transporting light-emitting material in a region of a light-emitting layer in close proximity to the anode is, in the region, preferably 70% by weight or less, more preferably 60% by weight or less, and particularly preferably 50% by weight or less. In a phosphorescent light-emitting material in particular, when the concentration becomes higher, chromaticity deterioration due to aggregation emission and a higher voltage due to deterioration in charge transportability are unfavorably caused; that is, a range outside the foregoing range is unfavorable.

A concentration of the hole transporting light-emitting material in a region of the light-emitting layer in close proximity to the cathode is, in the region, preferably from 0% by weight to 30% by weight, and more preferably from 0% by weight to 10% by weight. In the invention, "a region of the light-emitting layer in close proximity to the cathode (or anode)" indicates a region extending to a thickness of 10% of a whole light-emitting layer thickness from a side of the light-emitting layer in close proximity to the cathode (or anode), and an average concentration in the region is set in the preferable range.

In addition to the above-mentioned conditions, a concentration of the lowest concentration region of a hole transporting light-emitting material in the light-emitting layer is, with respect to a concentration of the highest concentration region, preferably 50% or less, more preferably 30% or less, and most preferably 20% or less.

Furthermore, a concentration of the electron transporting host material as well is preferably set to have a concentration gradation in the light-emitting layer. In addition to the electron transporting host material, an electrically inactive diluent may be contained.

(Film Thickness)

A film thickness of the light-emitting layer is preferably from 0.01 μm to 0.5 μm, more preferably from 0.03 μm to 0.4 μm, and even more preferably from 0.06 μm to 0.3 μm from the viewpoints of brightness irregularity, driving voltage and brightness. In the case where the film thickness of the light-emitting layer is too thin, drive at high brightness under low voltage is realized, but since electric resistance of the element becomes smaller, brightness variation due to voltage drop tends to be caused, resulting in causing an increase in the brightness irregularity. In the case where a film thickness of the light-emitting layer is too thick, the driving voltage becomes higher and the light-emission efficiency is lowered; accordingly, an application thereof is limited.

A ratio of a film thickness of a light-emitting layer A to a film thickness of a light-emitting layer B in the present invention is preferably from 1/9 to 9/1, more preferably from 2/8 to 8/2, and even more preferably from 3/7 to 7/3.

(Layer Configuration)

The light-emitting layer may be composed of two layers or three or more layers, and each of the layers may emit light of different colors. Furthermore, in the case where a light-emitting layer has a laminate structure, a film thickness of each of layers that constitutes the laminate structure is not particularly limited. However, a total of film thicknesses of the respective light-emitting layers is preferably set within the range described above.

3. Hole Injection Layer and Hole Transport Layer

The hole injection layer and the hole transport layer are layers functioning to receive holes from an anode or from an anode side and to transport the holes to a cathode side.

As a material for the hole injection layer and the hole transport layer, it is preferred to contain specifically carbazole derivatives, azacarbazole derivatives, indole derivatives, azaindole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, porphyrin compounds, organic silane derivatives, carbon, or the like.

An electron-accepting dopant may be introduced into a hole injection layer or a hole transport layer in the organic EL element of the present invention. As the electron-accepting dopant to be introduced into a hole injection layer or a hole transport layer, either of an inorganic compound or an organic compound may be used as long as the compound has electron accepting property and a property for oxidizing an organic compound.

Specifically, the inorganic compound includes metal halides, such as iron (II) chloride, aluminum chloride, gallium chloride, indium chloride, antimony pentachloride and the like, and metal oxides, such as vanadium pentaoxide, molybdenum trioxide and the like.

In the case of employing an organic compound, compounds having a substituent such as a nitro group, a halogen atom, a cyano group, a trifluoromethyl group or the like; quinone compounds; acid anhydride compounds; fullerenes; or the like may be preferably applied.

Specific examples thereof other than those above include compounds described in patent documents such as JP-A Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643 and the like.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, and fullerene C60 are preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, and 2,3,5,6-tetracyanopyridine are more preferable, and tetrafluorotetracyanoquinodimethane is particularly preferred.

These electron-accepting dopants may be used alone or in a combination of two or more of them. Although an applied amount of these electron-accepting dopants depends on the type of material, 0.01% by weight to 50% by weight is preferred with respect to a hole transport layer material, 0.05% by weight to 20% by weight is more preferred, and 0.1% by weight to 10% by weight is particularly preferred.

A thickness of the hole injection layer and a thickness of the hole transport layer are each preferably 500 nm or less, in view of reducing driving voltage.

The thickness of the hole transport layer is preferably from 1 nm to 200 nm, more preferably from 5 nm to 100 nm, and even more preferably from 10 nm to 60 nm. The thickness of the hole injection layer is preferably from 0.1 nm to 500 nm, more preferably from 0.5 nm to 300 nm, and even more preferably from 1 nm to 200 nm.

The hole injection layer and the hole transport layer may be composed of a monolayer structure comprising one or two or more of the above-mentioned materials, or a multilayer structure composed of plural layers of a homogeneous composition or a heterogeneous composition.

4. Electron Injection Layer and Electron Transport Layer

The electron injection layer and the electron transport layer are layers having functions for receiving electrons from a cathode or from a cathode side, and transporting electrons to an anode side.

Specific examples of the materials applied in the electron injection layer or the electron transport layer include triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, aromatic ring tetracarboxylic anhydrides of perylene, naphthalene or the like, phthalocyanine derivatives, metal complexes represented by metal complexes of an 8-quinolinol derivative, metal phthalocyanine, and metal complexes containing benzoxazole, or benzothiazole as the ligand, organic silane derivatives, and the like.

The electron injection layer or the electron transport layer in the organic EL element of the present invention may contain an electron donating dopant. As the electron donating dopant introduced in the electron injection layer or the electron transport layer, any material may be used as long as it has an electron-donating property and a property for reducing an organic compound, and alkaline metals such as Li, alkaline earth metals such as Mg, transition metals including rare-earth metals, or reducing organic compounds are preferably used. As the metals, particularly, metals having a work function of 4.2 V or less are preferably applied, and specific examples thereof include Li, Na, K, Be, Mg, Ca, Sr, Ba, Y, Cs, La, Sm, Gd, Yb, and the like. Specific examples of the reducing organic compounds include nitrogen-containing compounds, sulfur-containing compounds, phosphorus-containing compounds, and the like.

In addition, materials described in JP-ANos. 6-212153, 2000-196140, 2003-68468, 2003-229278, 2004-342614 and the like may be used.

These electron donating dopants may be used alone or in a combination of two or more of them. An applied amount of the electron donating dopants differs dependent on the types of the materials, but it is preferably from 0.1% by weight to 99% by weight with respect to an electron transport layer material, more preferably from 1.0% by weight to 80% by weight, and particularly preferably from 2.0% by weight to 70% by weight.

A thickness of the electron injection layer and a thickness of the electron transport layer are each preferably 500 nm or less in view of decrease in driving voltage.

The thickness of the electron transport layer is preferably from 5 nm to 200 nm, more preferably from 10 nm to 50 nm. A thickness of the electron injection layer is preferably from 0.1 nm to 50 nm, and more preferably from 0.5 nm to 20 nm.

The electron injection layer and the electron transport layer may be composed of a monolayer structure comprising one or two or more of the above-mentioned materials, or a multilayer structure composed of plural layers of a homogeneous composition or a heterogeneous composition.

5. Substrate

The substrate to be applied in the invention is preferably a substrate which does not scatter or attenuate light emitted from the organic compound layer. Specific examples of materials for the substrate include inorganic materials such as zirconia-stabilized yttrium (YSZ) and glass; polyesters such as polyethylene terephthalate, polybutylene phthalate, and polyethylene naphthalate; and organic materials such as polystyrene, polycarbonate, polyethersulfone, polyarylate, polyimide, polycycloolefin, norbornene resin, polychlorotrifluoroethylene, and the like.

For instance, when glass is used as the substrate, non-alkali glass is preferably used with respect to the quality of material in order to decrease ions eluted from the glass. In the case of employing soda-lime glass, it is preferred to use glass on which a barrier coat of silica or the like has been applied. In the case of employing an organic material, it is preferred to use a material excellent in heat resistance, dimensional stability, solvent resistance, electric insulation performance, and workability.

There is no particular limitation as to the shape, the structure, the size or the like of the substrate, but it may be suitably selected according to the application, purpose and the like of the light-emitting element. In general, a plate-like substrate is preferred as the shape of the substrate. A structure of the substrate may be a monolayer structure or a laminate structure. Furthermore, the substrate may be formed from a single member or two or more members.

Although the substrate may be transparent and colorless, or transparent and colored, it is preferred that the substrate is transparent and colorless from the viewpoint that the substrate does not scatter or attenuate light emitted from the organic light-emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hard-coat layer or an under-coat layer may be further provided as needed.

6. Electrode (Anode)

The anode may generally be any material as long as it has a function as an electrode for supplying holes to the organic compound layer, and there is no particular limitation as to the shape, the structure, the size or the like. However, it may be suitably selected from among well-known electrode materials according to the application and purpose of the light-emitting element. As mentioned above, the anode is usually provided as a transparent anode.

Materials for the anode preferably include, for example, metals, alloys, metal oxides, electric conductive compounds, and mixtures thereof. Materials having a work function of 4.0 eV or more are preferred. Specific examples of the anode materials include electric conductive metal oxides such as tin oxides doped with antimony, fluorine or the like (ATO and FTO), tin oxide, zinc oxide, indium oxide, indium tin oxide (ITO), and indium zinc oxide (IZO); metals such as gold, silver, chromium, and nickel; mixtures or laminates of these metals and the electric conductive metal oxides; inorganic electric conductive materials such as copper iodide and copper sulfide; organic electric conductive materials such as polyaniline, polythiophene, and polypyrrole; and laminates of these inorganic or organic electric conductive materials with ITO. Among these, electric conductive metal oxides are preferred, and particularly, ITO is preferable in view of productivity, high electric conductivity, transparency and the like.

The anode may be formed on the substrate described above in accordance with a method which is appropriately selected from among wet methods such as printing methods, coating methods and the like; physical methods such as vacuum deposition methods, sputtering methods, ion plating methods and the like; and chemical methods such as CVD (chemical vapor deposition) and plasma CVD methods and the like, in consideration of the suitability to a material constituting the anode. For instance, when ITO is selected as a material for the anode, the anode may be formed in accordance with a DC or high-frequency sputtering method, a vacuum deposition method, an ion plating method or the like.

In the organic electroluminescence element of the present invention, a position at which the anode is to be formed is not particularly limited, but it may be suitably selected according to the application and purpose of the light-emitting element. Preferably, the anode is formed on the substrate described above. In this case, the anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in a range of from 10 nm to 50 μm, and preferably from 50 nm to 20 μm.

Electric resistance of the anode is preferably $10^3 \Omega/\square$ or less, and more preferably $10^2 \Omega/\square$ or less. In the case where the anode is transparent, it may be either transparent and colorless, or transparent and colored. For extracting luminescence from the transparent anode side, it is preferred that a light transmittance of the anode is 60% or higher, and more preferably 70% or higher.

Concerning transparent anodes, there is a detailed description in "TOUMEI DENNKYOKU—MAKU NO SHINTENKAI (Novel Developments in Transparent Electrode Films)" edited by Yutaka Sawada, published by C.M.C. in 1999, the contents of which are incorporated by reference herein. In the case where a plastic substrate having a low heat resistance is applied, it is preferred that ITO or IZO is used to obtain a transparent anode prepared by forming a film thereof at a low temperature of 150° C. or lower.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the light-emitting element.

Materials constituting the cathode include, for example, metals, alloys, metal oxides, electric conductive compounds, and mixtures thereof. Materials having a work function of 4.5 eV or less are preferred. Specific examples thereof include alkali metals (e.g., Li, Na, K, Cs and the like), alkaline earth metals (e.g., Mg, Ca and the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron injectability.

Among these, as the materials for constituting the cathode, alkaline metals or alkaline earth metals are preferred in view of electron injectability, and materials containing aluminum as a major component are preferred in view of excellent preservation stability.

The term "material containing aluminum as a major component" refers to a material constituted by aluminum alone; alloys comprising aluminum and 0.01% by weight to 10% by weight of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, the contents of which are incorporated by reference herein.

A method for forming the cathode is not particularly limited, but it may be formed in accordance with a well-known method. For instance, the cathode may be formed in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted between the cathode and the organic compound layer with a thickness of from 0.1 nm to 5 nm. The dielectric layer may be considered to be a kind of electron injection layer. The dielectric material layer may be formed in accordance with, for example, a vacuum deposition method, a sputtering method, an ion plating method or the like.

A thickness of the cathode may be suitably selected according to materials for constituting the cathode and is therefore not definitely decided, but it is usually in a range of from 10 nm to 5 μm, and preferably from 50 nm to 1 μm.

Moreover, the cathode may be transparent or opaque. The transparent cathode may be formed by preparing a material for the cathode with a small thickness of from 1 nm to 10 nm, and further laminating a transparent electric conductive material such as ITO or IZO thereon.

7. Protective Layer

A whole body of the organic EL element of the present invention may be protected by a protective layer.

Any materials may be applied in the protective layer as long as the materials have a function to prevent penetration of ingredients such as moisture, oxygen or the like, which accelerates deterioration of the element, into the element.

Specific examples of materials for the protective layer include metals such as In, Sn, Pb, Au, Cu, Ag, Al, Ti, Ni and the like; metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

8. Sealing

The whole organic electroluminescence element of the present invention may be sealed with a sealing cap.

Furthermore, a moisture absorbent or an inert liquid may be used to seal a space defined between the sealing cap and the light-emitting element. Although the moisture absorbent is not particularly limited, specific examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite, magnesium oxide and the like. Although the inert liquid is not particularly limited, specific examples thereof include paraffins; liquid paraffins; fluorocarbon solvents such as perfluoroalkanes, perfluoroamines, perfluoroethers and the like; chlorine-based solvents; silicone oils; and the like.

9. Driving

In the organic electroluminescence element of the present invention, when DC (AC components may be contained as needed) voltage (usually 2 volts to 15 volts) or DC is applied across the anode and the cathode, luminescence can be obtained.

For the driving method of the organic electroluminescence element of the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

10. Applications

An organic EL element according to the invention has such wide ranging applications as a mobile phone display, a personal digital assistant (PDA), a computer display, a car information display, a TV monitor, and general illumination.

All publications, patent applications, and technical standards mentioned in this specification are herein incorporated by reference to the same extent as if each individual publication, patent application, or technical standard was specifically and individually indicated to be incorporated by reference.

EXAMPLES

In the following, the organic EL element of the present invention will be explained by examples thereof, but the invention is by no means limited by such examples.

Example 1

1. Preparation of Organic EL Element

1) Preparation of Inventive Element No. 1 The organic EL element of the present invention having a structure shown in FIG. 1 was prepared.

A glass substrate 1 (manufactured by Geomatec Co., Ltd., surface electric resistance: 10Ω/□, size: 0.5 mm in thickness and 2.5 cm square) having an anode 2, which is a deposited layer of indium-tin oxide (which is referred to as ITO), was placed in a cleaning vessel, subjected to an ultrasonic cleaning in 2-propanol and then subjected to an UV-ozone treatment for 30 minutes. On this transparent anode, the following layers were deposited in order by a vacuum deposition method. In the examples of the invention, the deposition rate is 0.2 nm/sec unless specified otherwise. The deposition rate was measured using a quartz-crystal oscillator. Also film thicknesses described in the following were measured using a quartz-crystal oscillator.

Hole Injection Layer 3: 4,4',4"-tris(2-naphthylphenylamino)triphenylamine (which is referred to as 2-TNATA) and 2,3,5,6-tetrafluoro-7,7,8,8-tetracyanoquinodimethane (which is referred to as F4-TCNQ) were co-deposited so that the amount of F4-TCNQ would be 1.0% by weight with respect to the amount of 2-TNATA. The thickness was 160 nm.

Hole transport layer 4: N,N'-dinaphthyl-N,N'-diphenyl-[1,1'-biphenyl]-4,4'-diamine (which is referred to as α-NPD) was deposited at a thickness of 10 nm.

Light-emitting layer A 5: 4,4'-di-(N-carbazole)-biphenyl (which is referred to as CBP), which is a hole-transporting host, and electron-transporting light-emitting material Pt-1 were co-deposited while changing the co-deposition amount thereof as the deposition was progressing. The deposition rate of each component was controlled so that the mixing ratio of Pt-1 would be 0% by weight in the region of the light-emitting layer A adjacent to the hole transport layer at the beginning of the deposition; and the mixing ratio of Pt-1 would be 30% by weight in the region of the light-emitting layer A adjacent to the light-emitting layer B (described below) at the end of the deposition. The mixing ratio of each component was continuously changed between these regions. The thickness of the light-emitting layer A was 30 nm.

Light-emitting layer B 6: on the light-emitting layer A, electron-transporting host ETM-1 and tris(2-phenylpyridine) iridium (III) (which is referred to as Ir(ppy)$_3$), which is a hole-transporting light-emitting material, were co-deposited while changing the co-deposition amount thereof as the deposition was progressing. The deposition rate of each component was controlled so that the mixing ratio of Ir(ppy)$_3$ would be 30% by weight in the region of the light-emitting layer B adjacent to the light-emitting layer A at the beginning of the deposition; and the mixing ratio of Ir(ppy)$_3$ would be 0% by weight in the region of the light-emitting layer B adjacent to the electron transport layer at the end of the deposition. The mixing ratio of each component was continuously changed between these regions. The thickness of the light-emitting layer B was 30 nm.

Subsequently, on the light-emitting layer B, the following electron transport layer and electron injection layer were provided.

Electron transport layer 7: aluminium (III) bis(2-methyl-8-quinolinato)-4-phenylphenolate (which is referred to as BAlq) was deposited. The thickness was 40 nm.

Electron injection layer 8: lithium fluoride (LiF) was deposited. The thickness was 1 nm.

Cathode 9: further, patterning was performed using a shadow mask, and aluminum metal (Al) with a thickness of 100 nm was provided as a cathode.

Each layer was provided by resistance heating vacuum deposition.

The lamination body thus produced was placed in a glove box substituted with nitrogen gas, and was sealed using a stainless-steel sealing cap to which a desiccating agent was stuck and an ultraviolet-curable adhesive (XNR5516HV, manufactured by Nagase-Ciba Co., Ltd.).

2) Preparation of Comparative Element No. 1

Preparation of comparative element No. 1 was conducted in a similar manner to the process in the preparation of the inventive element No. 1, except that, in the inventive element No. 1, the light-emitting layer B was changed to the following layer.

Light-emitting layer B: the light-emitting layer B was removed, and instead of this, ETM-1 was deposited as a second electron transport layer. The film thickness was 30 nm.

3) Preparation of Comparative Element No. 2

Preparation of comparative element No. 2 was conducted in a similar manner to the process in the preparation of the inventive element No. 1, except that, in the inventive element No. 1, the light-emitting layer A was changed to the following layer.

Light-emitting layer A: the light-emitting layer A was removed, and instead of this, CBP was deposited as a second hole transport layer. The film thickness was 30 nm.

Chemical structures of the compounds used in Examples are shown below.

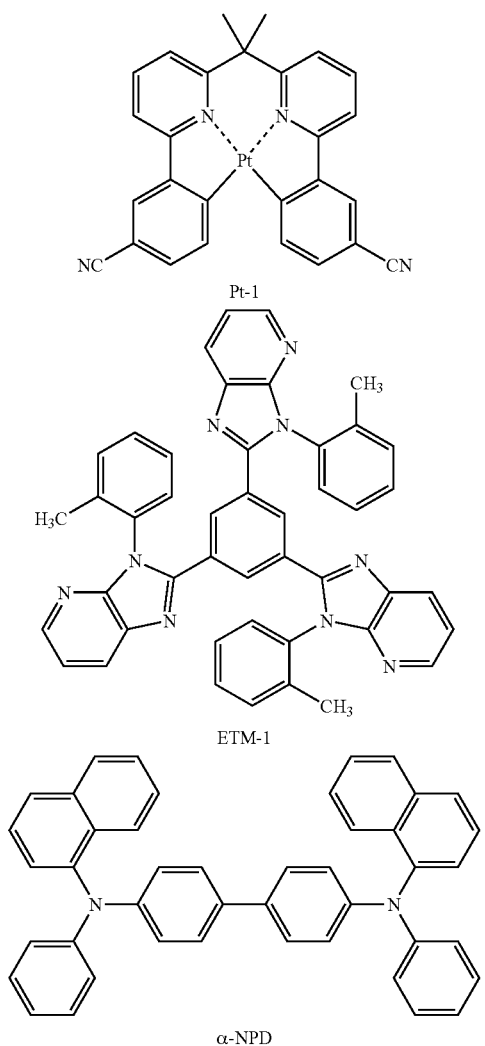

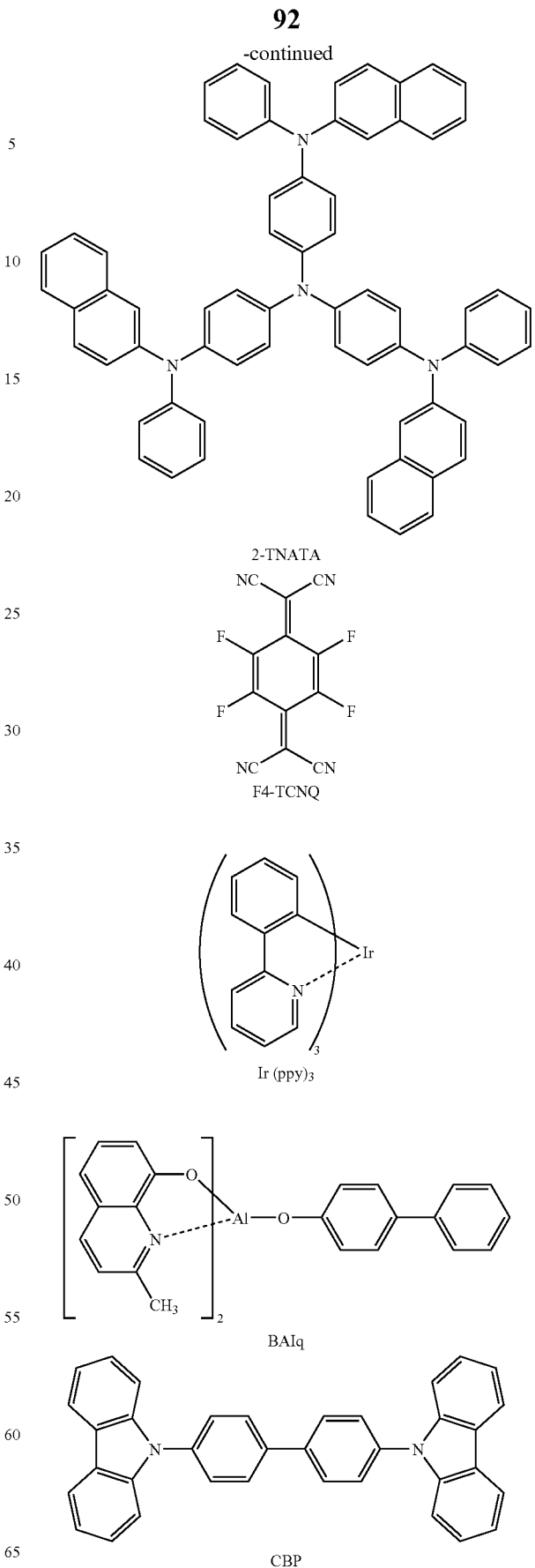

2. Results of Performance Evaluation

External quantum efficiency and drive durability of the obtained comparative organic EL elements and inventive organic EL element were measured by the following means under the same conditions.

<<Driving Voltage>>

The driving voltage is expressed in terms of DC voltage at a brightness of 360 cd/m$^2$.

<<Method of Measuring External Quantum Efficiency>>

DC voltage was applied to the prepared light-emitting elements using a source measuring unit, model 2400, manufactured by KEITHLEY, to emit light. The voltage was adjusted so that the emitted light would have a brightness of 100 cd/m$^2$. The emission spectrum and light quantity thereof were measured using a brightness photometer SR-3, manufactured by Topcon Corporation, and external quantum efficiency was calculated from the emission spectrum, the light quantity, and the electric current at the time of measurement. Further, the brightness was raised to 10,000 cd/m$^2$, and the external quantum efficiency at high brightness was measured.

<<Method of Measuring Drive Durability>>

DC voltage was applied to each element to emit light having a brightness of 360 cd/m$^2$. Then, the element was subjected to continuous driving at a constant current, and the time until the brightness was reduced to 180 cd/m$^2$ was measured as the brightness half-value time. In terms of this brightness half-value time, drive durability is expressed. The brightness half-value time of samples are shown as relative values, with the value of the comparative element No. 1 designated as 1.

The obtained results are shown in Table 1. The inventive element No. 1 exhibits unexpectedly high external quantum efficiency and excellent drive durability, as compared with the comparative element Nos. 1 and 2.

Particularly, in the inventive element No. 1, light-emission efficiency at high brightness is remarkably improved.

TABLE 1

| Element No. | Driving Voltage (V) | External Quantum Efficiency (%) (at Brightness of 100 cd/m$^2$) | External Quantum Efficiency (%) (at Brightness of 10,000 cd/m$^2$) | Brightness Half-Value Time (ratio) (at Initial Brightness of 360 cd/m$^2$) |
|---|---|---|---|---|
| Inventive Element No. 1 | 10.2 | 12.8 | 11.3 | 44.2 |
| Comparative Element No. 1 | 11.0 | 8.8 | 5.7 | 1 |
| Comparative Element No. 2 | 11.4 | 12.0 | 6.8 | 10.5 |

Example 2

Preparation of inventive element No. 2 was conducted in a similar manner to the process in the preparation of the inventive element No. 1 of Example 1, except that, in the preparation of the inventive element No. 1, mCP was used instead of CBP as a hole-transporting host and Pt-2 was used instead of Pt-1 as an electron-transporting light-emitting material in the light-emitting layer A, and BAlq was used instead of ETM-1 as an electron-transporting host and Ir-1 was used instead of Ir(ppy)$_3$ as a hole-transporting light-emitting material in the light-emitting layer B. As a result, an element exhibiting high efficiency and high durability was obtained.

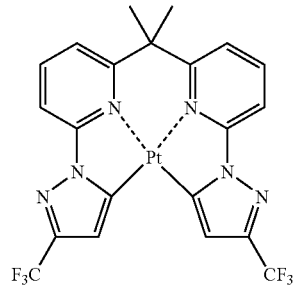

Pt-2

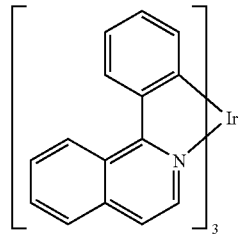

Ir-1

Example 3

Preparation of inventive element No. 3 was conducted in a similar manner to the process in the preparation of the inventive element No. 2, except that, in the inventive element No. 2, light-emitting layer C, in which CBP and PT-1 were used respectively as a host material and a light-emitting material, was additionally disposed between the light-emitting layer A and the light-emitting layer B so that the configuration of the light-emitting layer would be light-emitting layer A/light-emitting layer C/light-emitting layer B in this order from the anode side. Each of the light-emitting layers A, B, and C was prepared so that the thickness thereof would be 20 nm.

The inventive element No. 3 provides a white-light emission and exhibits high efficiency and high durability.

What is claimed is:

1. An organic electroluminescence element comprising at least two light-emitting layers disposed between an anode and a cathode, wherein the at least two light-emitting layers include:
   (1) a light-emitting layer A that contains an electron transporting light-emitting material and a hole transporting host material, wherein a concentration of the electron transporting light-emitting material gradually increases on the whole from an anode side toward a cathode side of the light-emitting layer A; and
   (2) a light-emitting layer B that contains a hole transporting light-emitting material and an electron transporting host material, wherein a concentration of the hole transporting light-emitting material gradually decreases on the whole from an anode side toward a cathode side of the light-emitting layer B,
   wherein the light-emitting layer A is disposed closer to the anode than the light-emitting layer B, and the light-emitting layer B is disposed closer to the cathode than the light-emitting layer A.

2. The organic electroluminescence element according to claim 1, wherein the light-emitting layer A and the light-emitting layer B are disposed adjacent to each other.

3. The organic electroluminescence element according to claim 1, wherein:

in the light-emitting layer A, a concentration of the electron transporting light-emitting material, which gradually increases from the anode side toward the cathode side, is from 0% to 50% in an interface region of the light-emitting layer A on the anode side, with respect to a concentration thereof in an interface region of the light-emitting layer A on the cathode side; and in the light-emitting layer B, a concentration of the hole transporting light-emitting material, which gradually decreases from the anode side toward the cathode side, is from 0% to 50% in an interface region of the light-emitting layer B on the cathode side, with respect to a concentration thereof in an interface region of the light-emitting layer B on the anode side.

4. The organic electroluminescence element according to claim 1, wherein the electron transporting light-emitting material comprises a metal complex having a tri- or higher-dentate ligand.

5. The organic electroluminescence element according to claim 4, wherein the metal complex having a tri- or higher-dentate ligand is a compound represented by the following formula (I):

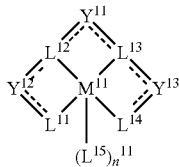

Formula (I)

wherein in formula (I), $M^{11}$ represents a metal ion; $L^{11}$ to $L^{15}$ each independently represent a ligand which coordinates to $M^{11}$; an atomic group may further exist between $L^{11}$ and $L^{14}$ to form a cyclic ligand; $L^{15}$ may bond to both of $L^{11}$ and $L^{14}$ to form a cyclic ligand; $Y^{11}$, $Y^{12}$ and $Y^{13}$ each independently represent a linking group, a single bond or a double bond; when $Y^{11}$, $Y^{12}$ or $Y^{13}$ is a linking group, bonds between $L^{11}$ and $Y^{12}$, $Y^{12}$ and $L^{12}$, $L^{12}$ and $Y^{11}$, $Y^{12}$ and $L^{13}$, $L^{13}$ and $Y^{13}$, and $Y^{13}$ and $L^{14}$ each independently represent a single bond or a double bond; $n^{11}$ is from 0 to 4; and bonds between $M^{11}$ and $L^{11}$ to $L^{15}$ are each independently a coordination bond, an ionic bond or a covalent bond.

6. The organic electroluminescence element according to claim 5, wherein in formula (I), $M^{11}$ is a platinum ion.

7. The organic electroluminescence element according to claim 1, wherein the hole transporting light-emitting material comprises an iridium complex.

8. The organic electroluminescence element according to claim 1, wherein the electron transporting host material is at least one selected from the group consisting of the following compounds E-1 to E-22

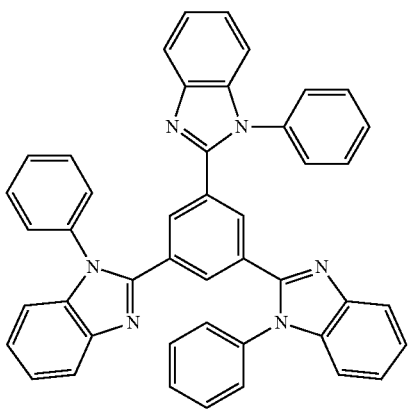

E-1

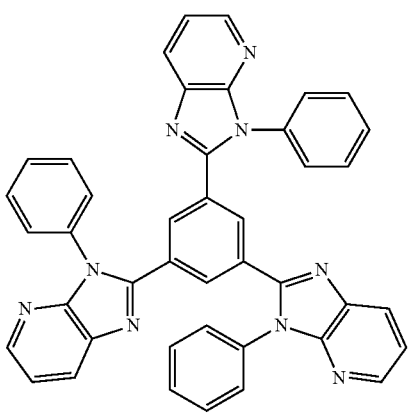

E-2

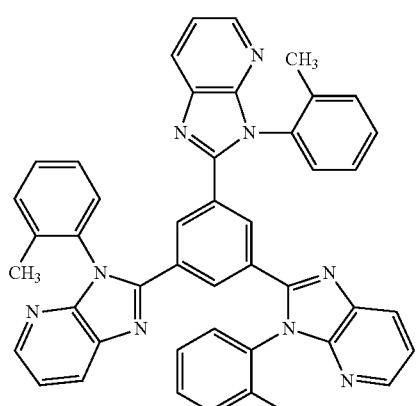

E-3

-continued
E-4
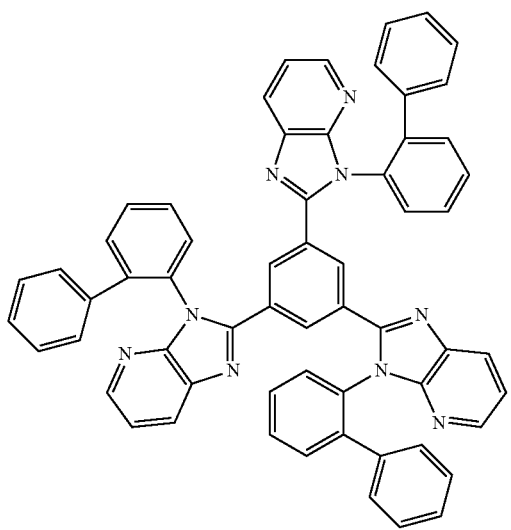
E-5
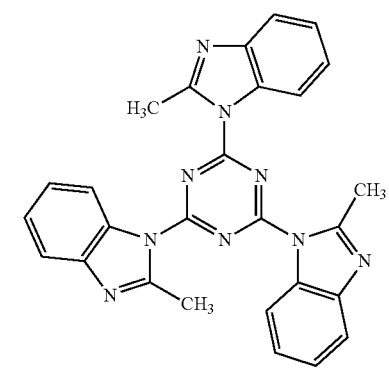
E-6
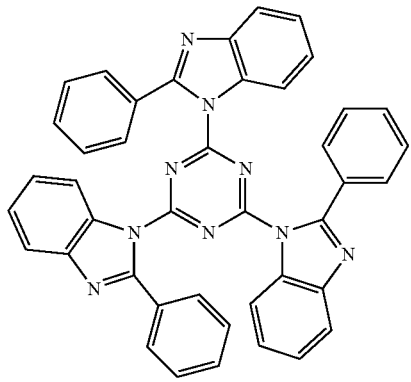
E-7
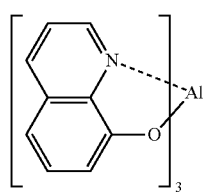
-continued
E-8
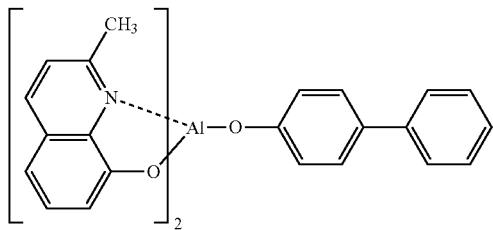
E-9
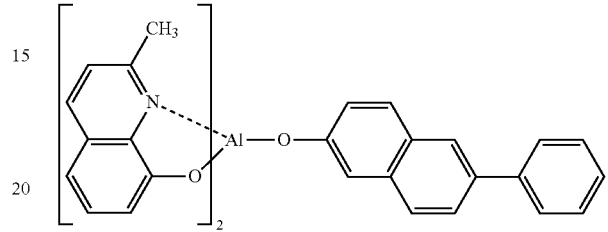
E-10
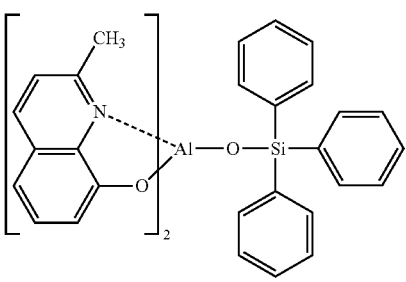
E-11
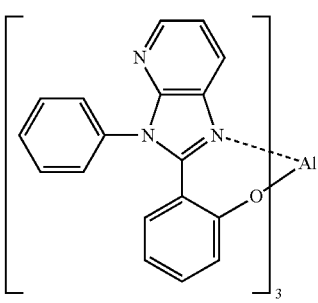
E-12
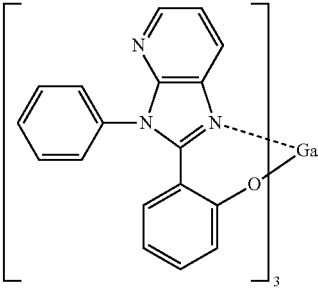

-continued
E-13 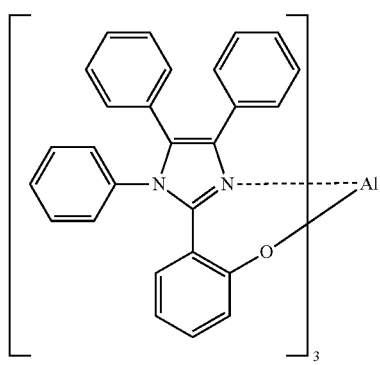
E-14 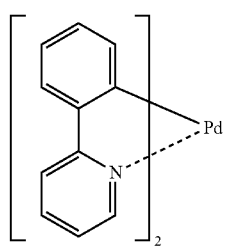
E-15 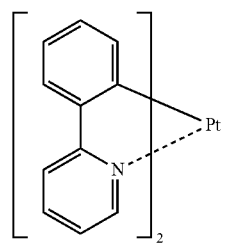
E-16 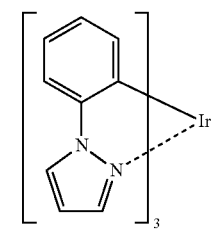
E-17 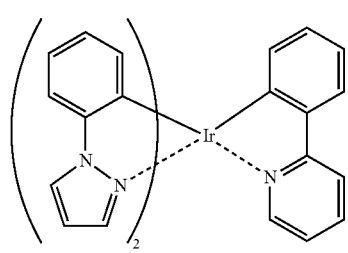
E-18 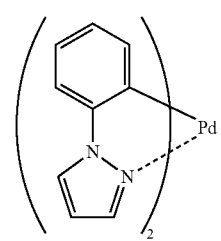
-continued
E-19 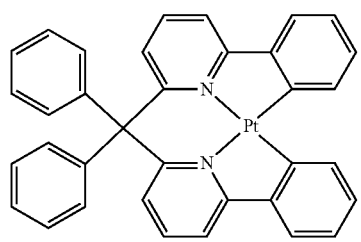
E-20 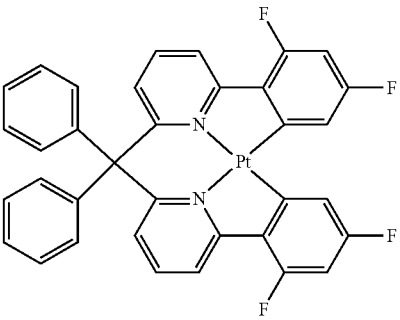
E-21 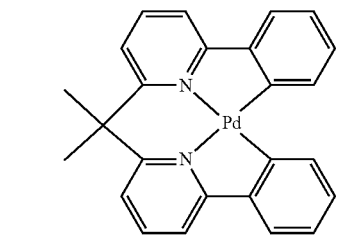
E-22 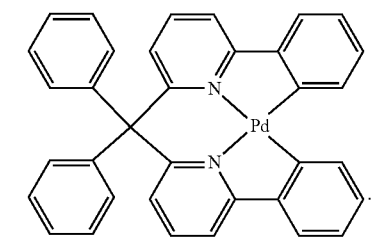
9. The organic electroluminescence element according to claim 1, wherein the electron transporting host material is at least one selected from the group consisting of the following compounds E-1 to E-6, E-8, E-9, E-10, E-21 and E-22
E-1 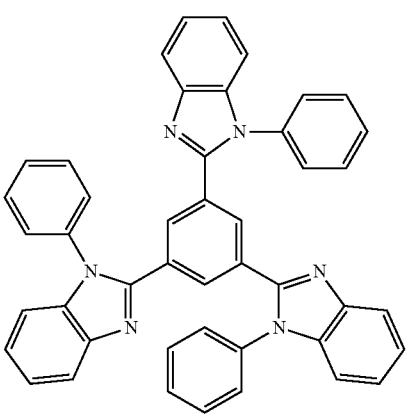

-continued
E-2
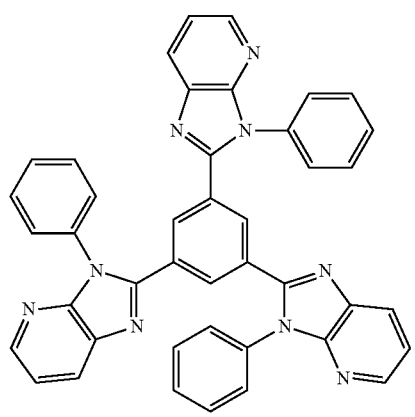
E-3
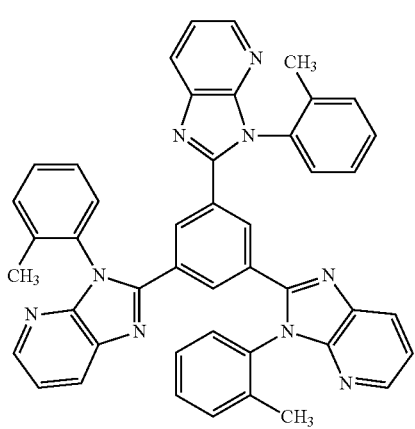
E-4
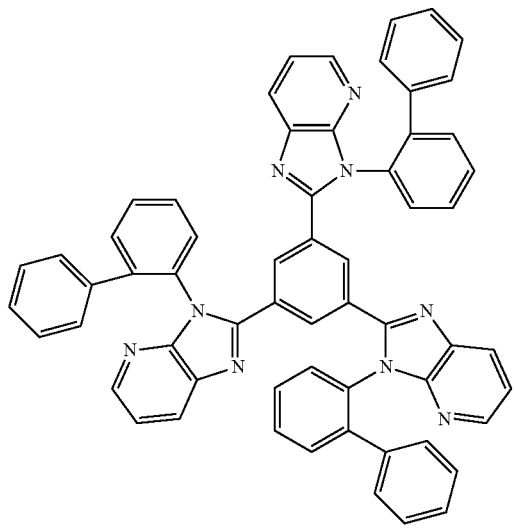
-continued
E-5
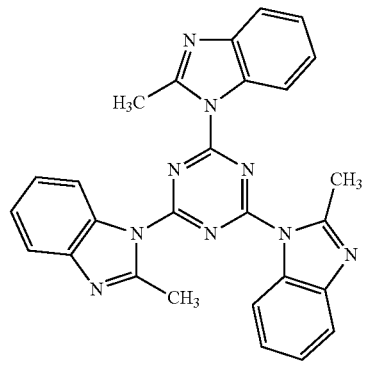
E-6
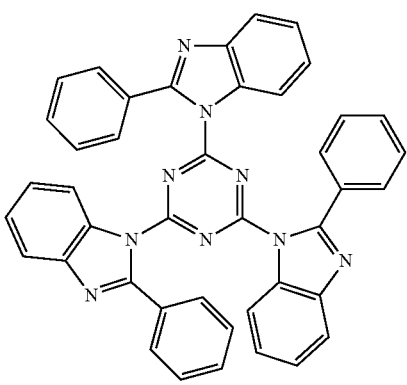
E-8
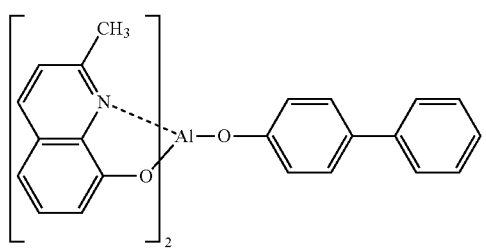
E-9
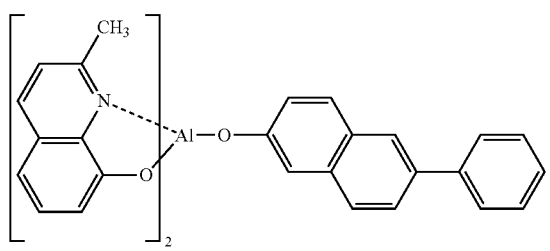
E-10
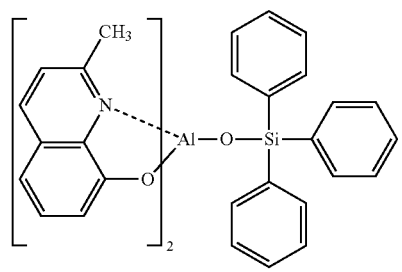

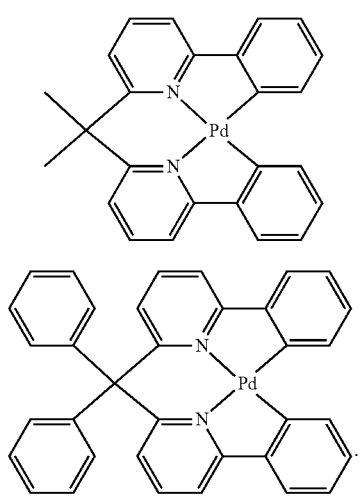
E-21
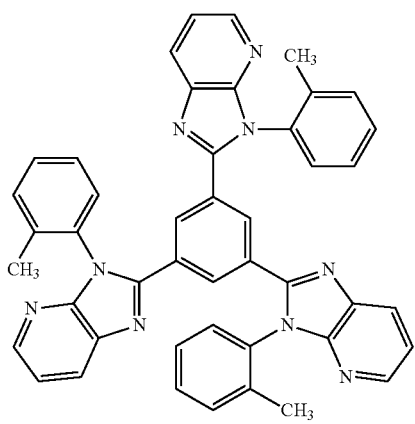
E-22
10. The organic electroluminescence element according to claim 1, wherein the electron transporting host material is at least one selected from the group consisting of the following compounds E-3, E-4, E-21 and E-22
E-3
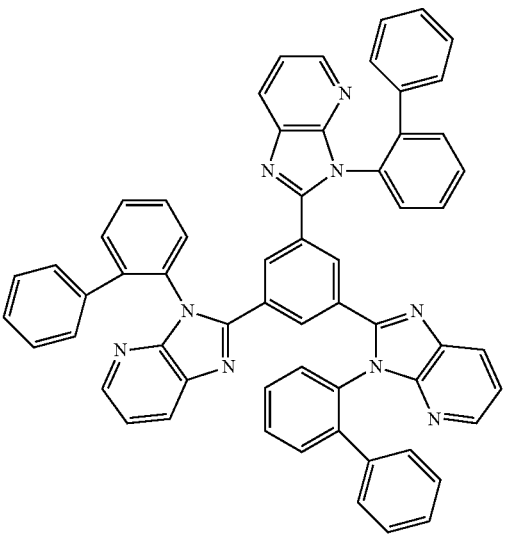
E-4
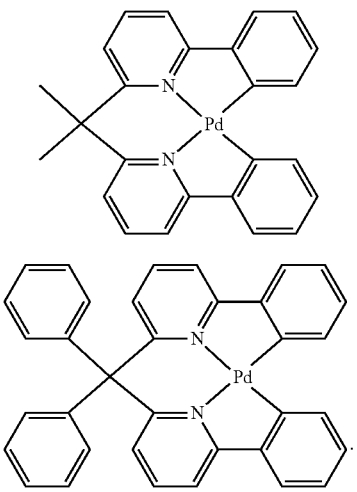
E-21
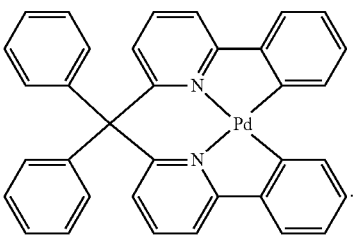
E-22
* * * * *